(12) United States Patent
Danesh et al.

(10) Patent No.: US 9,933,463 B2
(45) Date of Patent: Apr. 3, 2018

(54) CURRENT MEASUREMENT

(71) Applicant: Analog Devices Global, Hamilton (BM)

(72) Inventors: Seyed Amir Ali Danesh, Edinburgh (GB); Jonathan Ephraim David Hurwitz, Edinburgh (GB)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/229,815

(22) Filed: Aug. 5, 2016

(65) Prior Publication Data

US 2016/0341769 A1 Nov. 24, 2016

Related U.S. Application Data

(63) Continuation of application No. 13/684,213, filed on Nov. 22, 2012, now Pat. No. 9,411,003.
(Continued)

(30) Foreign Application Priority Data

Nov. 24, 2011 (GB) .................................. 1120295.9

(51) Int. Cl.
*H02H 3/00* (2006.01)
*G01R 19/00* (2006.01)
(Continued)

(52) U.S. Cl.
CPC ......... *G01R 19/00* (2013.01); *G01R 19/2506* (2013.01); *G01R 23/02* (2013.01);
(Continued)

(58) Field of Classification Search
USPC ...................................... 361/42, 48
See application file for complete search history.

(56) References Cited

U.S. PATENT DOCUMENTS 4,210,875 A   7/1980  Beasom
4,293,782 A  10/1981  Tanaka et al.
(Continued)

FOREIGN PATENT DOCUMENTS

DE        10310503 A1    9/2004
DE     102010052346 A1    5/2012
(Continued)

OTHER PUBLICATIONS

"U.S. Appl. No. 13/672,236, Non Final Office Action dated Dec. 4, 2014", 11 pgs.
(Continued)

*Primary Examiner* — Ronald W Leja
(74) *Attorney, Agent, or Firm* — Schwegman Lundberg & Woessner, P.A.

(57) ABSTRACT

The present invention relates to current measurement apparatus. The current measurement apparatus comprises first and second measurement devices with each of the first and second measurement devices being operative to measure current in a respective one of a live conductor and a neutral conductor substantially simultaneously. The current measurement apparatus is operative to make plural different determinations in dependence on the substantially simultaneous current measurements.

23 Claims, 23 Drawing Sheets

Related U.S. Application Data

(60) Provisional application No. 61/563,462, filed on Nov. 23, 2011.

(51) Int. Cl.

| | | |
|---|---|---|
| *G01R 23/02* | (2006.01) | |
| *G01R 31/02* | (2006.01) | |
| *H02H 3/32* | (2006.01) | |
| *G01R 19/25* | (2006.01) | |
| *H02H 1/00* | (2006.01) | |
| G01R 35/00 | (2006.01) | |
| G01R 21/06 | (2006.01) | |

(52) U.S. Cl.
CPC ......... *G01R 31/025* (2013.01); *H02H 1/0015* (2013.01); *H02H 3/006* (2013.01); *H02H 3/32* (2013.01); *G01R 21/06* (2013.01); *G01R 35/005* (2013.01)

(56) References Cited

U.S. PATENT DOCUMENTS

| | | | |
|---|---|---|---|
| 5,115,200 A | 5/1992 | Lahitte et al. | |
| 5,224,011 A | 6/1993 | Yalla | |
| 5,386,188 A | 1/1995 | Minneman et al. | |
| 5,485,394 A | 1/1996 | Murata et al. | |
| 5,512,837 A | 4/1996 | Ohnishi | |
| 5,539,602 A | 7/1996 | Schmitz et al. | |
| 5,804,979 A | 9/1998 | Lund et al. | |
| 5,998,979 A | 12/1999 | Nilsson | |
| 6,011,385 A | 1/2000 | Brandt et al. | |
| 6,175,479 B1 | 1/2001 | Boyd et al. | |
| 6,445,315 B1 | 9/2002 | Den Breejen | |
| 6,522,123 B2 | 2/2003 | Ribes | |
| 6,654,219 B1 | 11/2003 | Romano et al. | |
| 7,042,690 B2 | 5/2006 | Male | |
| 7,109,720 B2 | 9/2006 | Baurand et al. | |
| 7,265,607 B1 | 9/2007 | Rajapandian et al. | |
| 7,298,135 B2 | 11/2007 | Briese et al. | |
| 7,764,473 B2* | 7/2010 | Shaak ................... G01R 31/025 361/42 |
| 8,450,995 B2 | 5/2013 | Wagner | |
| 8,508,896 B2 | 8/2013 | Paoletti et al. | |
| 8,586,256 B2 | 11/2013 | Yanase et al. | |
| 9,151,818 B2 | 10/2015 | Danesh et al. | |
| 9,322,850 B2 | 4/2016 | Wood et al. | |
| 9,411,003 B2 | 8/2016 | Danesh et al. | |
| 2002/0153901 A1 | 10/2002 | Davis et al. | |
| 2003/0117754 A1 | 6/2003 | Zuercher et al. | |
| 2004/0061506 A1 | 4/2004 | Rupp | |
| 2005/0237047 A1 | 10/2005 | Voisine | |
| 2006/0167642 A1 | 7/2006 | Ferrer et al. | |
| 2006/0274460 A1* | 12/2006 | Zuercher ............... H02H 1/0015 361/42 |
| 2007/0058304 A1* | 3/2007 | Parker ................... H02H 1/0015 361/42 |
| 2008/0062591 A1 | 3/2008 | Wong et al. | |
| 2009/0121729 A1 | 5/2009 | Farkas | |
| 2009/0161270 A1 | 6/2009 | Beatty, Jr. et al. | |
| 2009/0267582 A1 | 10/2009 | Prodic et al. | |
| 2010/0225304 A1 | 9/2010 | Wynne | |
| 2011/0037429 A1* | 2/2011 | DeBoer ............... B60L 11/1816 320/109 |
| 2011/0273183 A1 | 11/2011 | Shea | |
| 2012/0229939 A1* | 9/2012 | Mikani ................ H02H 1/0015 361/55 |
| 2013/0113507 A1 | 5/2013 | Danesh et al. | |
| 2013/0128396 A1 | 5/2013 | Danesh et al. | |
| 2014/0176119 A1 | 6/2014 | Hull et al. | |
| 2014/0253102 A1 | 9/2014 | Wood et al. | |
| 2014/0354266 A1 | 12/2014 | Hurwitz et al. | |
| 2015/0362532 A1 | 12/2015 | Chartouni | |
| 2016/0291060 A1 | 10/2016 | Wood et al. | |

FOREIGN PATENT DOCUMENTS

| | | |
|---|---|---|
| EP | 1278073 A1 | 1/2003 |
| GB | 2006443 A | 5/1979 |
| GB | 2224853 A | 5/1990 |
| GB | 2424286 B | 7/2009 |
| WO | WO-9967653 A1 | 12/1999 |
| WO | WO-2006002446 A1 | 1/2006 |
| WO | WO-2014072733 A2 | 5/2014 |

OTHER PUBLICATIONS

"U.S. Appl. No. 13/672,236, Notice of Allowance dated May 13, 2015", 10 pgs.

"U.S. Appl. No. 13/672,236, Response filed Apr. 2, 2015 to Non Final Office Action dated Dec. 4, 2014", 21 pgs.

"U.S. Appl. No. 13/684,213, Corrected Notice of Allowance dated Jul. 8, 2016", 2 pgs.

"U.S. Appl. No. 13/684,213, Final Office Action dated Jan. 4, 2016", 9 pgs.

"U.S. Appl. No. 13/684,213, Non Final Office Action dated Jul. 30, 2015", 15 pgs.

"U.S. Appl. No. 13/684,213, Notice of Allowance dated Mar. 24, 2016", 10 pgs.

"U.S. Appl. No. 13/684,213, Response filed Mar. 4, 2016 to Final Office Action dated Jan. 4, 2016", 16 pgs.

"U.S. Appl. No. 13/684,213, Response filed Nov. 30, 2015 to Non Final Office Action dated Jul. 30, 2015," 18 pgs.

"U.S. Appl. No. 14/203,502, Notice of Allowance dated Oct. 5, 2015", 9 pgs.

"U.S. Appl. No. 14/203,502, Notice of Allowance dated Dec. 23, 2015", 8 pgs.

"U.S. Appl. No. 14/203,502, Preliminary Amendment filed Aug. 14, 2014", 9 pgs.

"International Application Serial No. PCT/GB2013/052947, International Search Report dated Mar. 13, 2014", 3 pgs.

Ziegler, Silvio, et al., "Current Sensing Techniques: A Review", IEEE Sensors Journal, vol. 9, No. 4, (Apr. 2009), 354-376.

* cited by examiner

CURRENT MEASUREMENT

CLAIM OF PRIORITY

This Application is a continuation of and claims priority to U.S. patent application Ser. No. 13/684,213, filed Nov. 22, 2012, which claims priority to GB Application Serial No. 1120295.9, filed Nov. 24, 2011, as well as U.S. Provisional Application Ser. No. 61/563,462, filed Nov. 23, 2011, which are hereby incorporated by reference herein in their entirety.

FIELD OF THE INVENTION

The present invention relates to current measurement apparatus configured in particular but not exclusively for measurement of current flowing in mains electrical circuits and a current measurement method using such current measurement apparatus.

BACKGROUND TO THE INVENTION

Accurate measurement of current is required for different applications in the electricity consumption and generation fields. For example accurate current measurement is required for metering of electricity usage or generation, for over current protection and for sub-metering, e.g. in a building in which there are distinct electricity consumers for whom metering is required on an individual basis.

A current shunt provides one approach to measuring the high values of current encountered in such applications. In use a shunt of known resistance is provided in series with a load and the voltage developed across the shunt by the load drawn current is measured. The current passing through the shunt is then determined on the basis of Ohm's Law in view of the measured voltage and the known resistance of the shunt. Another approach to measuring high values of current involves the use of a current transformer wound on a core which is disposed around a conductor carrying current to be measured. The Hall current probe and the Rogowski coil provide further approaches to the measurement of high current. Each of these known approaches offers its advantages and disadvantages with one approach to current measurement being chosen in preference to the other approaches in dependence on requirements, e.g. with regards to accuracy, operating environment, space constraints, cost and the like.

The current shunt is capable of measuring both AC and DC and provides for linearity of measurement. Furthermore the current shunt is capable of providing absolute accuracy of measurement and temperature stability when properly calibrated and fabricated from a material having a very low temperature coefficient of resistance, such as manganin alloy. Certain applications, such as metering of electricity consumption and generation, require measurement to high accuracy over extended periods of time. For example in North America the ANSI C12.20 standard specifies an accuracy of ±0.5% for Class 0.5 consumption meters and ±0.2% for Class 0.2 consumption meters. Standards applicable in Europe and elsewhere, such as IEC 62053, specify similar accuracy requirements. Initial calibration to high accuracy is therefore normally required. The current shunt is, however, invasive and provides no isolation. The current transformer on the other hand provides for isolation and is less invasive but is capable of measuring AC only. In addition the current transformer is liable to non-linearity and phase error problems.

In contrast with the current transformer the Hall current probe is capable of measuring both AC and DC. In an open loop configuration the Hall current probe is, however, liable to non-linearity and temperature drift. When in a closed loop configuration the Hall current probe provides an improvement with regards to non-linearity and temperature drift although the weight and size of the configuration increases significantly where higher currents are measured. Turning to the Rogowski coil, this approach is entirely non-invasive because the coil is wound around a conductor which is to be the subject of measurement. The Rogowski coil offers the further advantage over the current transformer of being less liable to saturation because it lacks the iron core of the current transformer. However and as with the current transformer the Rogowski coil is capable of measuring alternating current only.

Ground fault conditions can present a risk of electric shock in electrical systems. Ground fault electric shock conditions can arise where there is insufficient grounding within an electrical system. For example the casing of electrical equipment may be improperly grounded such that when a person touches the casing he presents a lower impedance path to ground should the casing become live.

Ground fault electric shock conditions can also arise in electrical systems which meet accepted grounding practice. For example the TT grounding approach involves providing a ground at the utility pole and a ground directly to earth at each item of electrical apparatus. The TT grounding approach has been widely used in Europe mainly on account of the saving in wiring that the approach affords. Under certain circumstances the TT approach can, however, present problems. For example if a lightning surge on the power distribution lines produces a surge current of 1000 Amps which runs to earth at the utility pole, a voltage rise of 25,000 Volts is seen at the grounding electrode at the utility pole assuming the resistance between the grounding electrode and ground to be 25 Ohms. A resistance of 25 Ohms from the grounding electrode to earth meets NEC requirements. Where a first surface on electrical apparatus is connected to the utility pole ground and a second surface on the electrical apparatus is connected to a separate local ground direct to earth the 25,000 Volt signal appears across the first and second surfaces.

Ground fault electric shock conditions can arise even in an electrical system that is grounded according an approach, such as TN-C, which in contrast to the TT approach affords risk reduction in the face of lightning strikes and like fault conditions. More specifically and is almost universally appreciated a ground fault electric shock condition will arise when a person becomes the only path to ground for current flow by, for example, inserting a metal object into an electrical socket. No amount of grounding precautions will prevent electric shock in such circumstances.

Ground fault detectors are operative to determine if there is leakage of electrical current from an electrical circuit. Such leakage arises when there is a ground fault condition such as according to one of the examples given above. A ground fault detector may therefore provide a means to reduce the risk of electric shock. The ground fault detector operates on the basis that outwardly flowing current, e.g. in one or more live wires, must return, e.g. through a neutral wire, unless there is a current leakage path. It therefore follows that the sum of the currents flowing in conductors to and from an electrical load should be zero unless there is a leak. The differential current transformer is a known form of sensor which is operative to determine the sum of currents flowing in conductors to and from an electrical load. The differential current transformer comprises a core, which extends around the multiple conductors to be measured that form the primary and a multi-turn secondary winding, which is wound radially around the core. When the sum of the currents in the conductors passing through the core is zero no current signal is induced in the secondary winding. When the sum of the currents in the conductors passing through the core is more or less than zero a proportional current signal is induced in the secondary winding. The differential current transformer therefore provides a measure of the leakage current. A circuit breaker may then be operated in dependence on the secondary winding current exceeding a threshold value for a period of time, which corresponds to a maximum level of safe fault current. The response time of a leakage current detector can be in the range of 5 mS, 50 mS or 500 mS depending on the level of fault current. A circuit comprising a current sum sensor and a circuit breaker is termed a Ground Fault Circuit Interrupter (GFCI) in the US and a Residual Current Circuit Breaker (RCCB) or a Residual Current Device (RCD) amongst other terms in Europe. Sometimes the RCD term is used with respect to a device which is operative to detect leakage current but which lacks a circuit breaker.

An arc fault is another form of circuit condition that is liable to cause damage and be prejudicial to safety. An arc fault can generate high temperatures and thereby ignite combustible material. There are two forms of arc fault: the series arc fault; and the parallel arc fault. The series arc fault occurs across a discontinuity in a live or neutral conductor. Such a discontinuity is caused by, for example, a broken conductor, a loose terminal or a poor electrical connection at a wire nut. The current level in a series arc fault is limited by the impedance of the load. The parallel arc fault involves arcing between two conductors, such as between a live conductor and a neutral or grounded conductor, and typically arises when conductor insulation is damaged or deteriorates over time or through usage. The current level in a parallel arc fault is limited by the current available from the supply as limited by the impedance of the conductors carrying the fault current. Parallel arc faults therefore often involve higher levels of peak current than series arc faults. Furthermore the time constant that determines the length of time that an arc event is present is relatively short compared with other fault events. Typically the time constant is of the order of 10 nS, 100 nS, 1 uS or 10 uS depending on the line and load conditions. Therefore the peak current of the arc event may be present for insufficient time to trigger other fault detectors, such as over current or ground fault detectors. In addition arc fault determination often involves the analysis of multiple arc events for their periodicity and frequency.

The Arc Fault Circuit Interrupter (AFCI) is operative in the same fashion as the GFCI to open one or more ungrounded conductors when an unsafe circuit condition is detected. An arc fault is an intermittent condition which is characterised by a high peak current value but a low Root Mean Square (RMS) current value, which is generally below the normal operating threshold of a GFCI. In a first form an AFCI consequently comprises a current sensor, which is operative to measure the load current in one of the conductors, a waveform analysis circuit, which is operative on the output from the current sensor to discriminate between waveforms that are characteristic of normal circuit transients, such as transients caused by operation of wall switches, and waveforms that are characteristic of risk presenting arcs, and a circuit breaker that is operative in dependence on detection of an arc. This form of AFCI is capable of detecting and acting upon series and parallel arc faults. In a second form the AFCI comprises a differential current transformer disposed around the conductors to be monitored instead of the current sensor of the first form. A parallel arc fault from a conductor to ground produces a current on one of the conductors only, which is readily detected by the waveform analysis circuit. On the other hand a parallel arcing condition between the conductors produces equal and opposite currents in the conductors as in the GFCI as described above. However there is a phase difference between the current waveforms present in the two conductors. The differential transformer combined with a high pass filter allows the monitoring of any high frequency transient without need to handle the dynamic range on the lower frequency normal waveform. The differential transformer rejects any common signal such as the mains load current while passing any difference as may be caused by the time delay difference between live and neutral that will typically occur in a series arc fault, to thereby effectively act as a high pass filter and improve the dynamic range requirement to extract an arc event. The current transformer is sometimes combined with an extra high pass or band pass filter to further select the characteristics of interest for only arc fault detection. The waveform analysis circuit of the AFCI is therefore operative at a sufficiently high frequency to identify and act upon the current waveform present in at least one of the conductors to thereby detect the arc fault.

The most familiar application of electricity measurement is in electricity consumption metering for invoicing purposes. With the development of local electricity generation capabilities metering of generated electricity for invoicing purposes is becoming more widely used. Beyond invoicing, electricity metering sees application in demand monitoring which is of importance to the electricity generator and distributor for determining usage patterns and trends. Electricity metering is also seeing increased use in the smart grid as a means to determine the behaviour and actions of suppliers and consumers connected to the grid. As mentioned above certain applications of electricity metering require measurement to high accuracy over extended periods of time with the ANSI C12.20 standard in North America specifying an accuracy of ±0.5% for Class 0.5 consumption meters and ±0.2% for Class 0.2 consumption meters. Standards applicable in Europe and elsewhere specify similar accuracy requirements.

Digital electricity meters have been used for some years. Such digital electricity meters typically comprise a potential divider for measurement of voltage. There are different approaches to current measurement depending on circumstances and requirements. Normally a current sensor is provided on the live conductor only. In some cases, however, there is a current sensor on each of live and neutral for the purpose of crude tamper detection. Although such tamper detect arrangements sometimes take account of the measurements on live and neutral they do not do so to any degree of accuracy or provide for fault detection. One approach involves the use of a shunt resistor in the live conductor and a current transformer on the neutral conductor. Another approach involves the use of a current transformer on each of the live and neutral conductors. A further approach involves the use of a shunt resistor on each of the live and neutral conductors with the electricity meter being configured to maintain isolation between the live and neutral conductors despite the galvanic connection to both live and neutral conductors.

Sub-metering provides for billing of individual consumers where the electricity utility is unable or unwilling to measure the consumption of such individual consumers. Typical users of sub-metering include apartment complexes, commercial buildings and mobile home parks. Individual metering of electricity consumption has the advantage of creating awareness of energy conservation on the part of the consumer. Alternatively sub-metering can take place at the point of load, i.e. at the electrical apparatus. Sub-metering at the point of load can provide an indication of improper operation of the electrical apparatus, e.g. as reflected by an unusual increase in consumption. Furthermore sub-metering at the point of load provides the consumer with insight as to the extent of consumption of the electrical apparatus in absolute and comparative terms.

Fault detection, such as by the GFCI and the AFCI, has seen increased use over the years as a means to improve upon personal safety and to reduce the incidence of damage to property through fires. The design and operation of fault detectors is subject to standards created by various bodies. For example the National Electrical Manufacturers Association (NEMA), which represents the interests of electro-industry product manufacturers in the US, publishes standards relating to fault detectors primarily for the US market. The Underwriters Laboratories (UL) also publishes standards for electrical safety equipment. A further example is the International Electrotechnical Commission (IEC) which has been the primary organisation for creating standards, which although international in scope are biased towards European practices. Legislation and regulations in certain jurisdictions has been a primary motivator for increased use of fault detectors. For example Germany has required the use of Residual Current Devices (RCDs) on sockets up to 20 Amps from June 2007, Norway has required the use of RCDs in all new homes since 2002 and all new sockets since 2006 and the UK has required RCDs in all new installations since 2008. For ground fault devices there is an IEC specification, namely IEC 61008 and a UL specification, namely UL 943. AFCIs have been of greater interest in the US and Canada in part on account of the prevalence of wooden and hence fire damage prone buildings. In a pan European context, the MID (Measuring Instruments Directive) took effect on 30 Oct. 2006 with the aim of creating a single market for measuring instruments across the European Union. The objects of the MID are to guarantee a high level of safety and reliability for certified measuring instruments and provide for protection against data corruption in such measuring instruments whilst providing for free circulation of measuring instruments within the European Union. Annexes to the MID define how measuring instruments can be certified as compliant. Notified bodies are authorised to carry out testing of measuring instruments, with certificates issued by a notified body being accepted throughout the European Union. The MID supersedes national measures such as the OFGEM approval process in the UK. As further examples of national measures, the 1999 version of the National Electrical Code (NFPA 70) in the United States (US) and the 2002 version of the Canadian Electrical Code (CSA Standard C22.1) each require AFCIs in all circuits feeding outlets in bedrooms of dwellings. AFCIs are subject to a UL specification, namely UL1699. A more recent example is the 2008 National Electrical Code requirement for installation of combination-type AFCIs in all 15 and 20 Ampere residential circuits with the exception of laundries, kitchens, bathrooms, garages and unfurnished basements.

The design and operation of fault detectors is less than straightforward compared, for example, to the design and operation of over-current detectors. More specifically different forms of fault detector, such as the GFCI and the AFCI, involve different electrical designs. Indeed requirements may differ within a particular class of fault detector. More specifically a parallel arc fault typically manifests as an intermittent current in excess of 75 Amps whereas a series arc fault manifests as an intermittent current in excess of 5 Amps. Furthermore the maximum level of peak current depends on the time constant and the form of electrical circuit in which the device is used. Fault characteristics may be difficult to distinguish from the current consumption characteristics of equipment normally attached to the same electrical network. For example the initial current drawn by a motor may appear like an arc fault and this may lead to false tripping. Another consideration is the differing requirements from jurisdiction to jurisdiction. For example Class A GFCIs have a minimum must trip value of between 4 mA and 6 mA in the US whereas the RCD, which is the equivalent device in Europe, has a trip value of 30 mA. Furthermore the required time to trip often depends on the level of fault current with a higher level of fault current requiring a shorter time to trip. Improper operation, such as on account of false triggering, over sensitivity or under sensitivity, provides for further complication.

In addition requirements differ from electrical installation to electrical installation. For example one installation may require GFCI and over-current protection whereas another installation may require GFCI, AFCI and over-current protection along with a current measuring capability. Such differing requirements are met by installing plural devices. Where multiple functionality is required in the deployment of switchgear in a building multiple different devices are connected in series. This is likely to present an issue of cost and size or involve limiting capabilities by sharing components between or amongst plural systems. For example an RCD or sub-meter may be shared amongst several circuit breakers.

The present invention has been devised in the light of the inventors' appreciation of the above mentioned problems. It is therefore an object for the present invention to provide improved current measurement apparatus configured to measure current in a live conductor and a neutral conductor. It is a further object for the present invention to provide an improved method of measuring current comprising measuring current in a live conductor and a neutral conductor.

STATEMENT OF INVENTION

In the light of the inventors' above mentioned appreciation and according to a first aspect of the present invention there is provided current measurement apparatus comprising first and second measurement devices, each of the first and second measurement devices being operative to measure current in a respective one of a live conductor and a neutral conductor substantially simultaneously, the current measurement apparatus being operative to make plural different determinations in dependence on the substantially simultaneous current measurements.

In use the first and second measurement devices measure the absolute current in the live and neutral conductors substantially simultaneously and the current measurement apparatus makes plural different determinations on the basis of the simultaneous current measurements. This approach provides a basis for deriving further measurements, such as a difference between the currents in the live and neutral conductors, performing computations in dependence on the current measurements and effecting control of the current measurement apparatus in a substantially instantaneous or at least a near real time fashion.

A prior art approach is to make use of plural apparatus dedicated to its respective function, e.g. first apparatus dedicated to current measurement for power determination purposes, second apparatus dedicated to ground fault detection and third apparatus dedicated to series and/or parallel arc fault detection. The prior art approach may further involve making use of a control unit which is operative to perform computations and effect control operations on the basis of signals generated by the dedicated apparatus. Such a prior art approach normally does not lend itself to substantially instantaneous or near real time operation, which may be advantageous, for example, in providing for accurate measurement on a continuous basis, such as for demand monitoring or billing purposes, or for providing for rapid response to a fault condition, such as by operating a circuit breaker to prevent damage to property or injury to personnel. The present invention may also provide a basis for implementing apparatus of smaller footprint than apparatus according to the prior art approach. For example the present invention may lend itself to implementation in a form that may be more readily accommodated in distribution boxes and consumer units where space is limited. Furthermore the present invention may be more cost effective than the plural apparatus approach of the prior art. Furthermore the present invention may provide for development of new and more intelligent fault detection capabilities because deriving measurements allows for more precise correlation between and amongst absolute and differences measures that reflect characteristics of different fault events.

At least one of the plural different determinations may comprise a measurement relating to operation of an electrical circuit comprising the live and neutral conductors. For example the electrical circuit may be a load to which electrical power is conveyed by the live and neutral conductors or a generator from which electrical power is conveyed by the live and neutral conductors. The determination may comprise measurement of current flowing in one of the live and neutral conductors, e.g. for the purpose of determining power consumption.

At least one of the plural different determinations may comprise a decision relating to operation of an electrical circuit comprising the live and neutral conductors, such as load or generator to or from which electrical power is conveyed by the live and neutral conductors. The decision may comprise determining a fault condition. Normal operation of the electrical circuit may be interrupted in dependence on the decision. The current measurement apparatus may therefore comprise a circuit breaker which is operative to break at least one of the live and neutral conductors in dependence on the decision. The decision may be one of an over-current decision and an arc fault decision based on at least one of the current measurements. For example the over-current decision may comprise determining whether or not the current measurement for the live conductor exceeds a threshold over-current value on average over a predetermined period of time. Alternatively or in addition and by way of a further example the arc fault decision may comprise analysis of at least one of the current measurements such as in respect of current waveform profile and comparison of the analysis with stored arc fault data. Analysis of one of the two current measurements may provide for detection of a series arc fault condition. Analysis of at least one of the current measurements may provide for detection of a parallel arc fault condition. An arc fault decision may further comprise analysing the periodicity of arc fault events. More specifically and where the current measurement apparatus comprises voltage measurement apparatus as defined below, the arc fault decision may comprise analysing the phase of the arc fault events relative to a phase of a voltage measurement between the live and neutral conductors.

The current measurement apparatus may be operative to determine a difference between the currents and one of the plural different determinations may be made in dependence on the difference between the currents. The current difference may be determined on the basis of the difference between digital representations of the measured currents. The current difference may be determined substantially simultaneously with the current measurements, e.g. within comparatively few clock cycles following acquisition of the current measurements. A difference between the currents in the live and neutral conductors may be indicative of an electrical fault involving, for example, leakage of current to ground. Hence the current measurement apparatus may be operative to detect a ground fault. The current measurement apparatus may further comprise a circuit breaker, which is operative to break at least one of the live and neutral conductors in dependence on the current difference. The current measurement apparatus may therefore be operative as a Ground Fault Circuit Interrupter (GFCI) or Residual Current Device (RCD). The level and duration of the current difference may have a bearing on the risk presented by leaking current, e.g. to a person providing a path for the leaking current. The current measurement apparatus may be configured to operate the circuit breaker if the current difference exceeds a threshold value. More specifically the current measurement apparatus may comprise a comparator, which may be implemented in digital form and which is operative to compare the current difference with the threshold current value. Alternatively or in addition the current measurement apparatus may operate the circuit breaker if the current difference is present for more than a threshold time. More specifically the current measurement apparatus may comprise a time determining arrangement, such as a timer, a counter or a filter, which is operative to determine a duration of a current difference. Alternatively or in addition the current measurement apparatus may be operative to at least one of filter and non-linear process the measurements to determine a real event, such as a person being electrocuted, from a non-event, such as a surge caused when a device is powered on. Alternatively or in addition, the current measurement apparatus may use the absolute value of either of the measurements to determine response of the detector to differences. Additionally if a voltage measurement is present, the nature of the difference in current versus the voltage characteristics may be used to determine the type of fault and whether or not to alter the thresholds or delays, to either protect sooner or to prevent false tripping.

Alternatively or in addition the current measurement apparatus may be operative to make at least one determination based on a difference between the current measurements and at least one of the current measurements. The present invention may therefore be capable of determining plural fault conditions, such as ground and arc faults, on the basis of the current measurements. A prior art approach involves relying on a differential current transformer to provide for detection of plural faults. More specifically a low pass filter is operative to provide a signal which provides for ground fault detection and a high pass filter is operative to provide a signal which provides for arc fault detection. The present invention in contrast may perform such fault detection, amongst other things, in dependence on measurement of the absolute currents flowing in the live and neutral conductors.

More specifically the current measurement apparatus may be configured to process the current difference by making a decision based on comparison with a changeable threshold value, the threshold value being changed in dependence on a level of a current measurement. For example and where the current measurement apparatus constitutes a GFCI, if the measured current is in the range of 10 Amps RMS to 20 Amps RMS the threshold value may be set low whereas if the measured current is in the range of 0 Amps RMS to 5 Amps RMS the threshold value may be set high. Where the absolute level of current flowing in the conductors is higher a lower level of leakage current may be deemed less susceptible to false triggering when a load is attached. In contrast another approach may involve altering the threshold to provide a higher level of safety when no load is attached. Therefore the current measurement apparatus may be operative to change a threshold value in dependence on whether or not a load is present with presence of a load being, for example, determined by way of at least one measurement by the current measurement apparatus. Another approach may involve at least one of: learning what threshold value may be applied when a change in load occurs: and adapting the threshold value in dependence on a change in measured value. Changeability of the threshold value may therefore provide for flexibility of operation of the current measurement apparatus. A determination process may be changed in dependence on at least one of: a frequency response of electronics forming at least part of the current measurement apparatus; a period of analysis; a time constant of adaptation or filtering; an absolute current measurement; and a current difference. Thus operation of the current measurement apparatus may be changed so as to determine the presence or lack of a fault under different conditions.

Where the current measurement apparatus is configured to compare a measurement or a characteristic of a measurement, e.g. an absolute current measurement, a current difference, a duration of a current or a frequency characteristic, with a comparative value, the current measurement apparatus may be operative to change the comparative value. The comparative value may be stored in memory, such as non volatile memory, comprised in the current measurement apparatus. Storage of the comparative value in memory means that the comparative value may be set or changed comparatively readily compared, for example, with a comparative value that is determined by hardware. Thus and in a current measurement apparatus on a given hardware platform a particular comparative value may be stored upon manufacture or indeed subsequently upon or after deployment. For example current measurement apparatus which is operable to perform a RCCB function with a comparative value of 30 mA RMS may be reconfigured to perform a Class A GFCI function with a comparative value of mA RMS. The current measurement apparatus may therefore further comprise a configuration interface which is operable to set or change the comparative value. The configuration interface may be at least one of manually operable and electronically operable. The configuration interface may comprise one or more features of the configuration interface as described elsewhere herein.

The current measurement apparatus may be operative to change its configuration in dependence on a self-learning process. Therefore a comparative value and a method of making a determination may be changed in dependence on at least one factor comprising: another measurement; an analysis of at least one measurement, e.g. a frequency profile or phase difference; a change in load conditions; a determination, e.g. detection of a fault condition; at least one past measurement, e.g. average past values for the same measurement. For example a particular arc event may occur only when a new appliance is connected. The current measurement apparatus may therefore be operative to recognise when a new appliance is connected, e.g. by way of a change in load current and the presence of a characteristic waveform, and to categorise that particular arc as being of a non-dangerous form. The change in configuration may be in dependence solely upon operation of the current measurement apparatus, e.g. during the course of normal operation of the current measurement apparatus and without dependence on an outside agency, such as other apparatus or manual reconfiguration. Alternatively or in addition change in configuration may be in dependence on operation of apparatus other than current measurement apparatus. Accordingly the current measurement apparatus may comprise a configuration interface which is operable to change the configuration. The configuration interface may be electronically operable. The configuration interface may comprise one or more features of the configuration interface as described elsewhere herein. The configuration may therefore be changed in dependence on operations at other apparatus, such as at a remote location, with the configuration interface providing for communication between the current measurement apparatus and the other apparatus. For example a waveform acquired by the current measurement apparatus may be conveyed to the other apparatus for analysis and the other apparatus may convey control signals to the current measurement apparatus to change the configuration of the current measurement apparatus to perform a new determination or to change how a determination is made. Alternatively or in addition plural current measurement apparatus each comprising a configuration interface may be operative to communicate between or amongst each other and to make a determination based on their collective operation. For example if all current measurement apparatus are all operative to detect a same form of ground fault, the current measurement apparatus may be collectively operative to determine that a lightning strike has occurred. Each current measurement apparatus may then be operative in a different fashion in dependence on this determination.

Where the current measurement apparatus is configured to make plural different fault decisions, the current measurement apparatus may be configured to respond conditionally in dependence on detection of plural different faults at the same time. More specifically the current measurement apparatus may be operative to respond to one of two detected faults. For example where ground and arc faults are detected the current measurement apparatus may be operative to respond only to the ground fault, e.g. by operating a circuit breaker or by reporting the ground fault to a remote location. Thus priority may be given to a certain type of fault, such as a fault liable to cause an electric shock, in preference to other types of fault.

Where at least one of the plural different determinations comprises a measurement relating to operation of an electrical circuit comprising the live and neutral conductors, such as a power consumption measurement, and at least one of the plural different determinations comprises a decision relating to operation of the electrical circuit, such as a fault condition, the current measurement apparatus may be configured to respond conditionally in dependence on the measurement and the decision. For example if the measurement relates to a high level of power consumption no action may be taken, e.g. by way of operation of a circuit breaker, until a period of time has elapsed. Thus the likelihood of false circuit breaker operation may be reduced.

The current measurement apparatus may be configured to determine a frequency characteristic of at least one measurement. More specifically the current measurement apparatus may be operative to respond in dependence on a determined frequency characteristic. A measurement, such as of an absolute current in the live conductor, may comprise at least one frequency component, which is indicative of an operative condition of an electrical circuit electrically connected to the live and neutral conductors. More specifically the operative condition may be indicative of one of normal operation or faulty operation. A normal operative condition may be the switching on or off of the electrical circuit, the operation of a motor comprised in the electrical circuit or the like. Having an indication of such normal operative conditions may allow for a decision to be taken not to take certain action, e.g. involving operation of a circuit breaker, when a fault detection operation as described elsewhere may be liable to detect a fault condition incorrectly. A faulty operative condition, e.g. as reflected by a certain frequency profile, may be indicative of an arc or ground fault. Having an indication of a faulty operative condition may allow for a decision to be taken on the basis of such an indication as well as in dependence on operation of a fault detection operation as described elsewhere.

Alternatively or in addition the plural different determinations may comprise at least two of: series arc fault detection; parallel arc fault detection; ground fault detection; current measurement, e.g. for metering purposes; and overcurrent detection. The current measurement apparatus may therefore be configured to make a subset of such determinations. Accordingly the current measurement apparatus may further comprise a configuration interface which is operable to configure the current measurement apparatus to make selected determinations. The configuration interface may be at least one of firmware configurable, hardware configurable manually operable and electronically operable. Where the configuration interface is firmware configurable reconfiguration may be achieved by changing the code used by the apparatus, for example by changing the settings in non volatile memory on the PCB of the current measurement apparatus. Where the configuration interface is hardware configurable reconfiguration may be achieved by a link or component present on a PCB of the current measurement apparatus. Where the configuration interface is manually operable the configuration interface may comprise a manually operable control, such as DIP switches. Where the configuration interface is electronically operable the configuration interface may comprise an electronic interface which is configured to receive electronic configuration signals, e.g. locally from a Personal Computer by way of a wired or wireless communications link or remotely from a location forming part of a distribution network by way of a wired or wireless communications channel. Configuration may, for example, be at deployment of the current measurement apparatus and depend on the circumstances of use. Alternatively a configuration may be changed after deployment, e.g. locally or from a remote location, to take account of changing usage requirements or a change in regulatory requirements, such as a stipulation that series and parallel arc faults must be detected in all residential rooms. More specifically a first current measurement apparatus may be configured to make arc fault and ground fault determinations where the load is in a bedroom, a second current measurement apparatus may be configured to make a ground fault determination where the load is in a bathroom and a third current measurement apparatus may be configured to make an arc fault determination where the load is in a living room, with each of the first to third current measurement apparatus being configured in addition to measure current for metering requirements and to provide over current protection. In addition each of the first to third current measurement apparatus may be configured to provide for a different level of over current protection, e.g. by way of different threshold values, with each threshold value stored in memory, such as in non volatile memory. Plural current measurement apparatus may, for example, be installed in a distribution box or the like with each current measurement apparatus being configured to carry out different determinations despite all the current measurement apparatus being based on the same hardware platform and substantially the same firmware platform. Furthermore each current measurement apparatus may be reconfigurable to take account of changing requirements, as described above.

The current measurement apparatus may comprise a configuration interface which is operable to change a configuration of the current measurement apparatus. The configuration interface may comprise one or more of the features described above. The configuration interface may be operable to change the configuration so as to provide a hitherto un-provided means of providing a determination. For example the configuration interface may be used to change the configuration of the current measurement apparatus so that a fault, such as an arc fault, is detected on the basis of different measured signals or by analysing the measured signals in a different fashion.

At least one of the first and second measurement devices may comprise an electrical component in series with a load which is electrically connected to the conductor. The electrical component may comprise a shunt resistor. At least one of the first and second measurement devices may comprise an electrical circuit disposed in relation to the conductor, the electrical circuit being configured such that a current signal in the conductor induces an electrical signal, such as a current signal, in the electrical circuit. More specifically the electrical circuit may be one of a current transformer, a Rogowski coil and a Hall effect sensor.

The current measurement apparatus may further comprise voltage measurement apparatus, which is configured to measure a voltage between the live and neutral conductors. The voltage measurement apparatus may comprise a potential divider electrically connected between the live and neutral conductors. The current measurement apparatus may be configured to respond in dependence on a voltage measurement by the voltage measurement apparatus. More specifically the current measurement apparatus may be operative to determine power consumption in dependence on current measurement and voltage measurement. Alternatively or in addition the current measurement apparatus may be operative to respond conditionally in dependence in part on a voltage measurement. For example and where the current measurement apparatus is operative to detect an arc fault the current measurement apparatus may not be operative to respond to the detected arc fault, e.g. by way of operation of a circuit breaker, in dependence on a characteristic of the voltage signal, such as a peak in voltage signal indicative of normal circuit operation rather than an arc fault condition. The voltage measurement apparatus may be operative to determine simultaneously more than one determination, for example determinations used for both power measurement and arc fault detection. Alternatively or in additional the apparatus may be operative to determine a fault without being operative to interrupt supply. The apparatus may be further be operative to provide an indication of the fault, e.g. by way of a display or remote communications apparatus comprises in the apparatus. For example the apparatus may be comprised in a smart meter which is operable to simultaneously measure power using the absolute current and voltage measurements and detect faults using derived difference measurements. Such a smart meter may, for example, be further operative to inform the utility if the smart meter has detected a ground fault in a property in which the smart meter is installed.

Responding to different circuit conditions may comprise measuring signals within different dynamic ranges. Furthermore such signals may need to be measured to high accuracy. For example a first circuit condition may involve leakage of ground current when the absolute currents are within a range of 0 to 20 Amps RMS and require that the resolution and gain matching is better than 1 mA and a second circuit condition may involve arcing within a range of 50 to 200 Amps RMS. Measurement of signals within disparate dynamic ranges with signal acquisition circuitry of fixed dynamic range may result in one of the signals being measured to insufficient accuracy. For example an arcing signal in the 50 to 200 Amps RMS range may be measured to sufficient accuracy whereas a leakage signal in the 0 to 20 Amps RMS range may be measured to insufficient accuracy. An approach may involve providing a measurement device for each of the different measurement requirements and signal conditioning and acquisition circuitry for each measurement device. For example a current transformer may be disposed around the live conductor and a shunt resistor may be connected in series with the live conductor, with the current transformer and its associated circuitry being configured to measure large amplitude signals, e.g. for arc fault detection, and the shunt resistor and its associated circuitry being configured to measure low amplitude signals, e.g. for power consumption measurement. The present inventors have appreciated this approach to involve circuit complexity. Also this approach may present difficulties in making full use of measured signals, e.g. with regards to more sophisticated determinations such as those described above, in particular where absolute current measurements are made on both live and neutral conductors. The inventors have therefore devised an improvement.

In accordance with the improvement the current measurement apparatus may further comprise at least one acquisition circuit, the at least one acquisition circuit being configured to have at least two different dynamic ranges and to be operative to acquire signals from a measurement device within a respective one of the different dynamic ranges. For example a first signal may be acquired when the at least one acquisition circuit is operative within a first dynamic range and a second signal may be acquired when the at least one acquisition circuit is operative within a second dynamic range with both the first and second signals being acquired from the same measurement device. The at least one acquisition circuit may be configured for progressive change of dynamic range. The current measurement apparatus may comprise at least one acquisition circuit, which is operative to acquire signals from the first measurement device and at least one acquisition circuit, which is operative to acquire signals from the second measurement device, each of the at least one acquisition circuit being configured as described above.

The at least one acquisition circuit may comprise at least a first and a second analogue to digital converter, the first analogue to digital converter being configured to acquire a signal within a first dynamic range and the second analogue to digital converter being configured to acquire a signal within a second, different dynamic range. At least one of the first and second first analogue to digital converters may comprise a gain circuit which is operative to amplify or attenuate an analogue signal from the measurement device before conversion of the analogue signal to a digital signal. Thus for example a first gain stage may amplify an analogue signal by a first predetermined amount before conversion to a digital form by the first analogue to digital converter and a second gain stage may amplify an analogue signal by a second predetermined amount before conversion to a digital form by the second analogue to digital converter. Additionally the current measurement apparatus may be operative determine the dynamic ranges of each acquisition circuit by comparing the histograms of each path when the signal is within both dynamic ranges and using the comparison information to normalise the gain of each channel to provide for consistency.

Alternatively or in addition the at least one acquisition circuit may comprise an analogue to digital converter comprising an adjustable gain circuit, the adjustable gain circuit being configured to amplify or attenuate an analogue signal from the measurement device by one of plural different amounts before conversion of the analogue signal to a digital signal. The at least one acquisition circuit may further comprise a dynamic range detector circuit, which receives an output from the analogue to digital converter and is operative in dependence thereon to select one of a plurality of dynamic ranges in dependence on an amplitude of the output from the analogue to digital converter. The at least one acquisition circuit may further comprise a gain controller which is operative in dependence on an output from the dynamic range detector circuit to change a gain of the adjustable gain circuit.

Measurement of signals having different frequency profiles may present problems with regards to accuracy. For example a leakage current may comprise frequency components of up to 1 kHz whereas arcing signals may comprise frequency components in the 100 kHz range. Accurate measurement in different frequency bands may result in either inaccuracy where the signal acquisition circuitry is unable to respond to high frequency signals or over sampling of low frequency signals where the signal acquisition circuitry is capable of responding to high frequency signals, e.g. by being clocked at a rate commensurate with the high frequency signals. For example a current transformer may be disposed around the live conductor and a shunt resistor may be connected in series with the live conductor, with the current transformer and its associated circuitry being configured to measure high frequency signals, e.g. for arc fault detection, and the shunt resistor and its associated circuitry being configured to measure low frequency signals, e.g. for power consumption measurement. The current measurement apparatus may therefore comprise plural acquisition circuits, the plural acquisition circuits being configured to acquire signals from a measurement device at different sampling rates. For example a first acquisition circuit may be operative to sample a signal at 10 kHz and a second acquisition circuit may be operative to sample a signal at 1 MHz. More specifically the plural acquisition circuits may be configured to be clocked at different frequencies.

According to a second aspect of the present invention there may be provided a current measurement arrangement comprising plural current measurement apparatus according to the first aspect of the present invention, each of the plural current measurement apparatus being configured to measure current in a different one of plural live conductors and a neutral conductor. Thus the current measurement arrangement may be operative to measure current in different phases of a three phase electrical supply. Embodiments of the second aspect of the invention may comprise one or more features of the first aspect of the invention.

According to a third aspect of the present invention there is provided a current measurement method comprising: operating first and second measurement devices to measure current in a respective one of a live conductor and a neutral conductor substantially simultaneously; and operating current measurement apparatus to make plural different determinations in dependence on the substantially simultaneous current measurements.

Embodiments of the third aspect of the present invention may comprise one or more features of the first or second aspect of the present invention.

According to a fourth aspect of the present invention there is provided electrical apparatus comprising current measurement apparatus according to the first aspect of the present invention or a current measurement arrangement according to the second aspect, the electrical apparatus being configured such that the current measurement apparatus or current measurement arrangement measures current passing through a part of the electrical apparatus.

The electrical apparatus may be a socket, a plug or electrical adapter. Alternatively or in addition the electrical apparatus may comprise electricity generation, transmission or distribution apparatus. The electrical apparatus may, for example, be constituted by an electricity meter or a distribution box with the current measurement apparatus being operative to measure current passing through the electricity meter or distribution box. The current measurement apparatus may thereby provide a means to measure the electricity consumption and to detect fault conditions and respond accordingly.

Alternatively or in addition the electrical apparatus may comprise electrical propulsion apparatus comprising an electrical energy storage or generation device, such as a battery or fuel cell. The electrical propulsion apparatus may be configured such that the current measurement apparatus is operative to provide for control, e.g. shut down, in the event of a fault condition and regulation of at least one of: power sourced by the electrical energy storage or generation device; and power sunk by the electrical energy storage device, e.g. during charging. Safe and reliable delivery of electrical power to electric motors at high current levels is normally required of such electrical propulsion apparatus. Accurate current measurement may therefore be required to provide for proper regulation and control and to respond to fault conditions.

Alternatively or in addition the electrical apparatus may comprise electrical control apparatus comprising an electrical actuator. The electrical control apparatus may be configured such that the current measurement apparatus is operative to measure current drawn by the electrical actuator. The electrical actuator may comprise a motor and the current measurement apparatus may be comprised in a motor controller which is operative to control the motor. Electrical control apparatus may be used in diverse fields, such as manufacturing, commercial machinery and process control. For example the electrical actuator may comprise a stepper motor forming part of a CNC machine or driving a valve in a fluid control system. Alternatively the electrical actuator may comprise a linear solenoid in an electrically controlled automotive transmission system. In such applications accurate measurement of current may provide for precision of control and for response to fault conditions.

Further embodiments of the fourth aspect of the present invention may comprise one or more features of any previous aspect of the present invention.

Further embodiments of any one of the first to fourth aspect of the present invention may comprise one or more features of any other aspect of the present invention, in particular but not exclusively to features of the fifth aspect of the present invention, such as features relating to calibration.

According to a fifth aspect of the present invention there is provided current measurement apparatus comprising first and second measurement devices, each of the first and second measurement devices being operative to measure current in a respective one of a live conductor and a neutral conductor, the current measurement apparatus being operative to determine a difference between the measured currents and to make a determination in dependence on the current difference.

Prior art approaches involve measurement of a difference between the currents flowing in the live and neutral conductors. In contrast the present invention involves measuring the absolute current flowing in each of the live and neutral conductors and determining the current difference based on the absolute current measurements.

More specifically the current measurement apparatus may be configured for ground fault detection. The current measurement apparatus may therefore be operative to compare the current difference with a threshold leakage value, such as 30 mA, and if the current difference exceeds the threshold leakage value make a ground fault determination. The current measurement apparatus may further comprise a circuit breaker, which is configured to break at least one of the live and neutral conductors. The circuit breaker may be operative in dependence on a ground fault determination being made.

Measurement of absolute current flowing in each of the live and neutral conductors may be liable to inaccuracy. Also a high level of relative accuracy may be required between current measurements made on the live and neutral conductors to obtain a current difference to high accuracy. An acceptable level of inaccuracy for each absolute current measurement may be insufficient to obtain a current difference to required accuracy in particular when the absolute current signals are large. The current measurement apparatus may therefore be configured to provide for calibration of at least one of the first and second measurement devices. More specifically the current measurement apparatus may be configured to provide for calibration of both of the first and second measurement devices. The current measurement apparatus may be configured to provide for calibration on a periodic basis. Alternatively or in addition the current measurement apparatus may be configured to provide for calibration in dependence on a state change of the current measurement apparatus, such as when the current measurement apparatus is powered up. Alternatively or in addition current measurement apparatus may be operative to remove the calibration signal from the measurement before any analysis to prevent the calibration signal from giving rise to an error in fault detection or power measurement.

According to one approach the current measurement apparatus may be configured to apply a calibration signal to at least one of the first and second measurement devices. More specifically at least one calibration signal may be applied to both of the first and second measurement devices. The first and second measurement devices may be operative to measure the applied calibration signal. Therefore the first and second measurement devices may be calibrated in view of the calibration signal being known or predetermined. The calibration signal may only need to be substantially the same for the first and second measurement devices to be sufficient to allow matching of the characteristics of the two measurement devices by determination of a correction factor to be applied, using the correlation of the extracted calibration signals, without needing to know the absolute accuracy of the calibration signal. The current measurement apparatus may be subject to at least one of the following calibration procedures in addition to or instead of calibration upon manufacture or assembly.

In a first form a calibration signal may be passed through a measurement device. This embodiment may be appropriate where the measurement device comprises an electrical component, such as a shunt resistor, in series with a load electrically coupled to the live and neutral conductors. Thus, for example, the calibration signal may be applied to at least one of the live and neutral conductors such that the calibration signal passes through the measurement device, whereby the measurement device is operative to measure the calibration signal. The current measurement apparatus may further comprise a calibration source, which is operative to apply the calibration signal. The calibration source may comprise active and passive components. Furthermore, the calibration source may comprise an impedance in series with at least one switch, the series connected impedance and at least one switch being connected between the live and neutral conductors. In use the impedance and the at least one switch may be connected between the live and neutral conductors on a same side of the first and second measurement devices as a load. The impedance may comprise at least one of a resistor, an inductor and a capacitor. Use of a capacitor may be advantageous because substantially no active power is dissipated by the capacitor and is therefore capable of delivering more current at less cost and a lower power consumption than, for example, a resistor. The calibration source may further comprise a controller, which is operative to open and close the at least one switch. Opening and closing the at least one switch in a predetermined fashion may apply a predetermined calibration signal to both the live and neutral conductors.

A switch which is operative to close and thereby connect the impedance between the live and neutral conductors may be required to withstand a high voltage when open. In many applications the line voltage between the live and neutral conductors may be at mains levels and may be hundreds of volts in certain applications. Withstanding such high off voltages may be problematic for a switch and in particular for a switch formed in an integrated circuit. The present inventors have devised an improvement in the light of an appreciation of this problem. According to the improvement the current measurement apparatus may comprise an impedance and plural switches which are operative such that there is always a circuit path, which comprises at least one closed one of the plural switches, between the live and neutral conductors. More specifically the current measurement apparatus may comprise four switches and may be configured such that two of the four switches are always closed. During operation there may never be solely one signal path between the live and neutral conductors comprising the impedance and an open switch. A maximum voltage across a switch may therefore be much lower than according to a configuration in which an open switch forms part of solely one circuit path between the live and neutral conductors.

Where the impedance comprises a capacitor the current measurement apparatus may further comprise a voltage source in series with the capacitor between the live and neutral conductors. The voltage source may be operative to apply a changing voltage signal, such as a sinusoid, between the capacitor and one of the live and neutral conductors. The changing voltage signal may have a frequency component higher than a fundamental frequency of the line voltage. The current measurement apparatus may further comprise a resistor in series with the capacitor and the voltage source, the resistor being operative to sense a current signal, i.e. a calibration signal, in a measurement device. The current measurement apparatus may yet further comprise a measurement configuration which is operative to measure a current signal in the resistor. The measurement configuration may, for example, comprise a sample and hold circuit and analogue to digital converter which are operative to measure a voltage signal across the resistor. The current measurement apparatus may be configured to alter the changing voltage signal applied by the voltage source in dependence on at least one measurement made by the measurement configuration. The current measurement apparatus may therefore be operative to control the calibration signal applied to at least one of the measurement devices. The current measurement apparatus may further comprise an inductor. The inductor may be operative to store and release calibration signal current whereby the calibration signal is spread over a longer time period which may be more in line with the frequency capabilities of acquisition circuitry. In addition or alternatively the calibration signal may be replicated locally with a known multiplication factor across the measurement device to more power efficiently replicate the calibration signal on the other conductor.

The present inventors have appreciated that the amplitude of the calibration signal generated by a passive impedance normally follows the phase of the line voltage, i.e. the phase of the voltage between the live and neutral conductors. For example if the impedance is capacitive the amplitude of the calibration signal may be at a maximum when the rate of change of the line voltage is at a maximum, i.e. at the zero crossing point of the line voltage. On the other hand, and by way of further example, if the impedance is resistive the amplitude of the calibration signal may be at a maximum when the line voltage is at a maximum. The amplitude of the line voltage affects the signal to noise ratio (SNR). Irrespective of whether the impedance is capacitive or resistive the rms signal to rms noise ratio is obtained if one averages all measurements from a measurement device over at least one complete cycle of the line voltage. However the SNR varies from measurement to measurement from a measurement device within a complete cycle of the line voltage. In view of this the current measurement apparatus may be configured where the impedance is substantially resistive to weight measurements from a measurement device in dependence on the line voltage signal. Where the impedance is reactive the current measurement apparatus may be configured to weight measurements differently within a cycle of the line voltage. More specifically there may be a progressive change, i.e. increase or decrease, in weighting of a series of measurements. Alternatively or in addition a weighting profile may correspond to a profile of the line voltage signal. The weighting of measurements with better SNR in preference to measurements with poorer SNR within a cycle may improve overall SNR. Alternatively and additionally the current measurement apparatus may be operative to analyse noise locked to the line frequency and choose to process the acquired signals appropriately, for example by throwing away measurements that might be erroneous. Alternatively or additionally the current measurement apparatus may be operative to change the frequency, phase, amplitude or modulation of the calibration signal to improve the acquired SNR.

The current measurement apparatus may be configured such that the plural switches are operative to alternately connect the impedance between first and second opposing ends of each of the first and second measurement devices. More specifically the plural switches may be operative to connect the impedance between one of the first and second ends of the first measurement device and one of the first and second ends of the second measurement device. In use the first end of each of the first and second measurement devices may be electrically coupled to a source and the second end of each of the first and second measurement devices may be electrically coupled to a load. More specifically the plural switches may be operative to connect the impedance to the first ends of the first and second measurement devices at one time, e.g. during a first phase, and to connect the impedance to the second ends of the first and second measurement devices at another time, e.g. during a second phase. During the first phase no calibration signal may pass through the first and second measurement devices and during the second phase the calibration signal may pass through the first and second measurement devices. According to this approach a maximum voltage seen by the switches is the voltage across a measurement device which is liable to be in the tens of mV range. Alternatively or in addition and in use, the first end of the first measurement device and the second end of the second measurement device may be electrically coupled to a source and the second end of the first measurement device and the first end of the second measurement device may be electrically coupled to a load. More specifically the plural switches may be operative as described above such that the impedance is connected to the first ends of the first and second measurement devices during a first phase and to the second ends of the first and second measurement devices during a second phase. During the first phase a calibration signal may pass through the second measurement device but not through the first measurement device and during the second phase a calibration signal may pass through the first measurement device but not through the second measurement device.

The present inventors have appreciated that having a configuration in which plural switches alternately connect the impedance between first and second opposing ends of each of the first and second measurement devices may provide for accurate calibration of the transfer function of the first and second measurement devices and may provide for reduction if not removal of a signal with characteristics common to the calibration signal and the live and neutral conductors, i.e. a common signal. Where the plural switches are operative such that no calibration signal and a calibration signal pass through the first and second measurement devices during the first and second phases respectively, the current measurement apparatus may be operative to subtract measurements made by the first and second measurement devices from one another during one of the first and second phases and measurements made by the first and second measurement devices from one another during the other of the first and second phases. The current measurement apparatus may therefore be operative to determine a difference between measurements with the calibration signal and also measurements lacking the calibration signal on a time spaced basis. The current measurement apparatus may be operative to correlate the measurements to be subtracted with each other prior to subtraction. The current measurement apparatus may therefore provide for removal of the common signal and determination of the calibration signal. The determined calibration signal may then be used as described elsewhere to determine a normalisation factor to be applied to measurements, for example, before the measurements are used for at least one of fault detection and power measurement. The calibration signal on the live conductor may be removed by determining the average of Ical(live)=Ilive(phase 2)−Ilive(phase 1) where Ical(live) is the calibration signal present on the live conductor, Illive (phase 2) is the live current measured during phase 2 and Ilive(phase 1) is the live current measured during phase 1. Similarly calibration signal on the neutral conductor may be removed by determining the average of Ical(neutral)=Ineutral(phase 2)−Ineutral(phase 1) where Ical(neutral) is the calibration signal present on the neutral conductor, Ineutral (phase 2) is the neutral current measured during phase 2 and Ineutral(phase 1) is the neutral current measured during phase 1. The error in a gain mismatch, A, between the live and neutral conductors may thereby be determined. After application of the gain mismatch to all subsequent measurements and removal of the calibration signal the difference between the live and neutral current signals may be determined. However this approach has the disadvantage of giving rise to an error where there is common signal having the same characteristics as the calibration signal. A further limitation may arise when the live current signal shares characteristics with the calibration signal the current measurement apparatus may be unable to distinguish the calibration signal from the live current signal. Alternatively or in addition the current measurement apparatus may be operative to subtract measurements made by the first and second measurement devices from one another during one of the first and second phases and measurements made by the first and second measurement devices from one another during the other of the first and second phases when the plural switches are operative such that the calibration signal passes through one of the first and second measurement devices during the first phase and the calibration signal passes through the other of the first and second measurement devices during the second phase. According to this approach, a difference obtained during the first phase is of the form ((Signal+Ical)−A*Signal) and a difference obtained during the second phase is of the form (Signal−A*(Signal+Ical)), where Signal is the load current signal, Ical is the calibration signal and A is the gain mismatch between the live and neutral conductors. The current measurement apparatus may be further operative to subtract the two differences from one another to thereby determine a factor in A and Ical. Alternatively or additionally the apparatus may be operative to use an iterative approach over time on the live and neutral measurements to firstly determine an initial value of A, which is then used to extract an initial value of Ical, which is in turn used to estimate a better value of A, and to thereby determine an overall accurate value. The factor may therefore take account of the gain mismatch between the live and neutral conductors. This approach may provide for removal of the common signal subject to the common signal being substantially the same on average over the first and second phases.

The present inventors have appreciated that the requirement for the common signal being substantially the same on average over the first and second phases may be obviated by changing the configuration of the current measurement apparatus. The current measurement apparatus may therefore further comprise third and fourth measurement devices, the third measurement device being disposed in series with the first measurement device in the live conductor and the fourth measurement device being disposed in series with the second measurement device in the live conductor. The calibration source may be configured such that the calibration signal is applied to only the first and second measurement devices. For example and where the calibration source comprises an impedance and at least one switch the impedance may be operative to periodically couple the live conductor between the first and third measurement devices to the neutral conductor between the second and fourth measurement devices. This approach may provide for reduction if not removal of a signal with characteristics common to the calibration signal and the live and neutral conductors, i.e. a common signal. The current measurement apparatus may be configured to determine a difference between signals measured by the first and second measurement devices, a difference between signals measured by the third and fourth measurement devices and a difference between the thus determined differences. Alternatively or in addition the current measurement apparatus may be configured to determine a difference between signals measured by the first and third measurement devices, a difference between signals measured by the second and fourth measurement devices and a difference between the thus determined differences. The current measurement apparatus may be configured to extract the calibration signal from the measured signals as described herein below. The current measurement apparatus may be configured to at least one of correlate measurements and normalise measurements. More specifically the current measurement apparatus may comprise digital processing circuitry which is configured to at least one of: correlate measurements with each or one another; normalise measurements with each other or one another; apply calibration factors to measurements; control application of a calibration signal; and extract a calibration signal from measured signals. Alternatively or in addition the current measurement apparatus may be configured to combine measurements made with the first to fourth measurement devices to thereby improve upon the SNR. More specifically the current measurement apparatus may be operative to evaluate Ilive(cal) =I1−alpha*I3, where alpha is the normalised gain error between I1 and I3, and Ineutral(cal)=I2−beta*I4, where beta is the normalised gain error between I2 and I4 and where I1, I2, I3 and I4 are the measured currents in the first to fourth shunt resistors respectively. The current measurement apparatus may be further operative to compare Ilive(cal) and Ineutral(cal) to determine the gain error between I1 and I2.

In a second form a calibration signal may be passed through a calibration conductor, the calibration conductor being disposed proximate the measurement device and the measurement device being configured such that the calibration signal induces a corresponding induced calibration signal in the measurement device. This embodiment may be appropriate where the measurement device comprises an inductive current sensor, such as a current transformer or a Rogowski coil. Therefore the measurement device may comprise a coil which is disposed around the calibration conductor.

The calibration conductor may be disposed proximate both the first measurement device and the second measurement device. The current measurement apparatus may therefore be operative to apply a calibration signal to the calibration conductor, whereby the calibration signal passes proximate the first measurement device and the second measurement device in turn.

The current measurement apparatus may comprise first and second calibration conductors, which are disposed proximate a respective one of the first and second measurement devices. A proximal end of each of the first and second calibration conductors may be electrically coupled to the calibration source. A distal end of each of the first and second calibration conductors may be electrically coupled to the neutral conductor. The calibration source may be operative to apply first and second calibration signals to a respective one of the first and second calibration conductors. The first and second calibration signals may be the same calibration signal. The current measurement apparatus may therefore comprise a splitter which is operative, for example, to apply the same calibration signal at the same time to the first and second calibration conductors. Alternatively or in addition the current measurement apparatus may comprise a switch which is operative to apply the same calibration signal at different times to the first and second calibration conductors. The first and second calibration signals may be different calibration signals. The application of different calibration signals to the first and second measurement devices may be appropriate where the measurement devices have different characteristics. For example the first and second measurement devices may be of a different form, such as a shunt resistor or a current transformer, or the first and second measurement devices may be of the same form but different configuration, such as two current transformers configured to measure different ranges of current. The current measurement apparatus may be configured appropriately, for example by way of a switch which is operative to apply the different calibration signals in turn to the first and second calibration conductors.

The first and second forms of calibration may be comprised in the current measurement apparatus. For example the current measurement apparatus may comprise a shunt impedance and an inductive sensor, each of which is operative to measure current in a respective one of the live and neutral conductors, the calibration conductor passing through the coil of the inductive and being connected thereafter to the other of the live and neutral conductors. Thus a calibration signal applied to the calibration conductor induces a corresponding induced current signal in the inductive sensor before passing through the impedance sensor by way of the conductor.

According to either the first or second form of calibration, the calibration signal may be of predetermined form to provide for ease of extraction of the calibration signal from measurements made by the measurement device. More specifically the calibration signal may comprise at least one predetermined frequency component with the extraction being dependent on the at least one predetermined frequency component.

Calibration may be provided for according to another approach by measuring the current in the live and neutral conductors over a period of time during normal operation, storing the measurements and subsequently using the stored measurements to effect calibration. Therefore the current measurement apparatus may be configured: to operate the first and second measurement devices to measure current in the live and neutral conductors; to store the measured currents; and to adjust subsequent current measurements in dependence on the stored measured currents. Current measurement for calibration purposes may preferably be carried out to reflect normal operation of an electrical circuit comprising the live and neutral conductors, e.g. such that measurement of fluctuations in current caused by noise, switching transients and the like are reduced. The current measurement apparatus may therefore be operative to make plural current measurements over a period of time, such as over a period of minutes or hours, and to determine a current measurement value for storage in dependence on the plural current measurements, e.g. an average value for the plural current measurements.

The current measurement apparatus may be configured to determine a matching function which is operative to bring a response of the first measurement device and a response of the second measurement device into proximity with each other. Bringing the responses into proximity with each other may provide for improved accuracy of current difference determination, e.g. by reducing an offset between outputs from the two measurement devices. More specifically the matching function may be operative to bring a transfer function of the first measurement device and a transfer function of the second measurement device into proximity with each other. Bringing the transfer functions into proximity with each other may provide for improved accuracy of current difference determination, e.g. by changing at least one of the transfer functions so as to bring the transfer functions into proximity with each other. The current measurement apparatus may be configured to apply, e.g. by way of the calibration source, plural different current values to the first and second measurement devices. In addition the current measurement apparatus may be configured to determine, e.g. by way of processing circuitry, transfer function measurements made by the measurement devices corresponding to the applied current values. The current measurement apparatus may be operative to determine the transfer functions in dependence on the transfer function measurements. At least three transfer function measurements may be made where the transfer function has the form of a polynomial. The current measurement apparatus may be configured to determine first and second matching functions, the first matching function being operative when applied to bring a transfer function for the first measurement device into proximity with an object transfer function and the second matching function being operative when applied to bring a transfer function for the second measurement device into proximity with the object transfer function. The object transfer function may be of a form which provides for ease of processing. For example the object transfer function may be linear. Alternatively the first and second matching functions may be operative when applied to their respective transfer functions to linearise and bring the transfer functions into proximity with each other. Where the current measurement apparatus comprises an electronically operated interrupter or circuit breaker which is operative to disconnect the load under a determined fault condition, the current measurement apparatus may be operative to apply a delay between making a determination to arm the breaker and closing the interrupter or circuit breaker to thereby re-connect the supply. This allows time for the current measurement apparatus to calibrate the two measurement paths to a required accuracy. In additional or alternatively the current measurement apparatus may comprise sensing circuitry to monitor voltage signals on each side of the interrupter or circuit breaker to determine if the interrupter or circuit breaker should be closed. The sensing circuitry may be operative to detect a miss-wiring or to determine optimum timing for the interrupter to be opened or closed, e.g. at a zero-crossing point of the mains cycle.

The current measurement apparatus may further comprise at least one analogue to digital conversion apparatus which is operative to receive an analogue signal from at least one measurement device and generate a digital signal corresponding to the analogue signal. The at least one analogue to digital conversion apparatus may be configured for at least one of: selection of one dynamic range from plural dynamic ranges; selection of one precision from plural precisions; and selection of one frequency of operation from plural frequencies of operation, e.g. in respect of bandwidth and clocking rate. The current measurement apparatus may therefore be capable of responding properly and appropriately to a variety of fault conditions and in particular arc fault conditions. The current measurement apparatus may comprise at least one isolation circuit which is disposed so as to maintain galvanic isolation between at least two parts of the current measurement apparatus. For example an isolation circuit may be operative to maintain isolation between a first part of the current measurement apparatus, which is operative with a first measurement device in the form of a shunt resistor, and a second part of the current measurement apparatus, which is operative with a second measurement device in the form of a shunt resistor. A variety of levels of information may be passed across the isolation barrier. The information may comprise the raw data from the analogue-to-digital converter, pre-processed data that has been adjusted in at least one of offset, gain, phase, frequency and sampling rate and statistical information over a period of time, amongst other things.

The current measurement apparatus may comprise digital processing circuitry which is operative on digital signals corresponding to or based on current measurements. The digital processing circuitry may, for example, comprise digital signal processing circuitry. The digital processing circuitry may be configured to at least one of: correlate a current measurement from the first measurement device with a current measurement from the second measurement device; bring responses of the first and second measurement devices into proximity with each other; apply predetermined calibration factors to measured signals; control application of a calibration signal; and extract a calibration signal from a measured signal. The digital processing circuitry may be configured to at least one of perform computations, e.g. with regards to power consumption determination, over-current detection or arc signal recognition, and control operations, such as of a circuit breaker or status indicator.

Measurement of the line current by way of a single measurement device in addition to determining the difference between the live and neutral currents by way of the first and second measurement devices may confer benefits. For example this approach may provide for ease of at least one of simultaneous power measurement and fault detection, an AFCI function over different voltage and frequency ranges, and enhancements to ground fault detection. This approach may also provide for enhancement of detection of ground faults by determining if a leakage current is active or reactive and in dependence on this distinguishing a false tripping mechanism from a true fault.

The use of absolute current measurements on live and neutral to create a difference signal for fault detection can have significant advantages for correlation to absolute measurements and determination of multiple factors with different frequency and amplitude characteristics, such as simultaneous power measurement and gfci and afci, but it may have limited accuracy at certain amplitudes of current signals. The current measurement apparatus may therefore further comprise a differential measurement device which is configured to measure of itself the sum in current in the live and neutral conductors. The differential measurement device may be configured to be disposed relative the live and neutral conductors to measure the sum of the current signals present in the live and neutral conductors. The differential measurement device may, for example, be a differencing current transformer through which the live and neutral conductors pass. Where the current measurement apparatus comprises a calibration source, the calibration source may be operative to apply a calibration signal to the differential measurement device. The applied calibration signal may be extracted from measurements as described elsewhere herein to provide for calibration of the differential measurement device in addition to at least one of the first and second measurement devices. The differential measurement device may be configured to be disposed relative the live and neutral conductors such that no calibration signal passes through the portion of live and neutral conductor sensed by the differential measurement device. More specifically the differential measurement device may be configured to be disposed on a load side of the calibration source. In such a configuration and where the differential measurement device is inductive, the calibration source may be configured to pass the calibration signal through a calibration conductor, the calibration conductor being disposed proximate the differential measurement device to thereby induce a corresponding induced calibration signal in the differential measurement device as described elsewhere herein. For such a configuration the calibration source need not be configured to be high voltage capable. Alternatively or in addition and where the differential measurement device is inductive the current measurement apparatus may be configured to pass the calibration signal through one of the part of the live and neutral conductors proximate the differential measurement device. For example the calibration source may, in use, be electrically coupled between the live conductor on a load side of the differential measurement device and the neutral conductor on a source side of the differential measurement device.

In use and as mentioned above current measurement apparatus comprising a differential measurement device may provide for enhanced capabilities. With regards to fault detection such current measurement apparatus may provide for the combination of both absolute and differential measurements to, for example, to determine if leakage is from the live conductor or neutral conductor. Also such current measurement apparatus may provide for ease of provision of the like of AFCI and ground fault detection functions by relying more on measurements made by the differential measurement device in preference to absolute measurements when the currents on live and neutral are high and relying more on absolute measurements in preference to measurements made by the differential measurement device when the current difference between the live and neutral conductors is great, but by providing continuity in measurements by calibrating the differential response of the absolute measurements to the response of the differential measurement.

The present inventors have appreciated the feature of the differential measurement device to be of wider applicability than hitherto described. The current measurement apparatus may therefore further comprise a differential measurement device as described above, one of the first and second measurement devices being constituted by the differential measurement device. The differential measurement device may therefore be operative to sense current in a respective one of the live and neutral conductors and to sense current in the other one of the live and neutral conductors at the same time and to provide a difference output in dependence on the two sensed currents. The other of the first and second measurement devices may be operative to measure current solely in one of the live and neutral conductors. This approach may allow for a measurement device to be dispensed with to thereby save on cost and reduce complexity and size. The current measurement apparatus may be configured to determine a signal present in the conductor not measured by the other of the first and second measurement devices. More specifically measurements made by the other of the first and second measurement devices may be subtracted from measurements made by the differential measurement device to thereby provide measurements for each of the live and neutral conductors. The current measurement apparatus may therefore be configured to provide for the like or correlation and normalisation as described elsewhere herein. The current measurement apparatus may be configured as described elsewhere herein to determine fault conditions and measure power. As described elsewhere herein a calibration signal may be applied to the live and neutral conductors or may be applied inductively to a measurement device. Also a calibration signal may be applied across the live and neutral conductors or may be applied to one of the live and neutral conductors.

According to a sixth aspect of the present invention there may be provided a current measurement arrangement comprising plural current measurement apparatus according to the fifth aspect of the present invention, each of the plural current measurement apparatus being configured to measure current in a different one of plural live conductors and a neutral conductor. Thus the current measurement arrangement may be operative to measure current in different phases of a three phase electrical supply.

Embodiments of the sixth aspect of the invention may comprise one or more features of the fifth aspect of the invention. Where the current measurement arrangement is configured for calibration of plural measurement devices, the current measurement arrangement may comprise at least one calibration source which is operative to apply a calibration signal to a measurement device in each of plural live conductors and the neutral conductor. The current measurement arrangement may comprise one or more of the further calibration features described above.

According to a seventh aspect of the present invention there is provided a current measurement method comprising: operating each of first and second measurement devices to measure current in a respective one of a live conductor and a neutral conductor; and operating current measurement apparatus to determine a difference between the measured currents and to make a determination in dependence on the current difference. Embodiments of the seventh aspect of the present invention may comprise one or more features of the fifth or sixth aspect of the present invention.

According to an eighth aspect of the present invention there is provided electrical apparatus comprising current measurement apparatus according to the fifth aspect of the present invention or a current measurement arrangement according to the sixth aspect, the electrical apparatus being configured such that the current measurement apparatus or current measurement arrangement measures current passing through a part of the electrical apparatus. Embodiments of the eighth aspect of the present invention may comprise one or more features of the fourth aspect of the present invention.

Further embodiments of the fifth to eighth aspects of the present invention may comprise one or more features of any other aspect of the present invention.

According to a ninth aspect of the present invention there is provided current measurement apparatus comprising at least one measurement device and at least one acquisition circuit, the at least one measurement device being operative to measure current in at least one of a live conductor and a neutral conductor, the at least one acquisition circuit being configured to have at least two different dynamic ranges and to be operative to acquire each of plural signals from the at least one measurement device within a respective one of the different dynamic ranges, the current measurement apparatus being operative to make plural different determinations in dependence on the plural acquired signals.

In use the at least one acquisition circuit is operative to acquire plural signals within a respective one of the different dynamic ranges. For example a first acquired signal may be in a range of 0 to 20 Amps RMS and a second acquired signal may be in a range of 50 to 200 Amps RMS. Furthermore the current measurement apparatus is operative to make plural different determinations in dependence on the plural acquired signals. For example the current measurement apparatus may be operative to make an arc fault determination in dependence on a signal acquired from the live conductor in the 50 to 200 Amps RMS range and a current measurement for metering purposes in dependence on a signal acquired from the live conductor in the 0 to 20 Amps RMS range.

The current measurement apparatus may comprise a first measurement device operative to measure current in the live conductor, a second measurement device operative to measure current in the neutral conductor, a first acquisition circuit operative to acquire plural signals from the first measurement device and a second acquisition circuit operative to acquire plural signals from the second measurement device. The current measurement apparatus may therefore be operative to make at least one determination in dependence on a difference between current measured in the live and neutral conductors. For example the current measurement apparatus may be operative to make an arc fault determination in dependence on a signal acquired from the live conductor in the 50 to 200 Amps RMS range and a ground fault determination in dependence on a difference between signals acquired from the live and neutral conductors in the 0 to 20 Amps RMS range. Further embodiments of the ninth aspect of the present invention may comprise one or more features of the first aspect of the present invention.

According to a tenth aspect of the present invention there may be provided a current measurement arrangement comprising plural current measurement apparatus according to the ninth aspect of the present invention, each of the plural current measurement apparatus being configured to measure current in a different one of plural live conductors and a neutral conductor. Thus the current measurement arrangement may be operative to measure current in different phases of a three phase electrical supply. Embodiments of the tenth aspect of the invention may comprise one or more features of the ninth aspect of the invention.

According to an eleventh aspect of the present invention there is provided a current measurement method comprising: measuring current in at least one of a live conductor and a neutral conductor with at least one measurement device; acquiring plural signals from the at least one measurement device with at least one acquisition circuit, which is configured to have at least two different dynamic ranges, each of the plural acquired signals being within a respective one of the different dynamic ranges; and making plural different determinations in dependence on the plural acquired signals. Embodiments of the eleventh aspect of the present invention may comprise one or more features of the ninth or tenth aspect of the present invention.

According to an twelfth aspect of the present invention there is provided electrical apparatus comprising current measurement apparatus according to the ninth aspect of the present invention or a current measurement arrangement according to the tenth aspect of the present invention, the electrical apparatus being configured such that the current measurement apparatus or current measurement arrangement measures current passing through a part of the electrical apparatus. Embodiments of the twelfth aspect of the present invention may comprise one or more features of the fourth aspect of the present invention.

Further embodiments of the ninth to twelfth aspects of the present invention may comprise one or more features of any other aspect of the present invention.

BRIEF DESCRIPTION OF DRAWINGS

The present invention will now be described by way of example only with reference to the following drawings, of which.

DESCRIPTION OF EMBODIMENTS

Figure 1:
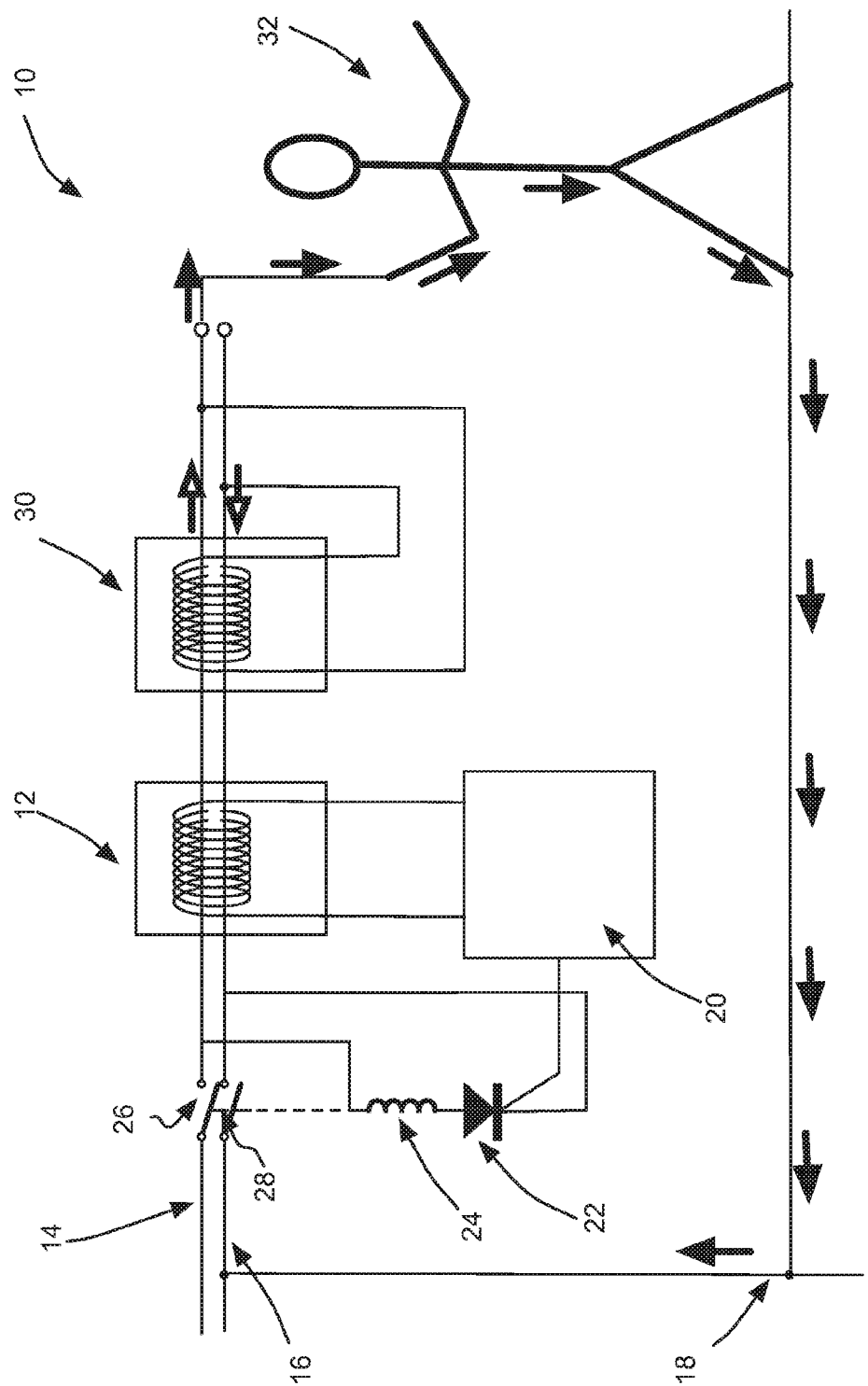
FIG. 1 is a representation of a known Ground Fault Current Interrupter (GFCI)

A known Ground Fault Current Interrupter (GFCI) 10 is shown in FIG. 1. The known GFCI 10 comprises a differential current transformer 12 around a live conductor 14 and a neutral conductor 16. The neutral conductor 16 is connected to ground 18. As described above the differential current transformer 12 is operative to measure the difference between the current signals present in the live and neutral conductors 14, 16. The GFCI 10 further comprises an amplifier and reference circuit 20, which receives an output from the differential current transformer 12 and is operative to amplify the output from the differential current transformer 12 and compare the amplified output with a reference value, e.g. 5 mA, which is deemed a safe limit of ground current. In addition the GFCI 10 comprises a circuit breaker comprised of a Silicon Controlled Rectifier (SCR) 22, a solenoid 24, a first switch 26 in series with the live conductor 14 and a second switch 28 in series with the neutral conductor 16. The SCR 22 is connected in series with the solenoid 24 and the series connected SCR 22 and solenoid 24 are connected across the live and neutral conductors 14, 16 on the load side of the first and second switches 26, 28. The gate of the SCR 22 is connected to the output of the amplifier and reference circuit 20 whereby a current measured by the differential current transformer 12 in excess of the reference value is operative to switch the SCR 22 on which in turn operates the solenoid 24. Operation of the solenoid 24 causes operation of the first and second switches 26, 28 to thereby open the live and neutral conductors 14, 16. Thus a measured difference in current signals passing through the live and neutral conductors 14, 16 that exceeds a safe predetermined threshold, such as 5 mA, opens both the live and neutral conductors 14, 16. The GFCI 10 further comprises a second differential current transformer 30 which surrounds the live and neutral conductors 14, 16 with the coil (i.e. secondary) providing a local current flow between the load side live and neutral for the purpose of detecting the case were there has been an erroneous grounding of the neutral at the load side.

The operation of the GFCI will now be described with reference to FIG. 1. FIG. 1 shows a person 32 making electrical contact with the live conductor with one part of his body whilst he is electrically connected to ground 18 with another part of his body. The person 32 might, for example, make electrical contact with the live conductor if the live conductor is electrically coupled to the ungrounded casing of an electrical appliance. At least some of the current flowing in the live conductor follows the alternative path to ground 18 provided by the body of the person 32. As a result less current flows in the neutral conductor 16 than in the live conductor 14. The difference in current is measured by the differential current transformer 12 and if the current difference exceeds the predetermined safe limit, e.g. 5 mA, the GFCI is operative as described above to open the live and neutral conductors 14, 16 to thereby prevent further current from passing through the person 32. If the circuit of FIG. 1 has two ground connections with the second ground connection being near the load there is the possibility of leakage current passing through the person 32 before flowing through the second ground connection instead of continuing to flow through ground. Leakage current which flows through the second ground connection flows through the differential current transformer 12 whereby the differential current transformer 12 fails to measure the current leakage despite leakage current passing through the person 32. The second differential current transformer 30 near the load means that the circuit is operative to respond to any leakage current that returns through a second ground connection which is located at the load side.

Figure 2:
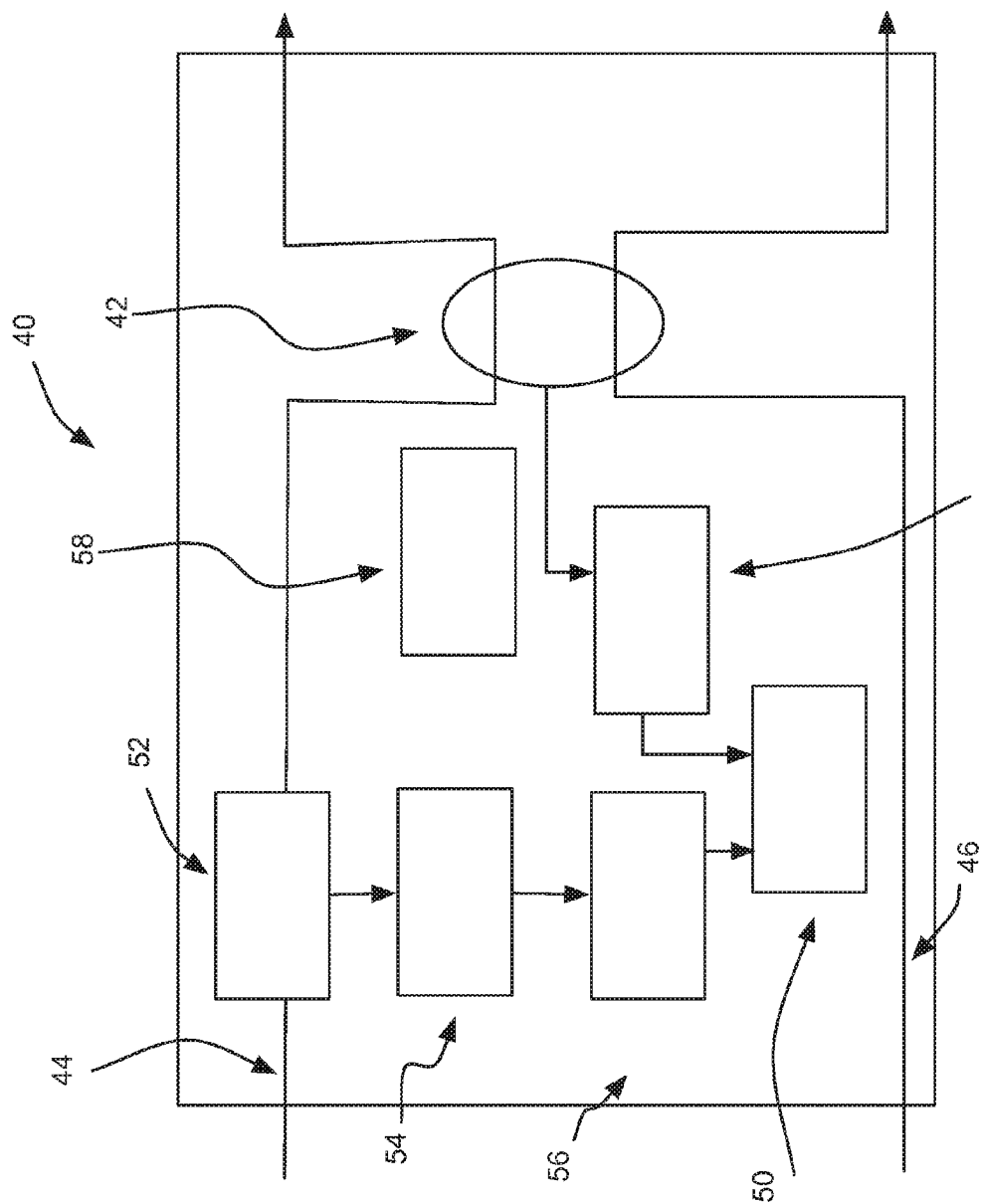
FIG. 2 is a representation of a known Arc Fault Current Interrupter (AFCI)

A known Arc Fault Current Interrupter (AFCI) 40 is shown in FIG. 2. The known AFCI 40 comprises a differential current transformer 42 through which a live conductor 44 and a neutral conductor 46 pass. The current transformer 42 is therefore operative to determine the difference between the current signals present in the live and neutral conductors 44, 46. The AFCI 40 further comprises a first amplifier circuit 48, which is operative to amplify the output from the current transformer 42, and logic circuitry 50, which is operative to receive the amplified signal from the first amplifier 48. In addition the AFCI 40 comprises a current sensor 52 in series with the live conductor 44, which is operative to measure the current signal present in the live conductor 44, and a filter circuit 54, which receives an input from the current sensor 42. The filter circuit 54 is operative to filter out normal, non-arc related signals. Thus for example the filter circuit 54 comprises a band pass filter component which is operative to filter out non-characteristic transients, which might for example be caused by load switching, or high frequency noise. Signals passed by the filter circuit 54 are received by a second amplifier circuit 56 which passes the signals after amplification to the logic circuitry 50. Although not shown in FIG. 2 the AFCI comprises analogue to digital converter circuitry operative to convert the analogue signals received from the first and second amplifiers 48, 56 and to pass digital signals to the logic circuitry. The logic circuitry 50 is operative in dependence on signals received from the differential current transformer 42 and the current sensor 52 to determine whether an arc is good or bad. More specifically the logic circuitry 50 is operative to distinguish between normal circuit transients, such as those caused by lamp burn out, and transients caused by a dangerous arcing event. An output from the logic circuitry 50 drives a circuit interrupter (not shown) of the form shown in FIG. 1 to disconnect the live and neutral conductors in the event of detection of a dangerous arcing event. The AFCI also comprises test circuitry 58, which is operative on manual actuation to simulate a dangerous arc and thereby trigger the circuit interrupter.

Figure 3:
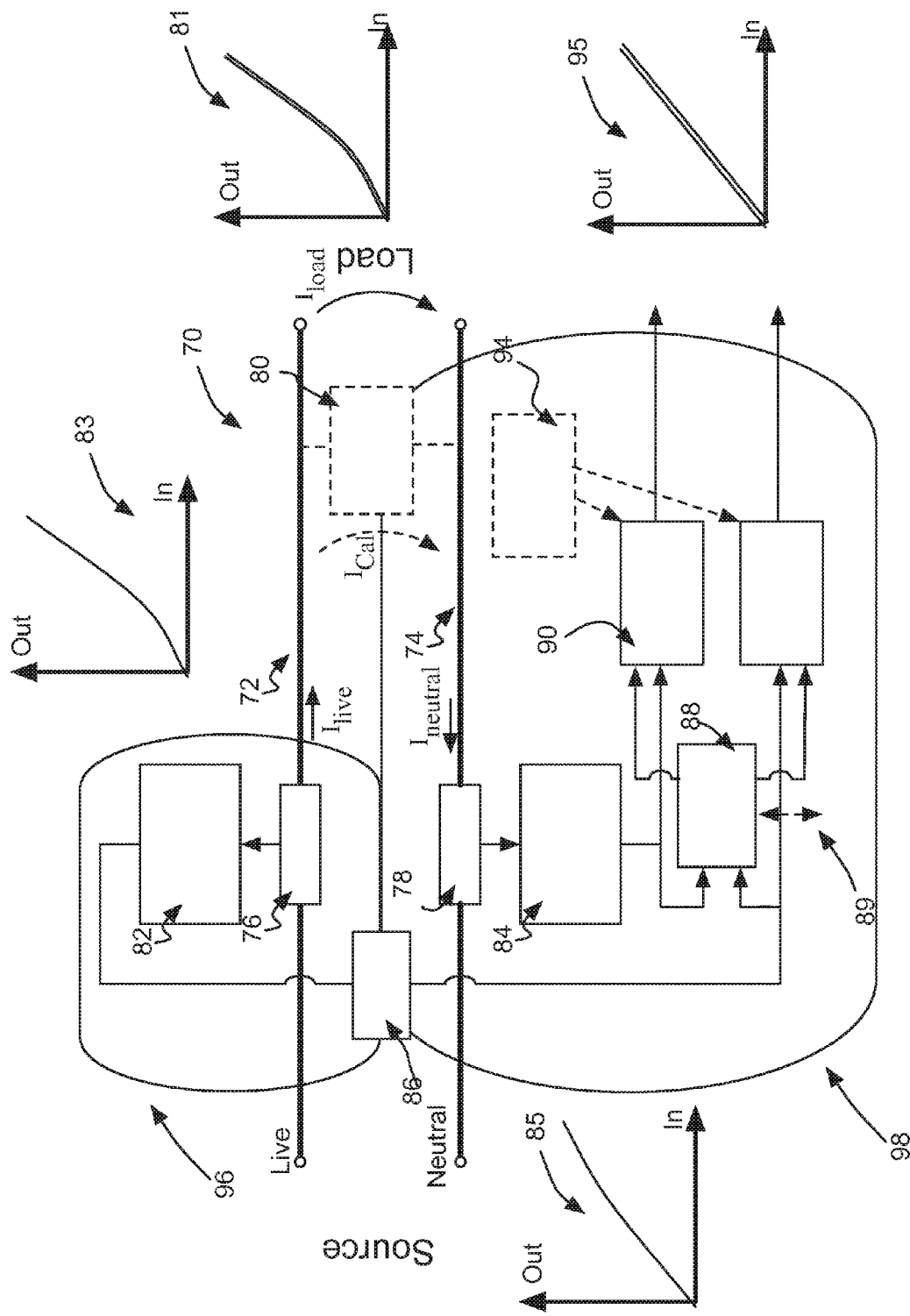
FIG. 3 is a block diagram representation of current measurement apparatus according to a first embodiment.

A block diagram representation of current measurement apparatus 70 according to a first embodiment of the invention is shown in FIG. 3. The current measurement apparatus 70 comprises a live conductor 72 and a neutral conductor 74, which convey electrical power from a source to a load in a mains electricity circuit. The current measurement apparatus is installed, e.g. in a distribution box, in residential or business premises. A first shunt resistor 76 (which constitutes a first measurement device) is present in series in the live conductor 72 and a second shunt resistor 78 (which constitutes a second measurement device) is present in series in the neutral conductor 74. The current measurement apparatus 70 further comprises a calibration source 80, which is electrically coupled to the live and neutral conductors 72, 74. As is described further below the calibration source 80 is operative to apply a calibration signal to the live and neutral conductors to calibrate the first and second shunt resistors 76, 78 and their respective processing chains. The current measurement apparatus 70 also comprises a first acquisition circuit 82, which is configured to acquire an analogue current measurement from the first shunt resistor 76 and generate a digital representation of the analogue current measurement, and a second acquisition circuit 84, which is configured to acquire an analogue current measurement from the second shunt resistor 78 and generate a digital representation of the analogue current measurement.

Each of the first and second acquisition circuits 82, 84 comprises a gain stage, which is operative to apply a gain to (i.e. to amplify or attenuate) the analogue current measurement before analogue to digital conversion, and an analogue to digital converter, which is operative to perform analogue to digital conversion of the analogue current measurement. The design of the first and second acquisition circuits will be within the ordinary design capability of the person skilled in the art other than is described herein. The outputs from the first and second acquisition circuits 82, 84 are received by signal processing circuitry, which is constituted as digital signal processing circuitry or the like. The design of the first and second acquisition circuits and the digital signal processing circuitry further to what is described herein will be within the ordinary design capabilities of the person skilled in the art. On account of the need to maintain galvanic isolation between the live and neutral circuits the current measurement apparatus 70 comprises an isolator 86 in series between the first acquisition circuit 82 and the signal processing circuitry. As can be seen from FIG. 3 the isolator 86 provides for communication of data between a first power domain 96, which comprises the shunt resistor on the live conductor and its data acquisition circuit, and a second power domain 98, which comprises the shunt resistor on the neutral conductor and all the remaining circuitry.

The signal processing circuitry of the current measurement apparatus 70 of FIG. 3 comprises a correlation detection and correction circuit 88, which receives inputs from the first and second acquisition circuits 82, 84, and first and second processing circuits 90, 92, which receive inputs from the correlation detection and correction circuit 88. The signal processing circuitry also comprises non-volatile memory 94, which is operative to store pre-stored data, such as factory calibration data, or permanently stored data, which is required to survive the apparatus being powered down. The signal processing circuitry further comprises local volatile memory, such as RAM, which is used to store data that need not survive power down or data of an intermediate nature, e.g. data stored for use during the course of computations.

Operation of the current measurement apparatus 70 of FIG. 3 will now be described. As a first step the primary operative characteristics absent compensation and normalisation will be described. Then calibration and normalisation will be described. Thereafter the effect of calibration and normalisation on normal operation of the current measurement apparatus 70 will be described.

The primary operative characteristics involve a first current signal flowing through the live conductor 72, which causes a first voltage signal to be developed across the first shunt resistor 76. Also a second current signal flowing through the neutral conductor 74 causes a second voltage signal to be developed across the second shunt resistor 78. The first and second acquisition circuits 82, 84 are operative to convert their respective first and second voltage signals into corresponding first and second digital signals. The first and second digital signals correspond respectively to the first and second absolute current signals present in the live and neutral conductors with first and second absolute current signals being determinable in view of the impedance of the first and second shunt resistors being known, as described below. The first and second digital signals are then conveyed to the signal processing circuitry where compensation and normalisation, as described below, are carried out. Thereafter the digital signals are then used to perform measurement and fault detection functions as described below and in particular with reference to FIGS. 10 to 13.

Calibration and normalisation will now be described. There are three main approaches to calibration: preset, which may for example, be carried out after manufacture; by application of a calibration signal during use; and on a self-learning basis. Each calibration approach will be described in turn.

With regards to the preset calibration approach after manufacture the transfer characteristics of the first and second shunt resistors 76, 78 and their respective processing chains are unknown or known to insufficient accuracy. A post manufacture calibration procedure comprises determining the transfer characteristics with reference to a calibration standard of sufficient accuracy. The transfer characteristics are determined over a bandwidth of operation of the shunt resistors and their processing chains. The determined transfer characteristics are stored in non-volatile memory 94 or RAM and applied during normal operation as described below at the conclusion of the description of the different approaches to calibration.

With regards to the approach of applying a calibration signal, the calibration source 80 is operative to apply a known calibration signal to each of the first and second shunt resistors 76, 78 during normal operation of the current measurement apparatus 70. The calibration source 80 is operative at a regular predetermined intervals, e.g. once an hour, once a day or week, sufficient to provide for maintenance of accuracy of measurement. Alternatively or in addition the calibration source 80 is operative following one or more predetermined events when it is likely that calibration will be required, e.g. upon switch on of the current measurement apparatus or following detection of and response to a fault event. The calibration source 80 is operative to apply at least one calibration signal by one or more of the different approaches described below with reference to FIGS. 4 to 8. The calibration source 80 is operative is generate a calibration signal which is different from load drawn current signals present on the live and neutral conductors 72, 74 whereby the voltage signals developed across the first and second shunt resistors 76, 78 by the calibration signal and the corresponding digital signals are separable from the digital signals corresponding to the load drawn current signals. The calibration signal is different from the load drawn current signals in respect of frequency characteristics whereby the correlation detection and correction circuit 88 is operative to extract the parts of the digital signals corresponding to the calibration signal, e.g. by way of frequency analysis such as by application of a Fast Fourier Transform (FFT) algorithm, which is operative to separate the parts corresponding to the calibration signal and the load drawn current signal from each other on the basis of their different frequencies. The correlation detection and correction circuit 88 is operative to compare an extracted part corresponding to the calibration signal with the known calibration signal generated by the calibration source 80 to thereby determine the transfer characteristics for each of the first and second shunt resistors 76, 78 and their respective processing chains. The determined transfer characteristics are stored in non-volatile memory 94 or RAM. Where preset calibration as described above has already been carried out the current measurement apparatus 70 is operative to update the already stored transfer characteristics. During the update process the factory set values are retained to thereby allow for a restore operation, to allow for comparison with later determined values and for functions which depend on such factory set values. The stored transfer characteristics are applied during normal operation as described below at the conclusion of the description of the different approaches to calibration.

The third calibration approach involves self-learning. This approach involves the current measurement apparatus 70 measuring the current in the first and second shunt resistors 76, 78 over a period of time during normal operation and determining the transfer characteristics at least in part for each shunt resistor and its processing chain in dependence on these measurements. For example plural measurement are made over an extended period of time, such as seconds, minutes, hours or days, and an average current value determined from the plural measurements whereby the effect of fluctuations in current caused by noise, switching transients and the like is reduced. The determined transfer characteristics or partial transfer characteristics are stored in non-volatile memory 94. Alternatively already stored characteristics are updated, e.g. in respect of an offset which has developed since initial or subsequent calibration by way of one of the other two approaches.

During normal operation of the current measurement apparatus the stored transfer characteristics are applied by the first and second processing circuits 90, 92 to their respective first and second digital signals. More specifically each of the first and second processing circuits 90, 92 is operative to determine the absolute current flowing in its respective conductor 72, 74 in dependence on the transfer characteristics of the respective shunt resistor and processing chain which are now accurately known following calibration as described above and are now reflected in the stored transfer characteristics. As will become apparent from the following description certain operations, such as determining the difference in currents in the live and neutral conductors, depend on measurement of current in both live and neutral conductors 72, 74. The first and second digital signals acquired by the current measurement apparatus 70 are therefore aligned with each other to provide for accurate computations based on the first and second digital signals. The correlation detection and correction circuit 88 is operative to bring the first and second digital signals into alignment by at least one of two approaches. According to a first approach the correlation detection and correction circuit 88 is operative to perform a cross-correlation of the first and second digital signals to determine the phase shift which provides the greatest extent of correspondence between the first and second digital signals. One of the first and second digital signals is shifted by the determined phase shift to thereby bring the digital signals into alignment. According to a second approach the calibration source is operative to apply a calibration signal to both the first and second shunt resistors 76, 78 and a part of the first digital signal corresponding to the calibration signal passing through the first shunt resistor 76 is compared with a part of the second digital signal corresponding to the calibration signal passing through the second shunt resistor 78 to determine the phase difference between the first and second digital signals. One of the first and second digital signals is shifted by the determined phase difference to thereby bring the digital signals into alignment.

Accurate computation based on the currents measured in the live and neutral conductors requires matching of the transfer characteristics of the first and second shunt resistors and their processing chains in addition to phase alignment. The current measurement apparatus 70 of FIG. 3 is therefore operative to match the transfer characteristics of the first and second shunt resistors and their processing chains by one of the two following approaches. A first graph 83 shows a first transfer function for the first shunt resistor and its processing chain and a second graph 85 shows a second transfer function for the second shunt resistor and its processing chain. As can be seen the first and second transfer functions are quite different. According to the first matching approach the correlation detection and correction circuit 88 is operative to compare the first and second transfer functions as determined as part of the calibration process with each other and to determine a matching function which brings the first and second transfer functions into sufficient proximity to provide for accuracy of computation based on measurement of current in both the live and neutral conductors. A matching function which is operative to bring one of the first and second digital signals into proximity with the other of the first and second digital signals is determined. A third graph 81 in FIG. 3 shows the effect of a matching function which is operative to bring the second (i.e. neutral) digital signal into proximity with the first (i.e. live) digital signal. According to the second approach the correlation detection and correction circuit 88 is operative to determine first and second matching functions, with the first matching function being operative to bring the first digital signal into proximity with an object function and the second matching function being operative to bring the second digital signal into proximity with the object function. The object function is of a form which provides for ease of execution of subsequent computations. For example the object function is a linear function. A fourth graph 95 in FIG. 3 shows the effect of first and second matching functions which are operative to bring their respective first (i.e. live) and second (i.e. neutral) digital signals into proximity with a linear function. According to the first approach the matching function characteristics are stored in non-volatile memory 94 or RAM for application by one of the first and second processing circuits 90, 92 to its respective digital signal. According to the second approach the first and second matching function characteristics are stored in non-volatile memory 94 or RAM with the first processing circuit 90 being operative to apply the first matching function to the first digital signal and the second processing circuit 90 being operative to apply the second matching function to the second digital signal.

Figure 4:
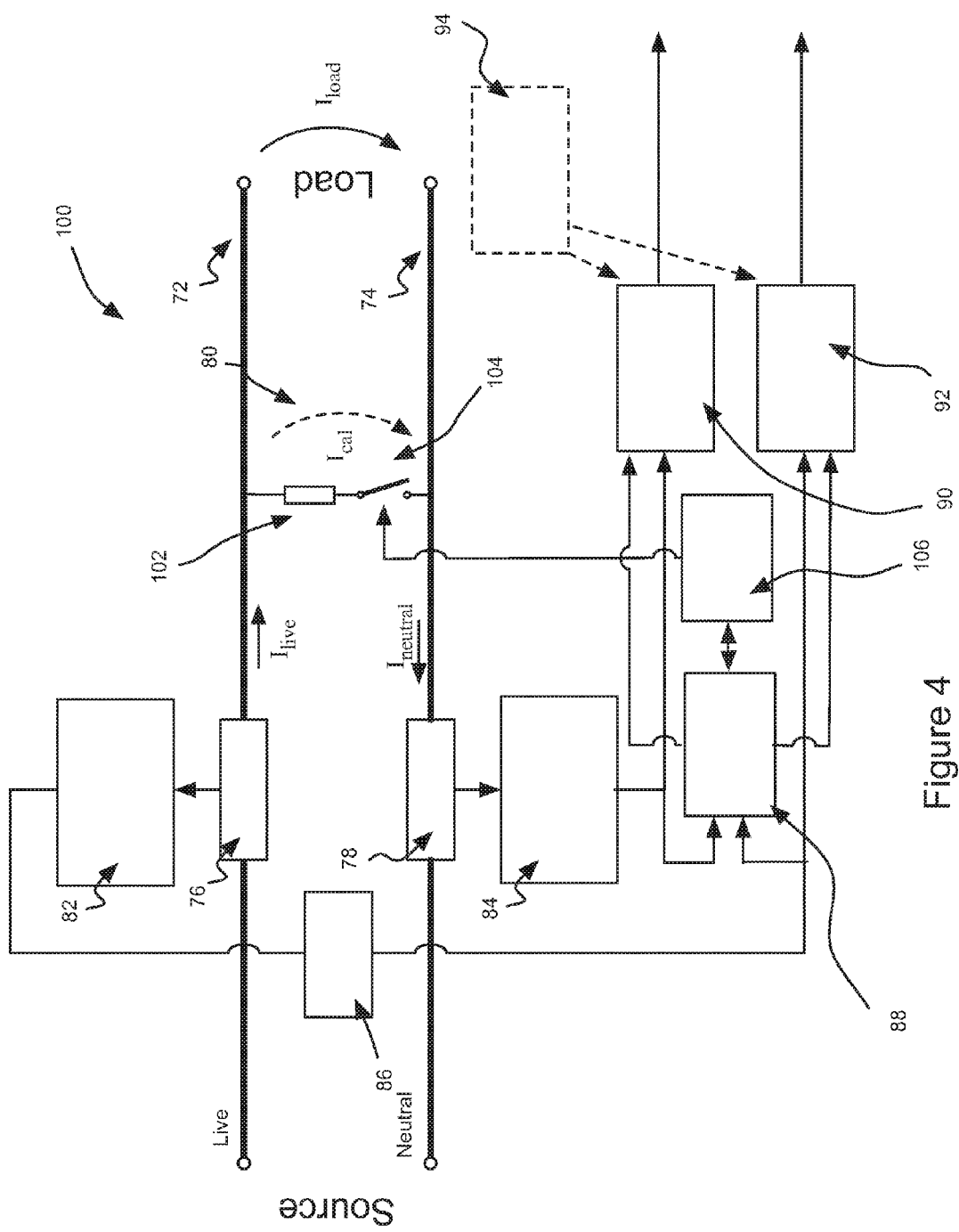
FIG. 4 is a block diagram representation of current measurement apparatus according to a second embodiment.

Current measurement apparatus 100 according to a second embodiment is shown in FIG. 4. Components in common with the embodiment of FIG. 3 are designated by like reference numerals and the reader's attention is directed to the description provided above with reference to FIG. 3 for a description of such common components. Components particular to the embodiment of FIG. 4 will now be described. The calibration source 80 comprises a calibration resistor 102 in series with a switch 104 with the series arrangement of calibration resistor 102 switch 104 being electrically connected between the live and neutral conductors 72, 74. The current measurement apparatus 100 of FIG. 4 further comprises a calibration control unit 106, which forms part of the signal processing circuitry described above. The calibration control unit 106 is operative to turn the switch 104 on and off in a predetermined fashion with current passing between the live and neutral conductors when the switch 104 is closed. Turning the switch on and off in this fashion therefore modulates the current signals present on the live and neutral conductors with the calibration control unit 106 operating the switch so as to impress a characteristic current signal on both the live and neutral conductors. The characteristic current signal is measured by each of the first and second shunt resistors 76, 78 and extracted by the correlation detection and correction circuit 88 as described above with reference to FIG. 3 to thereby provide for calibration of the first and second shunt resistors and their processing chains.

Figure 5:
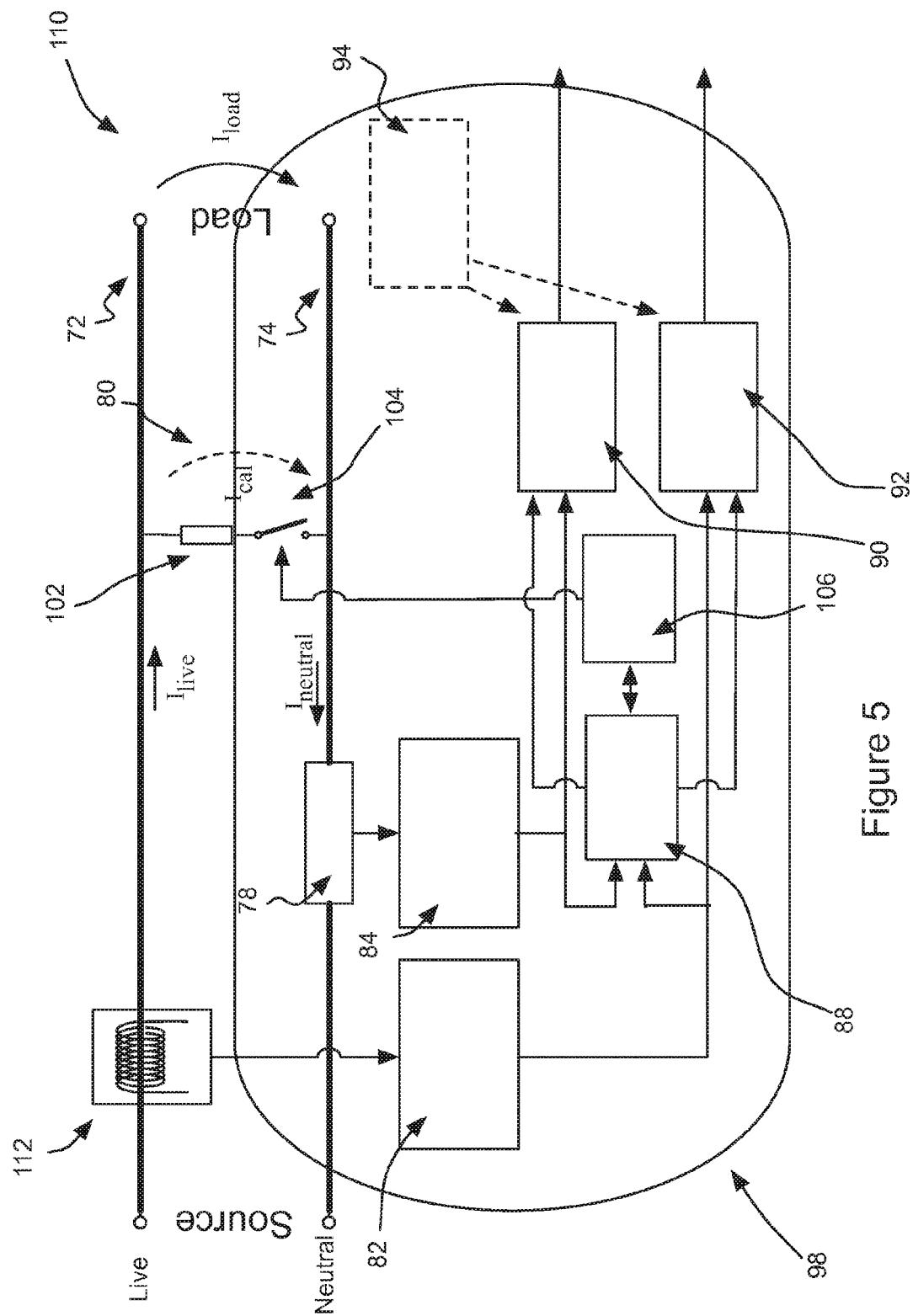
FIG. 5 is a block diagram representation of current measurement apparatus according to a third embodiment.

Current measurement apparatus 110 according to a third embodiment is shown in FIG. 5. Components in common with the embodiments of FIGS. 3 and 4 are designated by like reference numerals and the reader's attention is directed to the description provided above with reference to FIGS. 3 and 4 for a description of such common components. Components particular to the embodiment of FIG. 5 will now be described. Instead of the first shunt resistor 76 of FIGS. 3 and 4 the embodiment of FIG. 5 comprises a current transformer 112 which is configured as described elsewhere herein such that it is operative to measure current flowing in the live conductor 72. Although not shown in FIG. 5 the current transformer comprises a burden resistor connected across the coil of the transformer and which is operative in accordance with normal design practice. In view of the inherently isolating characteristic of the current transformer 112 there is no need to provide for isolation between the processing chains of the current transformer 112 and the second shunt resistor 78. A power domain, which is indicated by box 98 in FIG. 5 and which is isolated from the live conductor, comprises the shunt resistor on the neutral conductor and all the data processing circuitry. The embodiment of FIG. 5 is operative as described above with following exception. The current in the live conductor 72 induces a corresponding current in the current transformer which is then subject to acquisition and processing to provide a first digital signal as described above. The calibration source 80 is operative as described above with reference to FIG. 4 to impress a characteristic current signal on the live and neutral conductors with the characteristic current signal on the live conductor inducing a corresponding induced characteristic current signal in the current transformer. The part of the first digital signal corresponding to the induced characteristic current signal is extracted by the correlation detection and correction circuit 88 as described above to thereby provide for calibration of the current transformer 112 and its processing chain.

Figure 6:
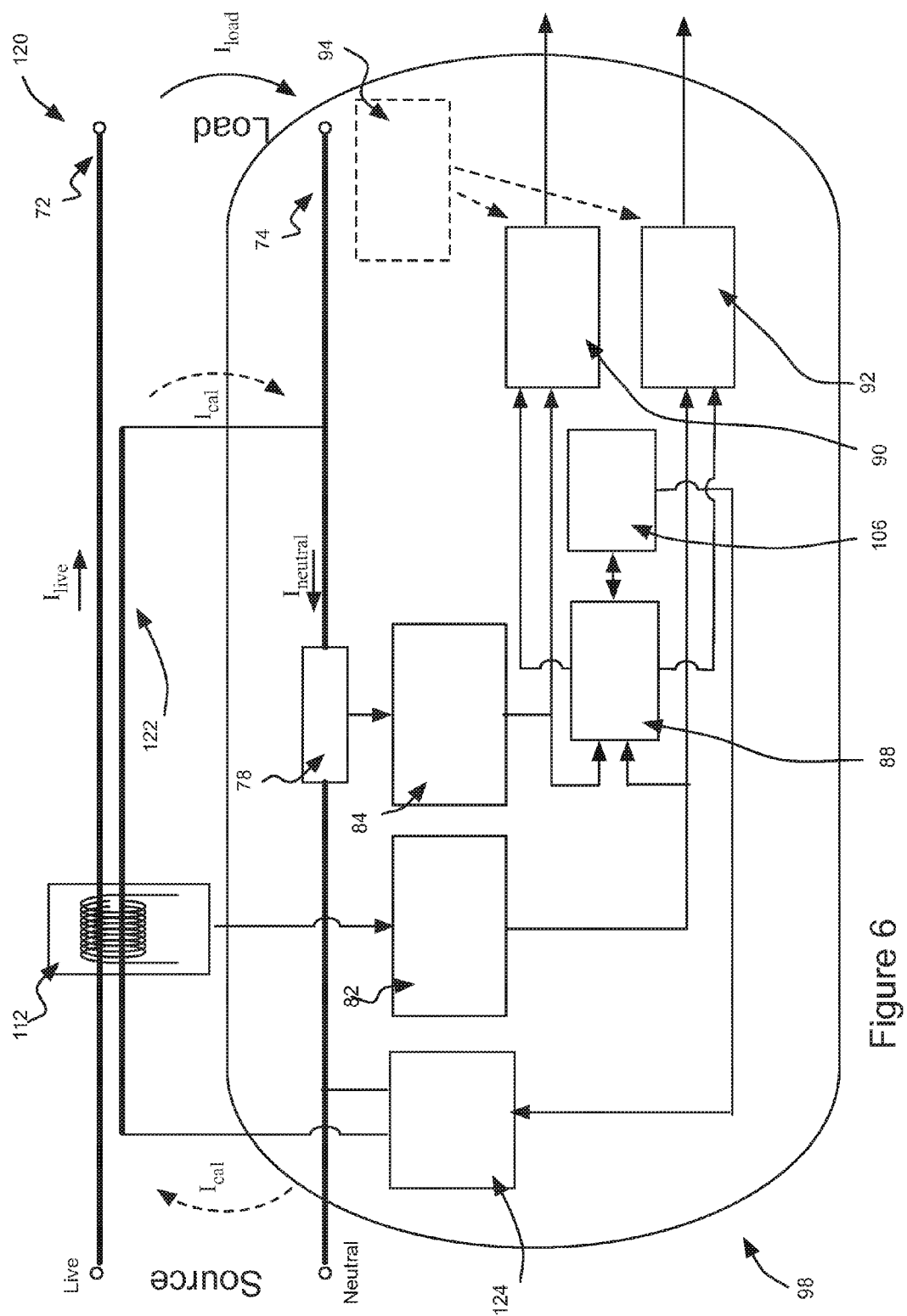
FIG. 6 is a block diagram representation of current measurement apparatus according to a fourth embodiment.

Current measurement apparatus 120 according to a fourth embodiment is shown in FIG. 6. Components in common with the embodiments of FIGS. 3 to 5 are designated by like reference numerals and the reader's attention is directed to the description provided above with reference to FIGS. 3 to 5 for a description of such common components. Components particular to the embodiment of FIG. 6 will now be described. The current measurement apparatus 120 comprises a calibration conductor 122, which passes through the current transformer 112. The distal end of the calibration conductor 122 is electrically connected to the neutral conductor 74 on the load side of the second shunt resistor 78. The proximal end of the calibration conductor 122 is electrically connected to a signal output of another form of calibration source 124. A low voltage line of the calibration source 124 is electrically connected on the source side of the second shunt resistor 78. Therefore signals generated by this form of calibration source 124 pass out though the calibration conductor 122 and return to the calibration source 124 by way of the neutral conductor 74 and second shunt resistor 78. This arrangement replaces the calibration source 80 of FIGS. 3 to 5. A power domain, which is indicated by box 98 in FIG. 6 and which is isolated from the live conductor, comprises the shunt resistor on the neutral conductor and all the data processing circuitry. The calibration source 124 of FIG. 6 is operative to generate a characteristic calibration signal which passes through the calibration conductor 122 and thereby induces a corresponding signal in the current transformer 112 before passing through the second shunt resistor 78 wherein a corresponding voltage signals developed. The correlation detection and correction circuit 88 is operative to extract the parts of the first and second digital signals corresponding to the calibration signal to thereby provide for calibration of the current transformer 112 and its processing chain and the second shunt resistor 78 and its processing chain as described above.

Figure 7:
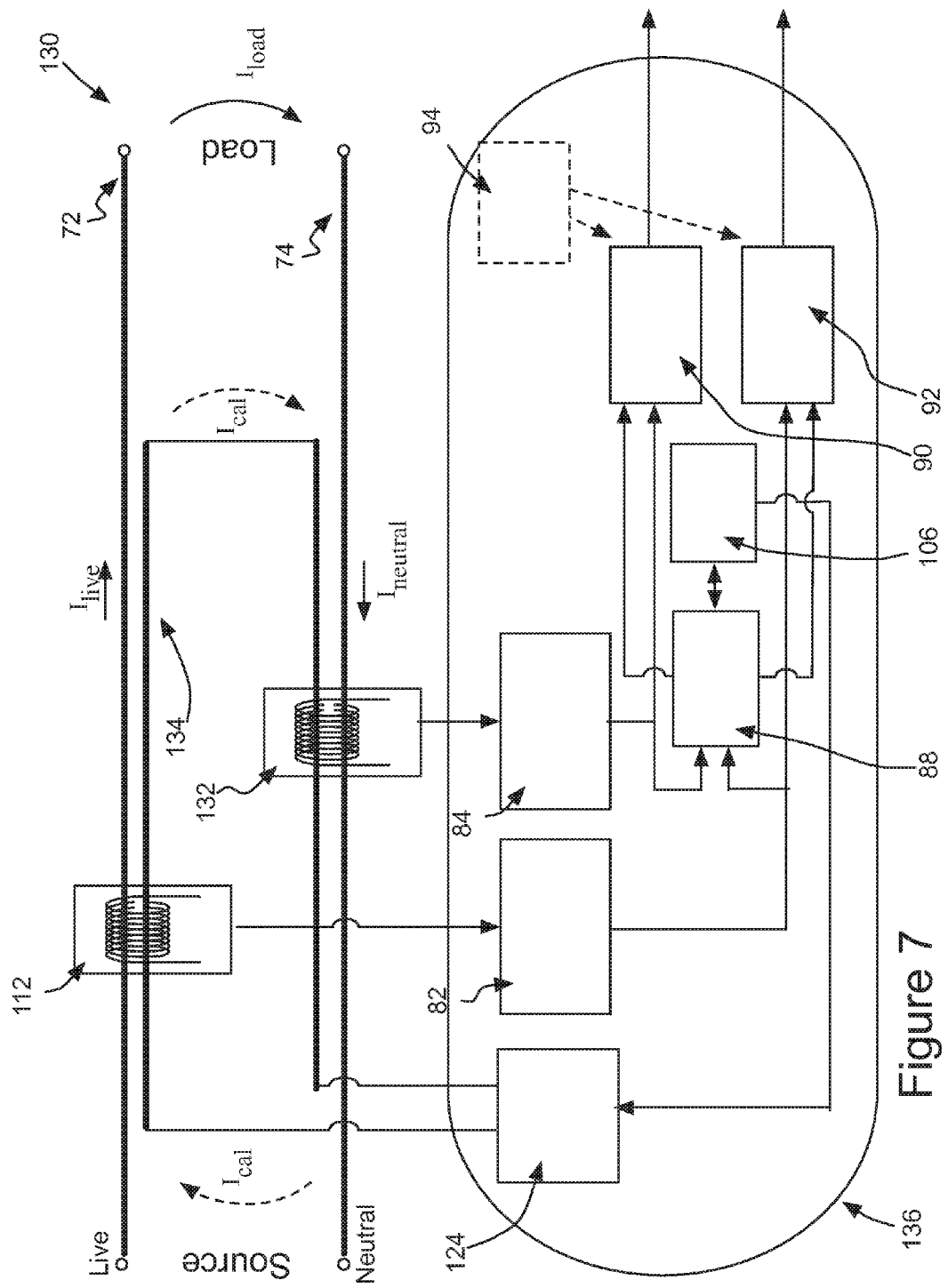
FIG. 7 is a block diagram representation of current measurement apparatus according to a fifth embodiment.

Current measurement apparatus 130 according to a fifth embodiment is shown in FIG. 7. Components in common with the embodiments of FIGS. 3 to 6 are designated by like reference numerals and the reader's attention is directed to the description provided above with reference to FIGS. 3 to 6 for a description of such common components. Components particular to the embodiment of FIG. 7 will now be described. The current measurement apparatus 130 of FIG. 7 comprises a first current transformer 112 instead of the first shunt resistor 76 of FIG. 3 and a second current transformer 132 instead of the second shunt resistor 78 of FIG. 3. In addition the current measurement apparatus 130 of FIG. 7 comprises a calibration conductor 134 which is electrically connected at a first end to a signal output from the calibration source 124, passes through the first and second current transformers 112, 132 in turn before being electrically connected to the return signal terminal of the calibration source 124. A power domain, which is indicated by box 136 in FIG. 7 and which is isolated from the live and neutral conductors, comprises all the data processing circuitry. The calibration source 124 is operative as described above with reference to FIG. 6 to generate a calibration signal. The calibration signal passes through the calibration conductor 134 and thereby induces a corresponding signal in each of the first and second current transformers 112, 132. The correlation detection and correction circuit 88 is operative to extract the parts of the first and second digital signals corresponding to the calibration signal to thereby provide for calibration of the first and second current transformers 112, 132 and their respective processing chains as described above.

Figure 8:
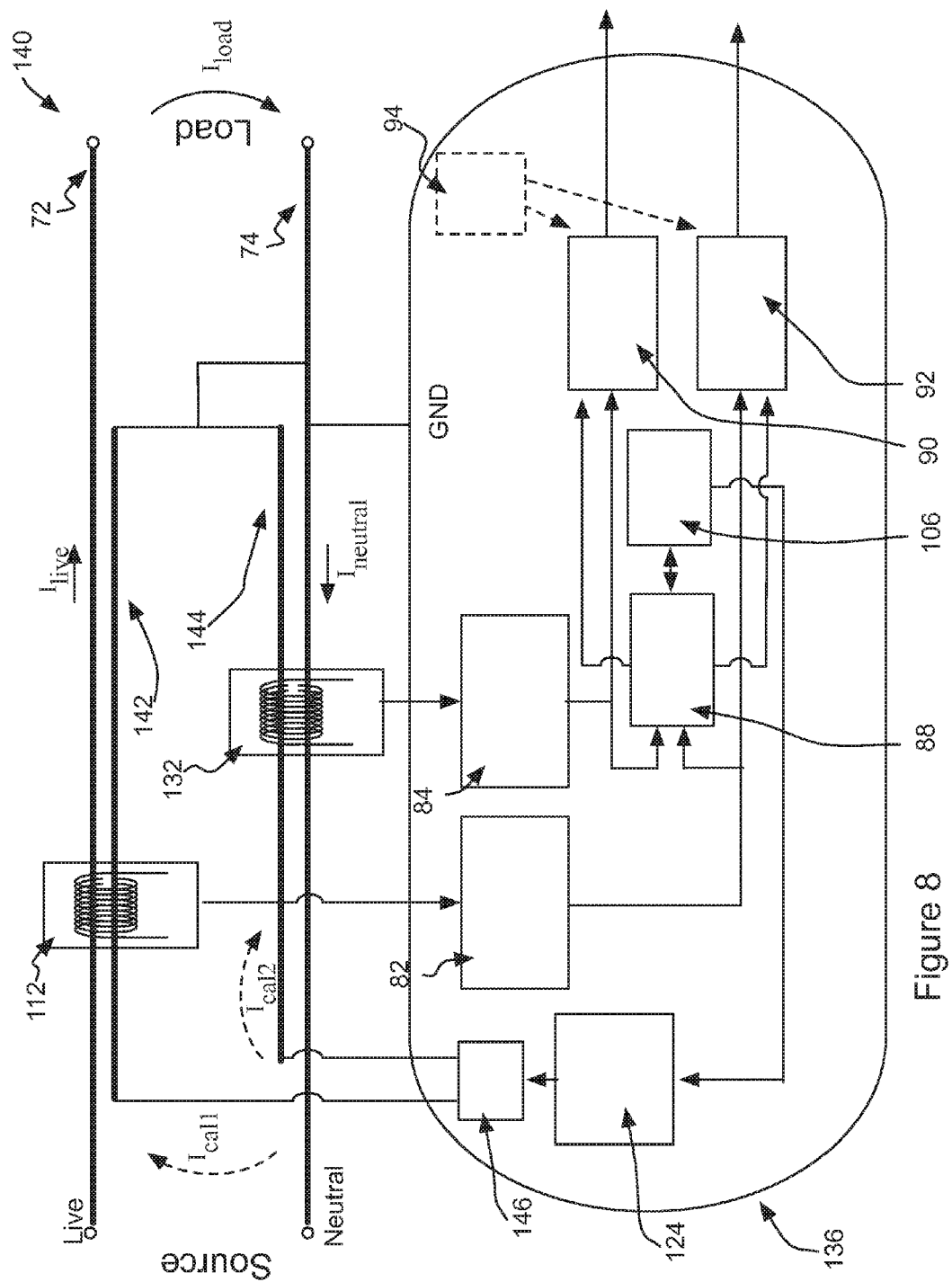
FIG. 8 is a block diagram representation of current measurement apparatus according to a sixth embodiment.

Current measurement apparatus 140 according to a sixth embodiment is shown in FIG. 8. Components in common with the embodiments of FIGS. 3 to 7 are designated by like reference numerals and the reader's attention is directed to the description provided above with reference to FIGS. 3 to 7 for a description of such common components. Components particular to the embodiment of FIG. 8 will now be described. As with the embodiment of FIG. 7 the embodiment of FIG. 8 comprises first and second current transformers 112, 132 which are operative to measure current in the live conductor 72 and the neutral conductor 74 respectively. The current measurement apparatus 140 of FIG. 8 further comprises first calibration conductor 142, a second calibration conductor 144 and a switch/multiplexer circuit 146. An output from the calibration source 124 is received by the switch/multiplexer circuit 146. A first output from the switch/splitter circuit 146 is electrically coupled to the first calibration conductor 142 and a second output from the switch/splitter circuit 146 is electrically coupled to the second calibration conductor 144. The first calibration conductor 142 passes through the first current transformer 112 before being electrically connected to the neutral conductor 74. The second calibration conductor 144 passes through the second current transformer 132 before being electrically connected to the neutral conductor 74. A first calibration signal passing through the first current transformer 112 by way of the first calibration conductor 142 therefore induces a corresponding signal in the first current transformer 112 and a second calibration signal passing through the second current transformer 132 by way of the second calibration conductor 144 therefore induces a corresponding signal in the second current transformer 132. The correlation detection and correction circuit 88 is operative as described above to extract the parts of the first and second digital signals corresponding to the first and second calibration signals and to thereby determine the transfer characteristics of each of the first and second current transformers 112, 132 and their respective processing chains. The calibration characteristics are then determined and stored as described above. The calibration source 124 and the switch/splitter circuit 146 are operative to provide for different approaches to calibration signal generation as follows. According to a first approach the switch/splitter circuit 146 is operative to apply the same form of calibration signal to each of the first and second calibration conductors 142, 144 at the same time. According to a second approach the switch/splitter circuit 146 is operative to apply the same form of calibration signal to each of the first and second calibration conductors 142, 144 in turn. According to a third approach the switch/splitter circuit 146 is operative to apply a different calibration signal to the first and second calibration conductors 142, 144 either at the same time or in turn. Application of different calibration signals may be appropriate where the current transformers have different characteristics, e.g. where the first current transformer is configured for measurement of large amplitude signals and the second current transformer is configured for measurement of small amplitude signals.

Figure 9:
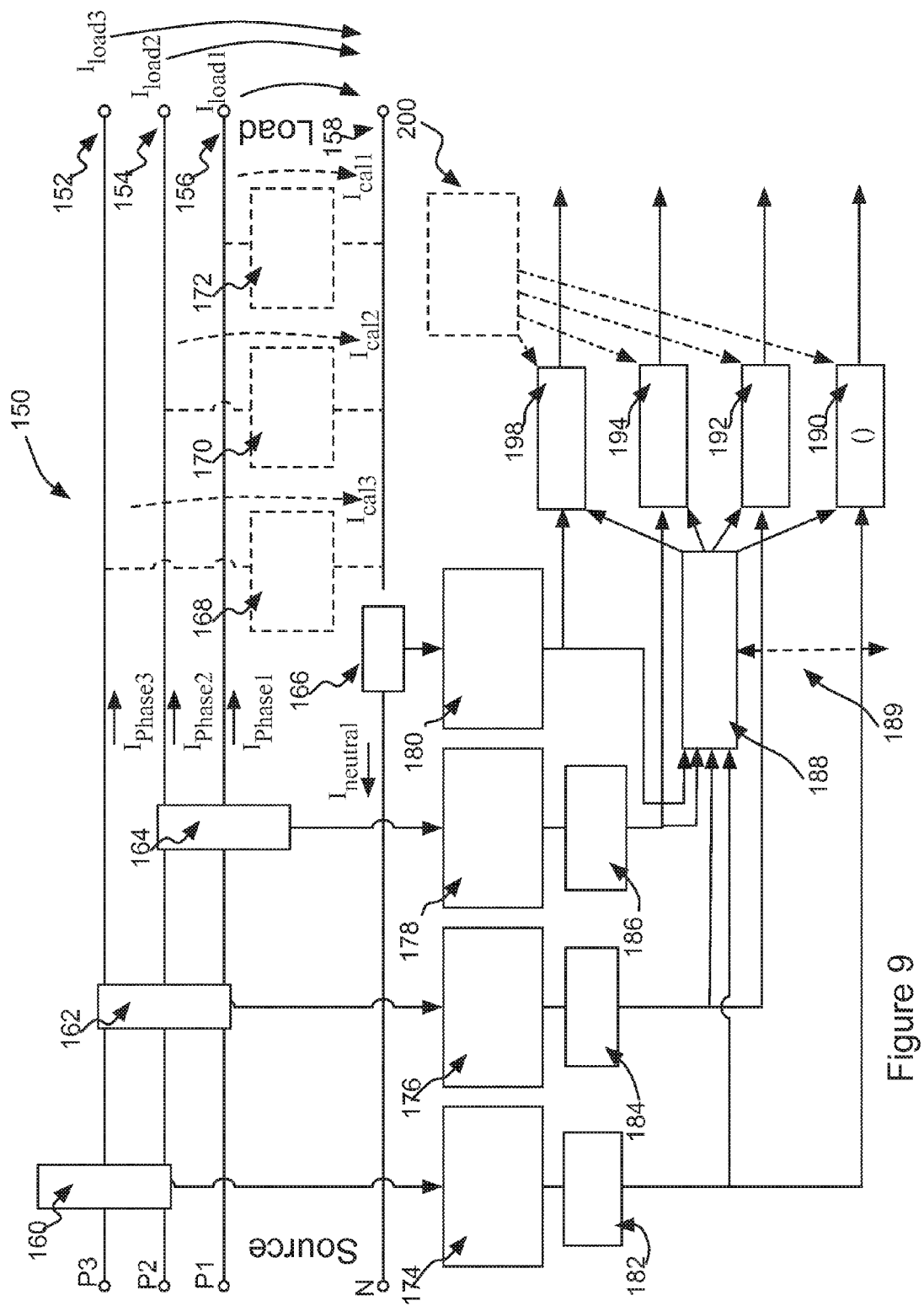
FIG. 9 is a block diagram representation of a three phase current measurement arrangement according to the invention.

A three phase current measurement arrangement 150 according to the invention is shown in FIG. 9. The three phase current measurement arrangement 150 comprises first to third live conductors 152, 154, 156 and a neutral conductor 158 through which electrical power is drawn by a load from a source. First to third shunt resistors 160, 162, 164 are provided in series with a respective one of the first to third live conductors 152, 154, 156 and a fourth shunt resistor 166 is provided in series with the neutral conductor 158. A first calibration source 168 is configured to apply a calibration signal to the first live conductor 152 and the neutral conductor 158. A second calibration source 170 is configured to apply a calibration signal to the second live conductor 154 and the neutral conductor 158. A third calibration source 172 is configured to apply a calibration signal to the third live conductor 156 and the neutral conductor 158. In alternative forms of the current measurement arrangement 150 of FIG. 9 one or more of the shunt resistors may be replaced with a current transformer. Therefore each of the first to third calibration sources 168, 170, 172 is operative to apply calibration signals according to one or more of the approaches described above with reference to FIGS. 4 to 8. The current measurement arrangement 150 of FIG. 9 further comprises first to fourth acquisition circuits 174, 176, 178, 180 which are operative to acquire signals measured by a respective one of the first to fourth shunt resistors 160, 162, 164, 166. Each of the first to fourth acquisition circuits 174, 176, 178, 180 comprises a gain stage and is operative as described above. The current measurement arrangement 150 of FIG. 9 also comprises first to third isolation circuits 182, 184, 186 in series with a respective one of the first to third acquisition circuits 174, 176, 178 and thereby operative to maintain galvanic isolation between and amongst the live conductors and neutral conductor. The current measurement arrangement 150 of FIG. 9 further comprises: a correlation detection and correction circuit 188, which receives an input from each of the first to fourth acquisition circuits 174, 176, 178, 180; and first to fourth processing circuits 190, 192, 194, 198 which each receive an input from the correlation detection and correction circuit 188 and a respective input from the first to fourth acquisition circuits 174, 176, 178, 180. The correlation detection and correction circuit 188 has a control input 189 which provides for input of control data and deterministic calibration signal data. In addition the current measurement arrangement 150 of FIG. 9 comprises non-volatile memory 200 which is operative to store data used in calibration and in other signal processing operations. The correlation detection and correction circuit 188, the first to fourth processing circuits 190, 192, 194, 198 and the non-volatile memory 200 are operative to provide for calibration, alignment and normalisation of measurements made by the first to fourth shunt resistors 160, 162, 164, 166 as described above with reference to FIG. 3. Digital signals generated by the first to fourth processing circuits 190, 192, 194, 198 are used in subsequent computations and operations as described below with reference to FIGS. 10 to 13.

Figure 10:
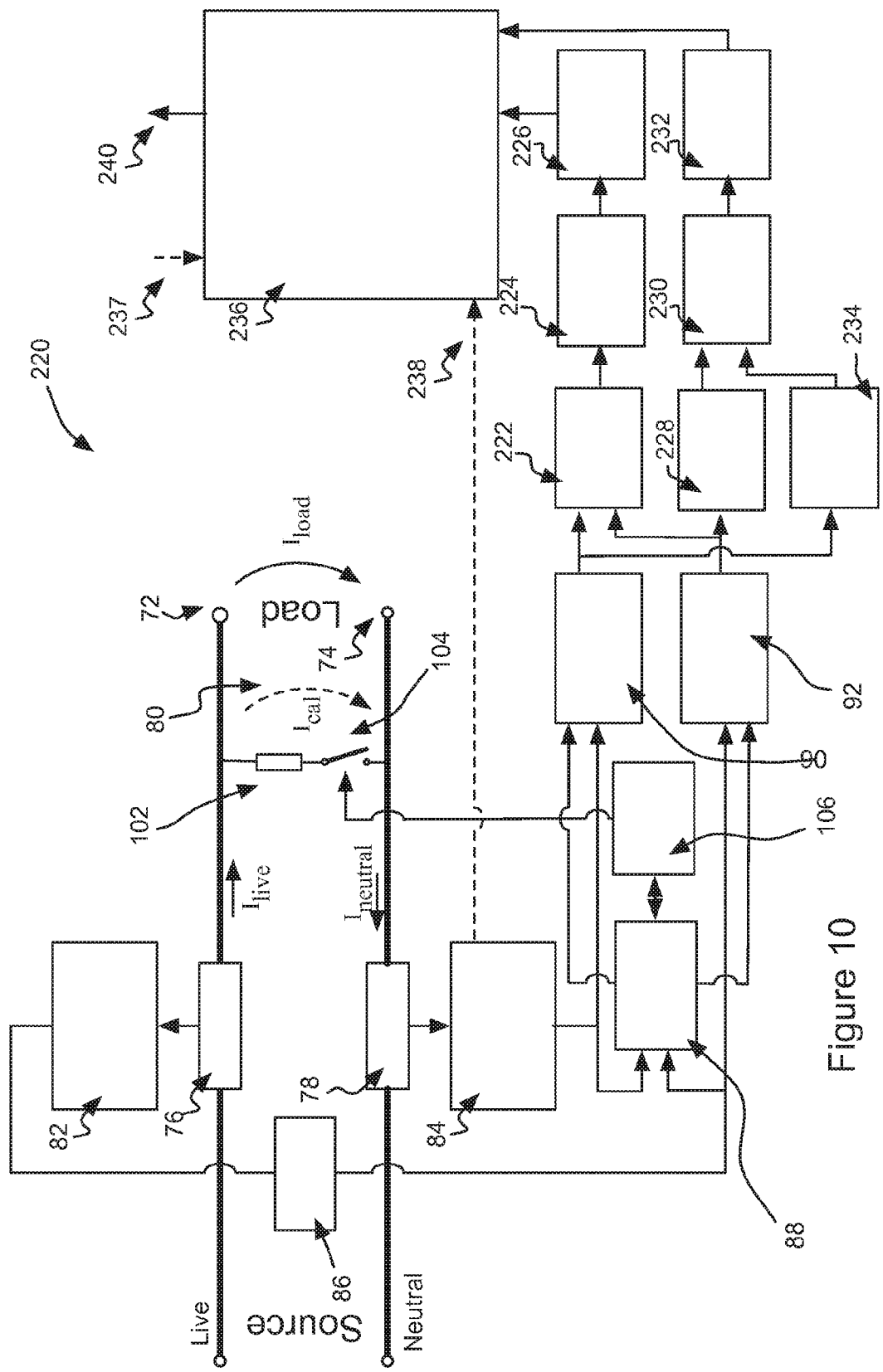
FIG. 10 is a block diagram representation of current measurement apparatus according to a seventh embodiment.

Current measurement apparatus 220 according to a seventh embodiment is shown in FIG. 10. Components in common with the embodiment of FIG. 4 are designated by like reference numerals and the reader's attention is directed to the description provided above with reference to FIG. 4 for a description of such common components. Although the embodiment of FIG. 10 comprises the two shunt resistors and the calibration source arrangement of the embodiment of FIG. 4 the arrangements of current measurement device and calibration source comprised in the embodiments of FIGS. 5 to 8 may be used instead. Components particular to the embodiment of FIG. 10 will now be described. The current measurement apparatus 220 of FIG. 10 comprises a differencing circuit 222, which receives an input from each of the first and second processing circuits 90, 92, a ground fault response filter 224, which receives an input from the differencing circuit 222, and a ground fault determination circuit 226, which receives an input from the ground fault response filter 224. The current measurement apparatus 220 of FIG. 10 also comprises a first arc waveform detector 228, which receives an input from the second processing circuit 92, an arc fault filter circuit 230, which receives an input from the first arc waveform detector 228, and an arc fault determination circuit 232, which receives an input from the arc fault filter circuit 230. The current measurement apparatus 220 of FIG. 10 further comprises a second arc waveform detector 234, which receives an input from the first processing circuit 90, with an output from the second arc waveform detector 234 being received for processing by the arc fault filter circuit 230 and for further processing thereafter by the arc fault determination circuit 232. In addition current measurement apparatus 220 of FIG. 10 comprises an event categoriser and generator circuit 236, which receives an input from each of the ground fault determination circuit 226 and the arc fault determination circuit 232 and also from the second acquisition circuit 84. Absolute measurements received from the second acquisition circuit 84 are used by the event categoriser and generator circuit 236 to determine whether or not a response should be generated or to determine if measurements and derived measurements should be stored or subject to analysis. The event categoriser and generator circuit 236 comprises reset 237 and configuration control inputs 238. Components particular to FIG. 10 are comprised in digital signal processing circuitry. Furthermore the event categoriser and generator circuit 236 generates output signals 240 for control of circuit breakers, communications circuitry, data storage and a display unit (not shown).

Operation of the current measurement apparatus 220 of FIG. 10 will now be described. The differencing circuit 222 is operative on the first and second digital signals received from the first and second processing circuits 90, 92 to determine the difference between the two received signals and to generate a digital difference signal, which corresponds to the difference between the absolute current signals in the live and neutral conductors 72, 74. As described above the difference between the current signals in the live and neutral conductors is indicative of current leakage as may be caused by a ground fault. The ground fault response filter 224 comprises a band pass filter, which is operative on the received digital difference signal to filter out: higher frequency signals, such as arc signals and other signals characteristic of normal circuit operation, such as load switching, or high frequency noise; and low frequency noise and any dc offset, which might be present. The ground fault determination circuit 226 is operative to compare the filtered digital difference signal with a predetermined threshold leakage value, such as 30 mA, and to generate an output if the filtered digital difference signal exceeds the threshold leakage value for a predetermined period of time, such as 100 mS. In another form the ground fault determination circuit 226 is operative to compare the amplitude over time with a function which lies within a safe limit of leakage current as determined by a regulatory body, such as the National Electrical Manufacturers Association (NEMA). For example the function may lie within the maximum non-linear current versus time curve specified by UL for Class A GFCIs but not set such a low limit of leakage current as typical Class A GFCIs to thereby reduce the likelihood of false or unwarranted ground fault detection.

The first arc waveform detector 228 comprises a band pass filter which is operative on the second digital signal to filter out non-characteristic high frequency transients, which might for example be caused by load switching, or high frequency noise and low frequency signals, which might for example be caused by leakage current or normal circuit operation, such as mains frequency components. The first arc waveform detector 228 is also operative to analyse the second digital signal to identify candidate waveform profiles which might be indicative of an arcing condition. More specifically the first arc waveform detector 228 looks for characteristic waveform profiles in the second digital signal on an ongoing basis and saves portions of the second digital signal which meet the analytical criteria. The candidate waveform profiles are conveyed to the arc fault filter circuit 230, which is operative to compare each received candidate waveform profile with a library of waveform profiles, which are characteristic of arcing behaviour and of non-arcing behaviour. Candidate waveform profiles which are determined to be indicative of arcing behaviour are conveyed to the arc fault determination circuit 232. The arc fault determination circuit 232 is operative on each received candidate waveform profile to compare the peak RMS current of the waveform with a threshold series arc value, such as 5 Amps. If the peak RMS current exceeds the threshold series arc value the arc fault determination circuit 232 is operative to generate a series arc fault detection output. A series arc fault detection output is indicative of a series arc fault between live and ground.

The second arc waveform detector 234 comprises a band pass filter which is operative on the first digital signal to filter out non-characteristic high frequency transients in the same fashion as the first arc waveform detector 228. The second arc waveform detector 234 is also operative in the same fashion as the first arc waveform detector 228 to analyse the first digital signal to identify candidate waveform profiles which might be indicative of an arcing condition. The candidate waveform profiles are conveyed to the arc fault filter circuit 230, which is operative as described above. The arc fault determination circuit 232 is operative on candidate waveform profiles received from the arc fault filter circuit 230 to compare the peak RMS current of the each waveform with a threshold series arc value, such as 5 Amps. As described above if the peak RMS current exceeds the threshold series arc value the arc fault determination circuit 232 is operative to generate a series arc fault detection output. A series arc fault detection output generated in dependence on a first digital signal from the first processing circuit 90 is indicative of a series arc fault between neutral and ground.

The arc fault filter circuit 230 is also operative to detect parallel arc faults. More specifically a first candidate waveform profile, which is received from the first processing circuit 90, and a second candidate waveform profile, which is received from the second processing circuit 92, which are of corresponding shape and which occur within a predetermined time of each other are identified by the arc fault filter circuit 230 as being indicative of a parallel arc fault between the live and neutral conductors 72, 74. The predetermined time of occurrence of the first and second candidate waveform profiles is set to take account of circuit conditions, i.e. a likely time for arcing event on the live conductor to propagate to the neutral conductor. One of the first and second candidate waveforms is conveyed to the arc fault determination circuit 232 along with data identifying the candidate waveform as being indicative of a possible parallel arc fault. The arc fault determination circuit 232 is operative to compare the peak RMS current of the received candidate waveform with a threshold parallel arc value, such as 75 Amps. If the peak RMS current exceeds the threshold parallel arc value the arc fault determination circuit 232 is operative to generate a parallel arc fault detection output. A parallel arc fault detection output is indicative of a parallel arc fault between live and neutral.

The event categoriser and generator circuit 236 receives the data signals described above which indicate the occurrence of a ground fault, a series arc fault on the live conductor, a series arc fault on the neutral conductor and a parallel arc fault between the live and neutral conductors. The event categoriser and generator circuit 236 is operative to respond in one or more different fashions in dependence on receipt of the data signals. One response involves the event categoriser and generator circuit 236 generating a circuit breaker control signal which is operative to actuate a circuit breaker to break the live and neutral conductors and thereby stop the fault condition. Another response involves the event categoriser and generator circuit 236 controlling a local display device to indicate a status change of the current measurement apparatus 220, such as the detection of one or more faults, operation of a circuit breaker, operation of a reset procedure and the like. A further response involves the event categoriser and generator circuit 236 conveying data to a remote location, such as a data processing centre, by way of wired or wireless communications circuitry. A yet further response involves the event categoriser and generator circuit 236 storing data in local data storage, e.g. for later analysis and comparison with later determined data or later communication to a remote location. The event categoriser and generator circuit 236 is also configured to receive an input from the second acquisition circuit 84, which is operative to provide a digital signal corresponding to the current signal present on the neutral conductor. The input from the second acquisition circuit 84 provides the event categoriser and generator circuit 236 with absolute current data representing the absolute level of current flowing in the neutral conductor. The event categoriser and generator circuit 236 is operative to analyse the absolute current data and to determine circuit conditions and make decisions as to how to respond to data signals received from the ground fault determination circuit 226 and the arc fault determination circuit 232. For example analysis of the absolute current data may determine that the loading conditions have changed, e.g. on account of addition of a new load or change in operation of an existing load, which causes a peak in current drawn by the load. The event categoriser and generator circuit 236 is operative in dependence on such a determination to re-categorise a fault condition, such as a series arc fault on the neutral conductor, as non-dangerous with no action or delayed action being taken by the event categoriser and generator circuit 236, e.g. in respect of operation of a circuit breaker. Operation of the reset input of the event categoriser and generator circuit 236 causes the event categoriser and generator circuit 236 to carry out a reset procedure. The reset input may be operated manually, e.g. by pressing of a reset button, or remotely, e.g. by sending of a reset signal from a control centre. The configuration control input of the event categoriser and generator circuit 236 is used for one or more of various purposes including the configuration of the current measurement apparatus 220 to carry out a subset of the above described fault condition detection operations, changing the operation of the current measurement apparatus, e.g. in respect of the threshold values used during fault detection, firmware updates and the like. Certain of such purposes are described further below.

Figure 11:
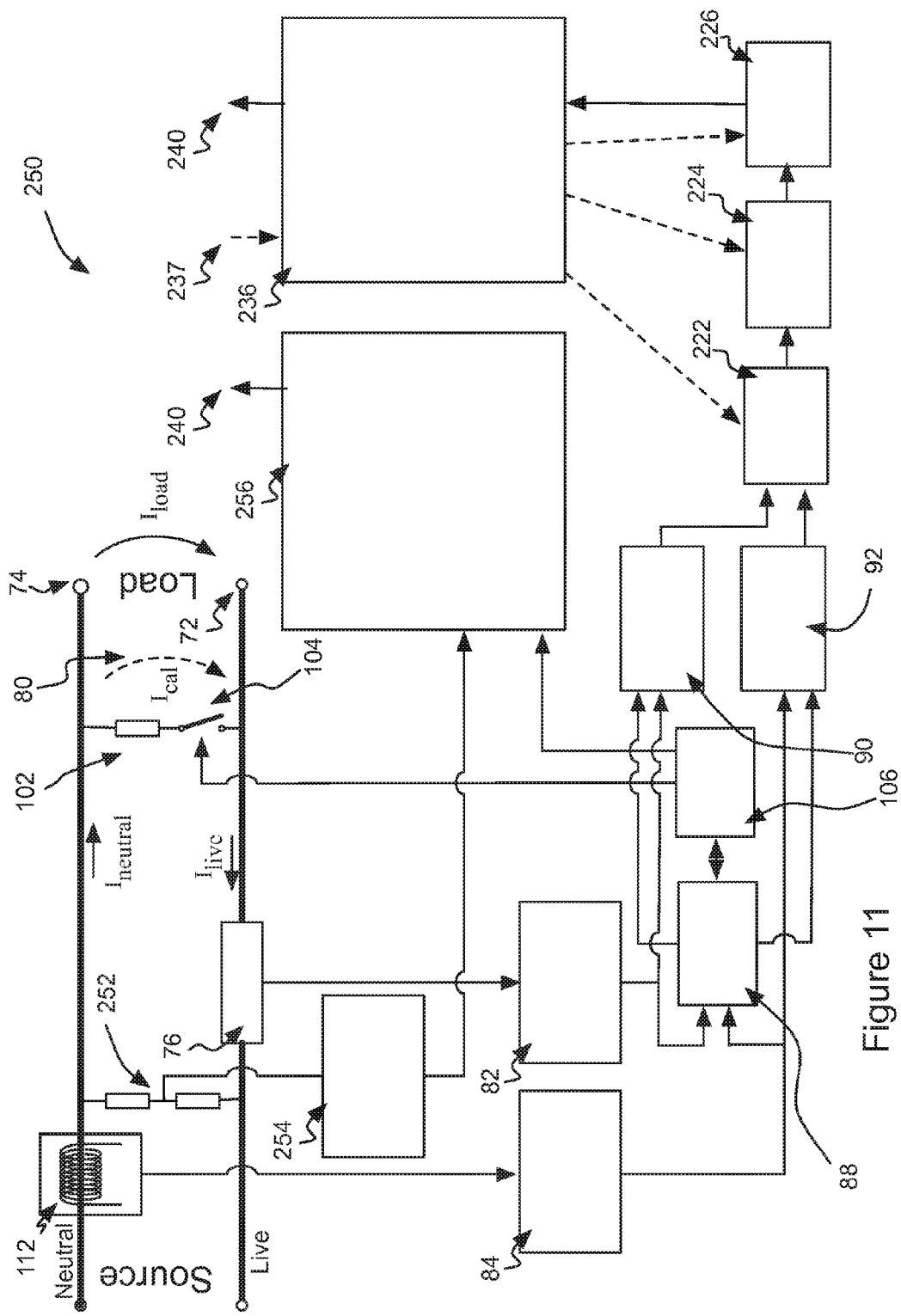
FIG. 11 is block diagram representation of current measurement apparatus according to an eighth embodiment.

An eighth embodiment of current measurement apparatus 250 is shown in FIG. 11. Components in common with the embodiments of FIGS. 5 and 10 are designated by like reference numerals and the reader's attention is directed to the description provided above with reference to FIGS. 5 and 10 for a description of such common components. Components particular to the embodiment of FIG. 11 will now be described. The current transformer 112 and the shunt resistor 78 of the embodiment of FIG. 4 are exchanged. The current measurement apparatus 250 comprises a potential divider 252 comprising series connected resistors connected between the live and neutral conductors 72, 74, which provide an attenuated voltage signal which corresponds to the voltage signal between the live and neutral conductors 72, 74. The current measurement apparatus 250 further comprises a third acquisition circuit 254, which comprises a gain stage and an analogue to digital converter, which is operative to generate a third digital signal that corresponds to the voltage signal between the live and neutral conductors. The current measurement apparatus 250 also comprises a power measurement circuit 256, which receives the third digital signal and the first digital signal. The power measurement circuit 256 therefore receives a digital signal corresponding to the voltage signal between the live and neutral conductors and the current signal in the live conductor. The power measurement circuit 256 is operative to determine power consumption on the basis of the first and third digital signals. The power measurement circuit 256 is thereafter operative in one or more fashions. According to one approach the power measurement circuit 256 is operative to display the determined power consumption data on a display unit. According to another approach the power measurement circuit 256 is operative by way of the communications circuitry to convey the determined power consumption data to a to remote location, such as a control centre, by wireless or wired means. According to a further approach the power measurement circuit 256 is operative to store the determined power consumption data in local data storage, e.g. for later analysis and comparison with later determined data or later communication to a remote location.

The event categoriser and generator circuit 236 of the embodiment of FIG. 11 is configured to perform functions further to those described above with reference to the embodiment of FIG. 10. There are three different categories of function, namely parameter change, programmability and learning. Before describing such further functions the configuration of the current measurement apparatus 250 of FIG. 11 will now be considered further. As can be seen from FIG. 11 the current measurement apparatus 250 is configured for ground fault detection but lacks the capability to perform series and parallel arc fault detection. Therefore the current measurement apparatus 250 comprises a differencing circuit 222, which receives an input from each of the first and second processing circuits 90, 92, a ground fault response filter 224, which receives an input from the differencing circuit 222, and a ground fault determination circuit 226, which receives an input from the ground fault response filter 224. The operation of the differencing circuit 222, the ground fault response filter 224 and the ground fault determination circuit 226 are as described above with reference to FIG. 10 with these components being further configured and operable as follows.

The first category of function is parameter change. This category of function involves changing parameters used by the current measurement apparatus 250 in detecting particular fault conditions and making particular measurements. More specifically one or more of the following parameters are changeable. With regards to the differencing circuit 222 an accuracy to which the difference between the first and second digital signals is determined is changeable and a frequency of determination of the difference is changeable. With regards to the ground fault response filter 224 the cut off frequency of the low pass filter is changeable. With regards to the ground fault determination circuit 226 the predetermined threshold leakage value and the predetermined period of time are changeable. For example where the ground fault determination circuit 226 is configured to perform a Class A GFCI function with a predetermined threshold leakage value of 4 to 6 mA RMS the predetermined threshold leakage value may be changed to 20 mA RMS to perform an RCD function that meets European regulations. Where the current measurement apparatus is configured for over current detection as described below with reference to FIG. 12 an over current threshold value is changeable, e.g. amongst 5 Amps RMS, 15 Amps RMS and 30 Amps RMS. Similarly parameters used in series and parallel arc fault detection are changeable.

The second category of function is programmability. This category of function involves the configuration of the current measurement apparatus 250 being changed to effect different combinations of measurements and fault condition detection operations or to effect a change in a fault condition detection or measurement procedure. A change of configuration is effected by way of the configuration control input to the event categoriser and generator circuit 236. In one form the configuration control input is constituted in a form suitable for manual change, e.g. the configuration control input may be in the form of DIP switches. In another form the configuration control input is constituted as a communications port to which a local Personal Computer (PC) or the like is connected with the PC being operative to change the configuration by way of the communications port. In yet another form the configuration control input is constituted as a communication link to a remote location, such as a control centre, which is operative to change the configuration by way of the communication link. The configuration is changeable at deployment of the current measurement apparatus to configure the current measurement apparatus for a particular application. The configuration is also changeable after deployment, e.g. locally by way of the communications port or remotely by way of the communications link, to take account of changing usage requirements or a change in regulatory requirements. The configuration is changeable in one or more of the following fashions. Although not shown in FIG. 11 the current measurement apparatus comprises when in a different form the arc fault detection capabilities of the embodiment of FIG. 10 and also an over current detection capability as described below with reference to FIG. 12. The current measurement apparatus 250 is configured to enable different combinations of function. For example and according to a first configuration the current measurement apparatus is operative to measure current for metering purposes and to detect ground faults. According to a second example configuration the current measurement apparatus is operative to measure current for metering purposes and to detect series arc faults from live and neutral. According to a third example configuration the current measurement apparatus is operative to measure current for metering purposes, to detect ground faults and to detect parallel arc faults. In addition the configuration is changeable with regards to how the current measurement apparatus is operative to carry out a particular function. For example a process for determining a fault condition is changed to take account of a hitherto unused measurement, such as fresh use of a voltage signal in parallel arc fault detection.

The third category of function is learning. This category of function involves the current measurement apparatus 250 changing its configuration, changing how a particular function is performed or changing a parameter used in a function, with a change being effected in dependence on measurements made or fault conditions detected by the current measurement apparatus 250. Thus the current measurement apparatus is operative to change its configuration of itself and without instigation from an outside agent. For example if the current measurement apparatus is operative to determine that a particular arc event is detected only when a new load is connected to the live and neutral conductors the current measurement apparatus adapts its categorisation process to categorise the particular arc event as non-dangerous. Alternatively the current measurement apparatus changes the threshold arc value parameter to make the current measurement apparatus less liable to detect the particular arc event.

Figure 12:
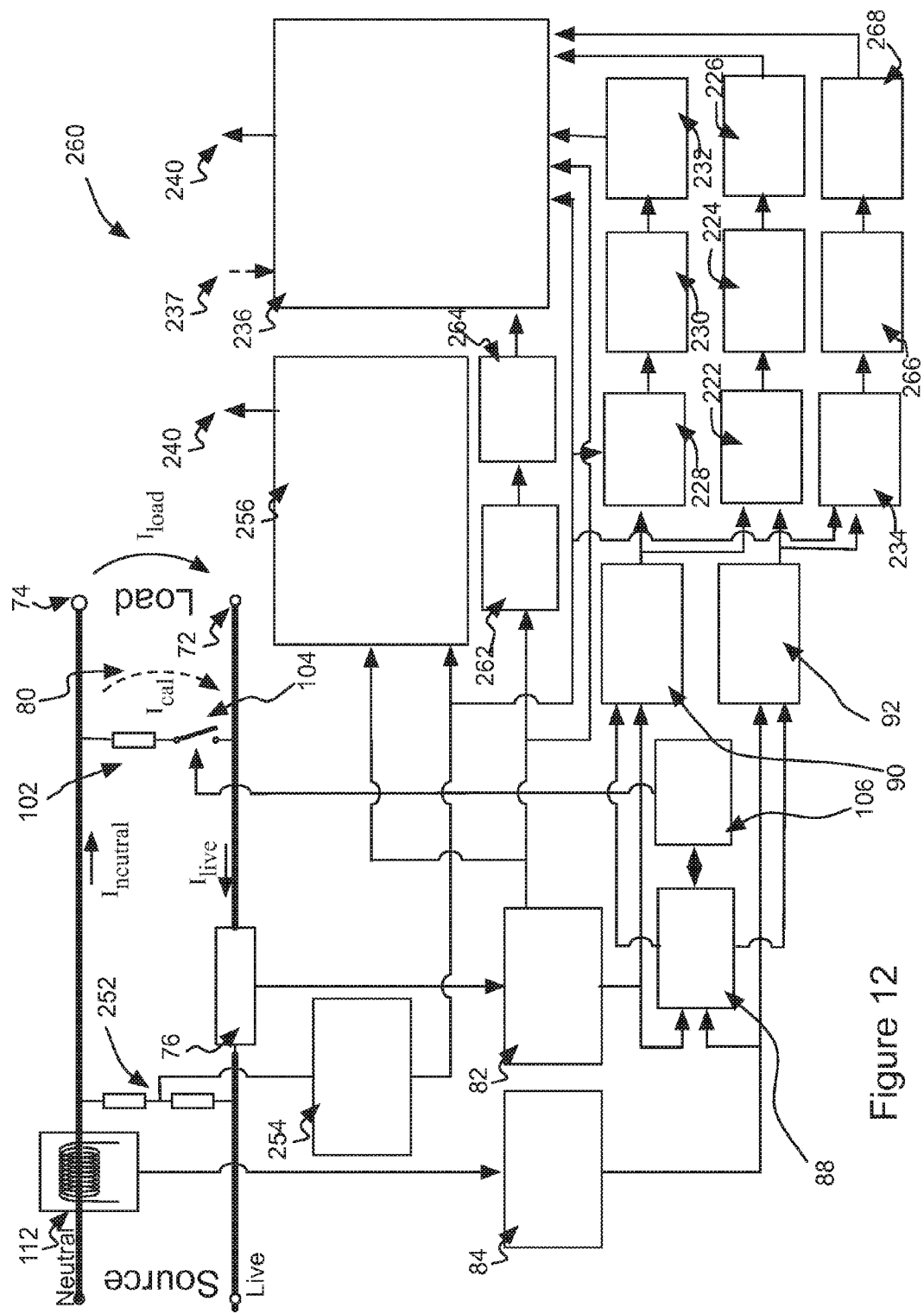
FIG. 12 is a block diagram representation of current measurement apparatus according to a ninth embodiment.

A ninth embodiment of current measurement apparatus 260 is shown in FIG. 12. Components in common with the embodiment of FIGS. 10 and 11 are designated by like reference numerals and the reader's attention is directed to the description provided above with reference to FIGS. 10 and 11 for a description of such common components. Components particular to the embodiment of FIG. 12 will now be described. The current measurement apparatus 260 comprises an over current filter 262, which receives an input from the first acquisition circuit 82, and an over current detector 264, which receives an input from the over current filter 262. The over current detector 264 generates an output which is received by the event categoriser and generator circuit 236. The current measurement apparatus 260 also comprises a second arc fault filter circuit 266, which receives an input from the second arc waveform detector 234, and a second arc fault determination circuit 268, which receives an input from the second arc fault filter circuit 266. In common with the embodiment of FIG. 10 the embodiment of FIG. 12 is operative to detect series arc faults from each of live and neutral. However the embodiment of FIG. 12 provides for different forms of parallel arc fault detection. A series live arc is detected by the first arc waveform detector 228, the first arc fault filter circuit 230, and the first arc fault determination circuit 232. A series neutral arc is detected by the second arc waveform detector 234, the second arc fault filter circuit 266 and the second arc fault determination circuit 268. In the embodiment of FIG. 10 a single arc fault filter circuit 230 and a single arc fault determination circuit 232 are operative to detect series and parallel arcing events.

According to one form of parallel arc fault detection the amplitude and timing of the waveforms measured in the current transformer 112 and the shunt resistor 76 are analysed to detect an arcing event which progresses through one of the live and neutral conductors and returns through the other of the live and neutral conductors. According to another form of parallel arc fault detection the characteristics of the first and second arc fault filter circuits 230, 266 are changed, e.g. in respect of their threshold values, to take account of the increased levels of peak current seen in parallel arcs compared with series arcs. In addition the voltage signal measured between the live and neutral conductors is analysed with a peak present in the voltage signal waveform being indicative of an arcing event.

The over current filter 262 of FIG. 12 is operative to receive a digital signal from the first acquisition circuit 82, the digital signal corresponding to the current signal flowing through the live conductor. The over current filter 262 comprises a band pass filter which is operative to filter low frequency signals, such as a mains frequency component, and high frequency signals, such as transients and noise. The over current detector 264 receives the filtered digital signal and compares the received digital signal with an over current threshold value, such as 15 Amps RMS, If the received digital signal exceeds the over current threshold value an over current detect data is generated and conveyed to the event categoriser and generator circuit 236. The event categoriser and generator circuit 236 is operative in dependence on the over current detect data to one or more of: operate a circuit breaker, provide an indication on a display device, convey the data by way of a communications link and store the data in local data storage.

Further to the functions described above the event categoriser and generator circuit 236 of the embodiment of FIG. 12 is operative as follows. The event categoriser and generator circuit 236 is operative to upon receipt of plural fault condition data to make a decision as to how to respond based on the types of fault detected. For example if ground and arc faults are detected the event categoriser and generator circuit 236 is operative to disregard the arc fault and operate a circuit breaker in accordance with ground fault requirements in respect of promptness of response. Alternatively if a series arc fault and a parallel arc fault are detected the event categoriser and generator circuit 236 is operative to operate a circuit breaker in dependence on the series arc fault, to store data relating to both faults and to report both arc faults to the remote location. The event categoriser and generator circuit 236 is also operative to provide for interaction between and amongst outputs from the power measurement circuit 256, the current detector 264 and the fault detector circuits. For example if the power measurement circuit 256 is operative to measure a sudden increase in power consumption a parallel arc fault may be disregarded if the arc is of no undue magnitude. Alternatively if an over current event and a series arc fault are detected precedence is given to the over current event with regards to how the event categoriser and generator circuit 236 responds by operation of a circuit breaker and indication and reporting of the faults.

Figure 13:
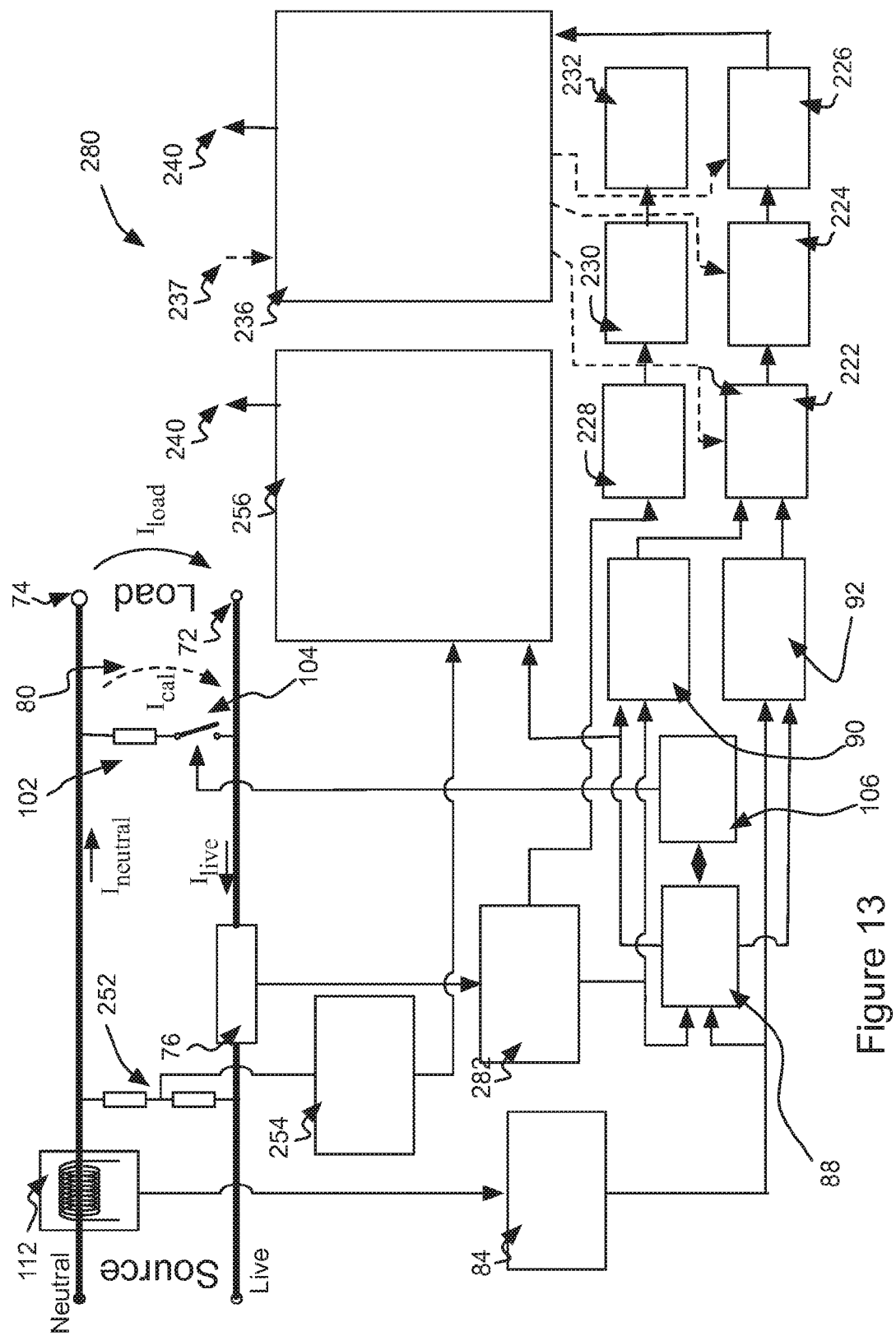
FIG. 13 is a block diagram representation of current measurement apparatus according to a tenth embodiment.

A tenth embodiment of current measurement apparatus 280 is shown in FIG. 13. Components in common with the embodiment of FIGS. 10 and 11 are designated by like reference numerals and the reader's attention is directed to the description provided above with reference to FIGS. 10 and 11 for a description of such common components. Components particular to the embodiment of FIG. 13 will now be described. Instead of the first data acquisition circuit 82 of FIGS. 10 and 11 the embodiment of FIG. 13 comprises a first data acquisition circuit 282 which is operative to generate one digital signal which is provided to the correlation detection and correction circuit 88 as described elsewhere and another digital signal which is provided to the first arc waveform detector 228. Hence the arc detection circuitry of the embodiment of FIG. 13 is operative on digitals signals received directly from the first data acquisition circuit 282 instead of from the first processing circuit 90. Otherwise the operation of the arc detection circuitry and the current measurement apparatus 280 is as described above.

The embodiments of FIGS. 10 to 13 can be applied in a three phase arrangement. More specifically the outputs from the measurement devices which are operative to measure the current in the three live conductors and the neutral conductor are aggregated to determine the difference between the sum of the currents flowing in the live conductors and the current returning through the neutral conductor. Three voltage measuring potential dividers are operative to measure the voltage signal present between a respective one of the three live conductors and the neutral conductor. Faults on each phase can thereby be determined.

Figure 14:
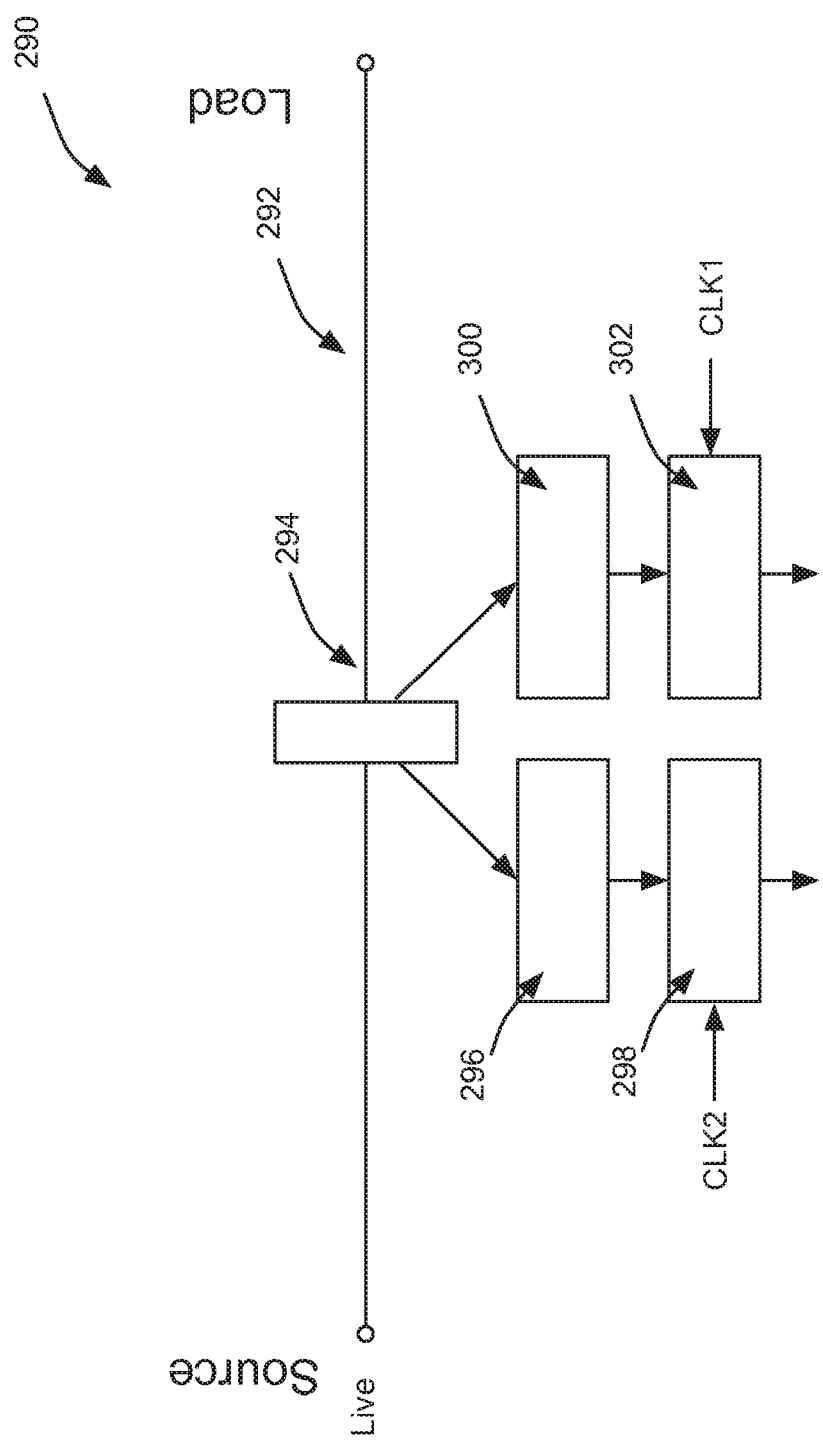
FIG. 14 is a block diagram representation of a first embodiment of measuring circuit having plural dynamic ranges.

A measuring circuit 290 having plural dynamic ranges according to a first embodiment is shown in FIG. 14. The measuring circuit 290 comprises a live conductor 292 in which a shunt resistor 294 is connected in series. A first gain stage 296 receives an output from the shunt resistor 294. A first analogue to digital converter 298 receives an output from the first gain stage 296. A second gain stage 300 receives an output from the shunt resistor 294. A second analogue to digital converter 302 receives an output from the second gain stage 300. The first measurement chain comprising the first gain stage and analogue to digital converter 296, 298 are configured for large signal measurement, e.g. for the purpose of arc fault detection. The second measurement chain comprising the second gain stage and analogue to digital converter 300, 302 are configured for small signal measurement, e.g. for the purposes of ground fault detection and current measurement for metering purposes. Therefore the two measurement chains are configured to be operative in different dynamic ranges. More specifically the first gain stage 296 and the first analogue to digital converter 298 are configured to be operative in a small dynamic range, such as 0 to 5 Amps RMS and the second gain stage 300 and the second analogue to digital converter 302 are configured to be operative in a large dynamic range, such as 0 to 100 Amps RMS. Furthermore the first and second analogue to digital converters 296, 302 are clocked at different frequencies. More specifically the first analogue to digital converter 296 is operative at a high frequency sufficient to acquire a fast arcing event and the second analogue to digital converter 302 is operative at a low frequency sufficient to acquire slower ground fault events. The measuring circuit 290 of FIG. 14 is applied in the current measurement apparatus described above with reference to FIGS. 3 to 13.

Figure 15:
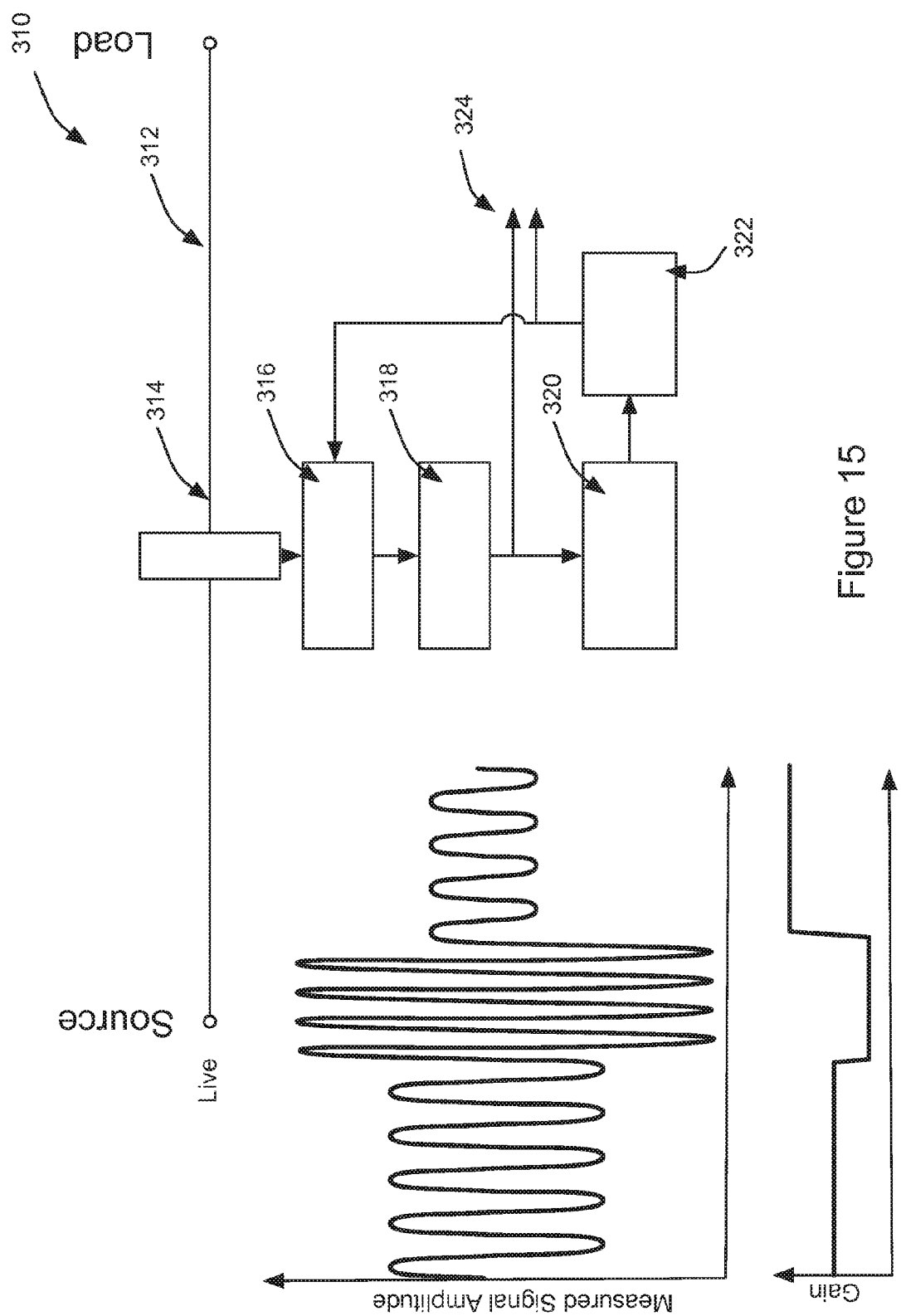
FIG. 15 is a block diagram representation of a second embodiment of measuring circuit having plural dynamic ranges.

A measuring circuit 310 having plural dynamic ranges according to a second embodiment is shown in FIG. 15. The measuring circuit 310 comprises a live conductor 312 in which a shunt resistor 314 is connected in series. An adjustable gain stage 316 receives an output from the shunt resistor 314. An analogue to digital converter 318 receives an output from the adjustable gain stage 316. A range detector circuit 320 receives an output from the analogue to digital converter 318 and provides an input to a gain selector 322. A data output from the analogue to digital converter 318 and a gain value output from the gain selector 322 are used to determine a compromise with regards to measured values between resolution and dynamic range. The measuring circuit 310 is operative as follows. During measurement of voltage signals developed across the shunt resistor 314 the range detector 320 is operative to determine which one of plural ranges the digital signal output from the analogue to digital converter 318 falls within, e.g. within a 0 to 5 Amp RMS range or a 0 to 100 Amp RMS range. The gain selector 322 is operative in dependence on the range determination to select a gain for the adjustable gain stage 316. If the range determination registers no change in range there is no change to the gain of the adjustable gain stage 316. If the range determination registers an increase or decrease in range the gain selector is operative to respectively reduce or increase the gain of the adjustable gain stage 316. Thus the measuring circuit 310 of FIG. 15 is operative to accommodate changes in dynamic range of a current signal flowing through the live conductor 312. The two graphs in FIG. 15 show the change in gain in response to changes in the amplitude of the measured signal. The measuring circuit 310 of FIG. 15 is applied in the current measurement apparatus described above with reference to FIGS. 3 to 13. More specifically outputs 324 from the analogue to digital converter 318 and gain selector 322 are provided to the processing circuitry of the current measurement apparatus for control of dynamic range versus precision.

Figure 16:
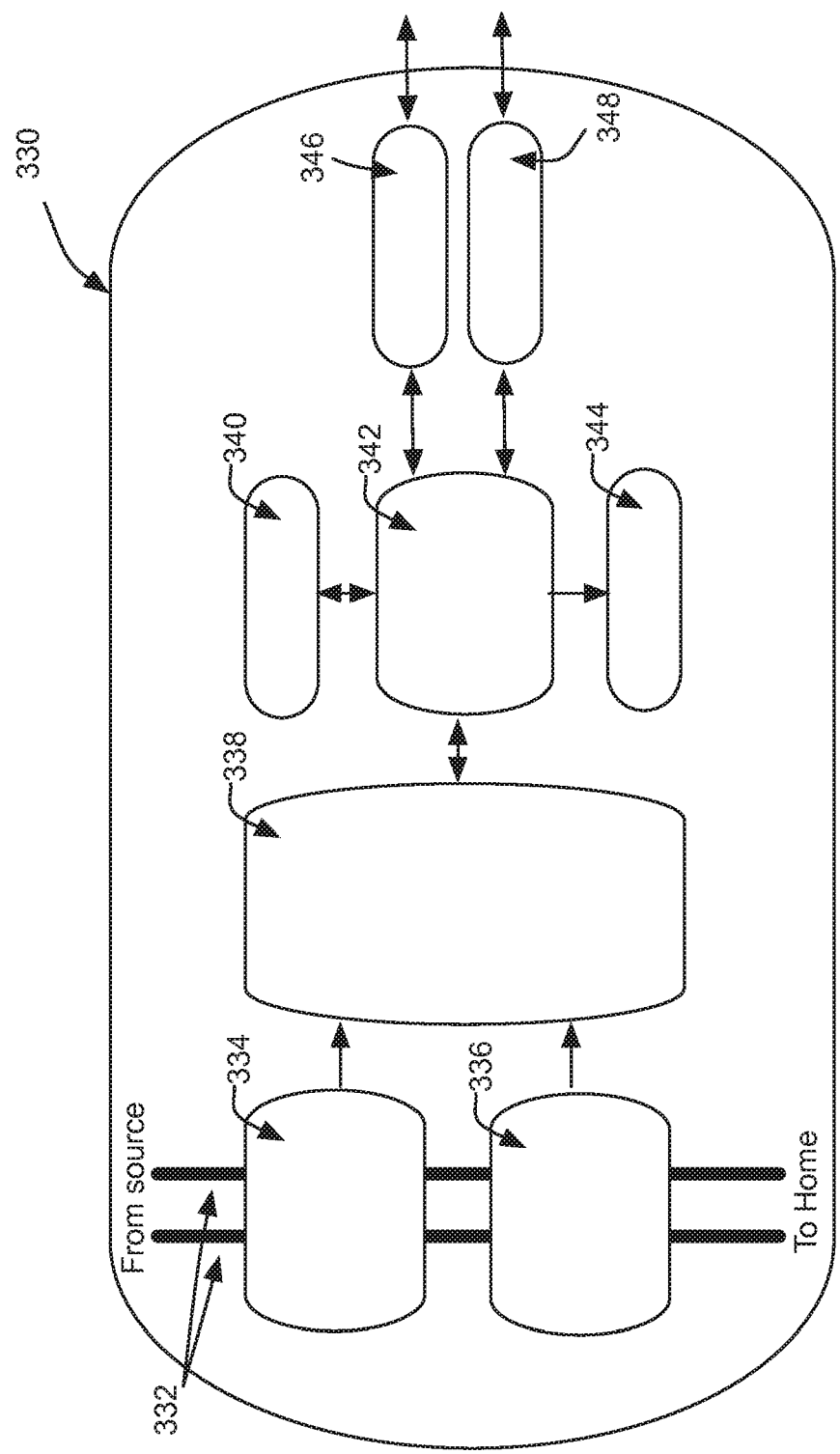
FIG. 16 is a first example of application of the present invention.

A first example of application of the present invention is shown in FIG. 16. The apparatus 330 of FIG. 16 is of a form appropriate for application in a single consumer environment to augment the capabilities of an electricity meter, such as a home or business premises to include fault detection within the premises. Typically the apparatus 330 is installed at or near the point of entry of live and neutral mains electricity conductors to the supply location. The apparatus may also be in the distribution box to perform point of branch sub metering. The apparatus 330 of FIG. 16 comprises electricity supply conductors 332, current measurement apparatus 334 and voltage measurement apparatus 336. The current measurement apparatus 334 and voltage measurement apparatus 336 are as described above with reference to FIGS. 3 to 13. The apparatus 330 of FIG. 16 also comprises power measurement and fault detector circuitry 338, memory 340, a Central Processing Unit (CPU) 342 and a display 344. The form and function of the power measurement and fault detector circuitry 338, memory 340, Central Processing Unit (CPU) 342 and display 344 are described above with reference to FIGS. 3 to 13. The apparatus 330 of FIG. 16 further comprises a Wide Area Network (WAN) connection 346 and a Home Area Network (HAN) connection 348. The description provided above with reference to FIGS. 10 to 13 makes reference to communication with a remote location. Each of the WAN 346 and the HAN 348 is an example of such communication. More specifically the WAN 346 provides for communication with a utility, such as an electricity supplier. The HAN 348 provides for communication with a network of known form and function which is installed in the home or business premises and which is operative to provide for heating control, air conditioning control or the like. Where such a network comprises a control and display unit, the present invention is operative to make use of such an installed control and display unit, e.g. by displaying detected fault conditions.

Figure 17:
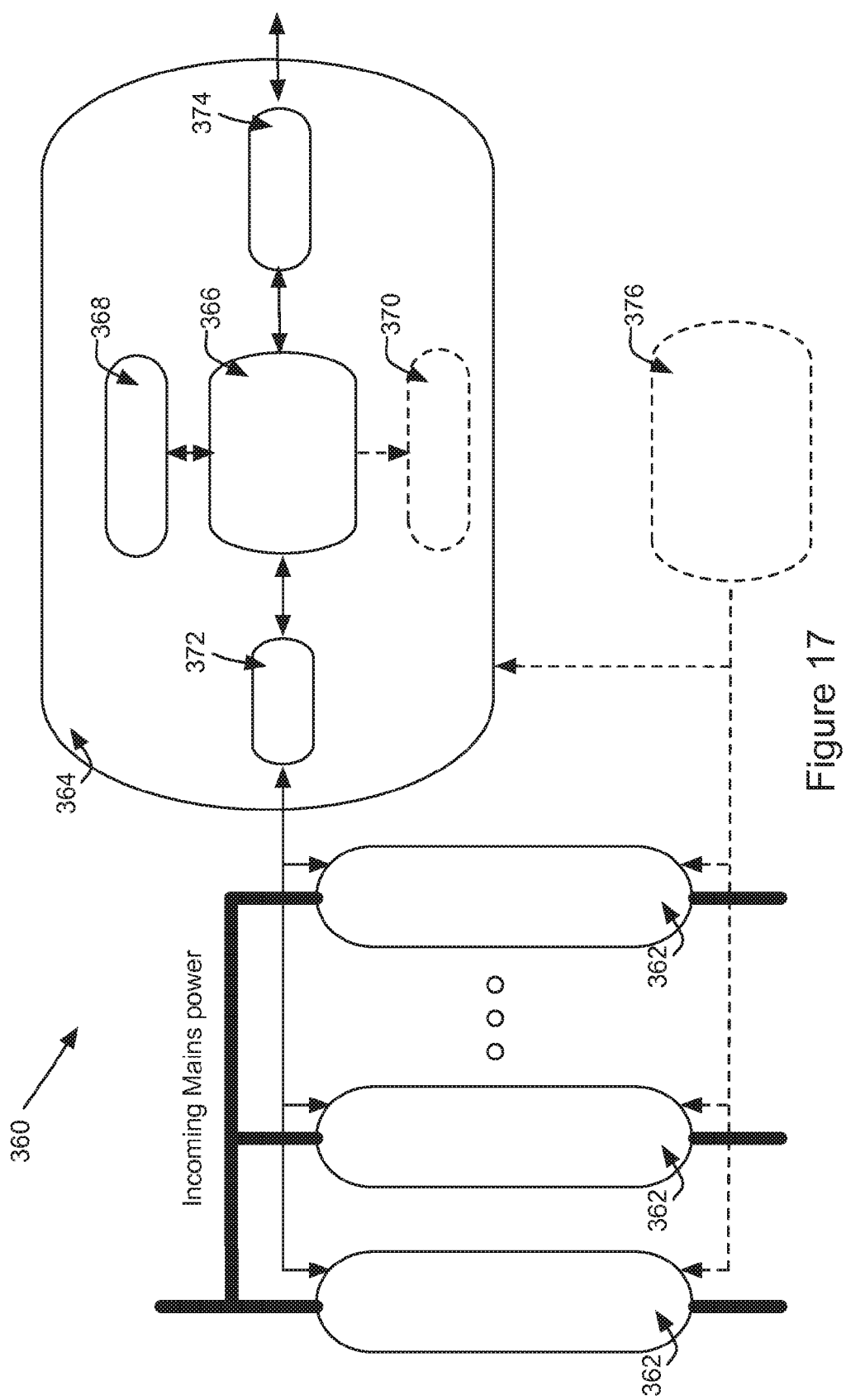
FIG. 17 is a second example of application of the present invention.

A second example of application of the present invention is shown in FIG. 17. The apparatus 360 of FIG. 17 is of a form appropriate for application of multiple power measurements with multiple fault detection and interruption capabilities in a distribution box. The distribution box may be a circuit breaker or fusebox in a residential home or a distribution box in a sub-metering environment, such as in apartment complexes, commercial buildings and mobile home parks. The apparatus 360 comprises plural current measurement apparatus 362 according to the invention, with each current measurement apparatus 362 being operative to make measurements, detect faults and provide circuit interruption for different branches in the box. Each current measurement apparatus 362 is of a form and function as described above with reference to FIGS. 3 to 13. The apparatus 360 also comprises a control module 364, which comprises a Central Processing Unit (CPU) 366, memory 368, a display unit 370, local communications circuitry 372 and a Home Area Network (HAN) connection 374. Each current measurement apparatus 362 contains local communications for sending status data, power consumption data and fault detect event data to the CPU 366 via the local communications circuitry 372. The local communications function is shared amongst all branches and is operative according to a protocol that enables multiple devices to share the communications channel. The local communications arrangement comprises optical or another isolated communication links where each current measurement apparatus is individually powered from its respective mains supply to thereby maintain isolation. The HAN connection 374 provides for communication of data by way of a home area network. The HAN connection 374 is operative to send and receive spaced apart data packets containing measurement data rather than sending and receiving measurement data on an ongoing basis. Thus the home area network is operated below bandwidth capacity to thereby reduce the likelihood of network congestion and delays in effecting urgent network dependent functions, such as operation of a circuit breaker following an arc or ground fault. The control module 364 is operative to collate power consumption data from each of the plural current measurement apparatus 362 which is conveyed to the utility for reporting and billing purposes. In addition the control module 364 is operative to provide for communication of fault and power consumption data to a home area network by way of the HAN connection 374 for the purposes of display of fault conditions and for local power consumption metering. Furthermore the control module 364 is operative to receive fault data from each of the plural current measurement apparatus 362 and to make a determination and respond in dependence on such received fault data. More specifically the control module 364 is operative to operate a circuit breaker by way of the HAN in at least one of the plural current measurement apparatus 362 instead of the circuit breaker being operated locally by the current measurement apparatus 362 itself. In addition the control module 364 is operative to make a comparative analysis of the received fault data and to respond in dependence on the analysis. For example if all the current measurement apparatus 362 report the same form of fault it may be determined that the faults have been caused by a lightning strike. The control module 364 may then operate the circuit breakers in the plural current measurement apparatus 362 in a predetermined order. In another application the control module 364 is operative in cooperation with a remote control centre to determine and to effect connection or disconnection of the electricity supply by way of the circuit breakers comprised in the plural current measurement apparatus. For example if a consumer has failed to settle his electricity bill the control module 364 is operative in dependence on control data received from the control centre to open a circuit breaker and thereby disconnect the consumer. According to another example if premises are now occupied after a void period the control module 364 is operative in dependence on control data received from the control centre to close a circuit breaker and thereby connect the new consumer. The local communication circuitry 372 is operative to send back instructions and/or configuration data to at least one of the current measurement apparatus 362. Fault and power consumption data is also displayed at the control module 364 on the display unit 370. The apparatus 360 also comprises an ac to dc power supply unit 376, which is operative to receive electrical power from the mains electricity supply, to rectify the mains supply and to otherwise provide a regulated dc power supply to each of the plural current measurement apparatus 362 and the control module 364.

Figure 18:
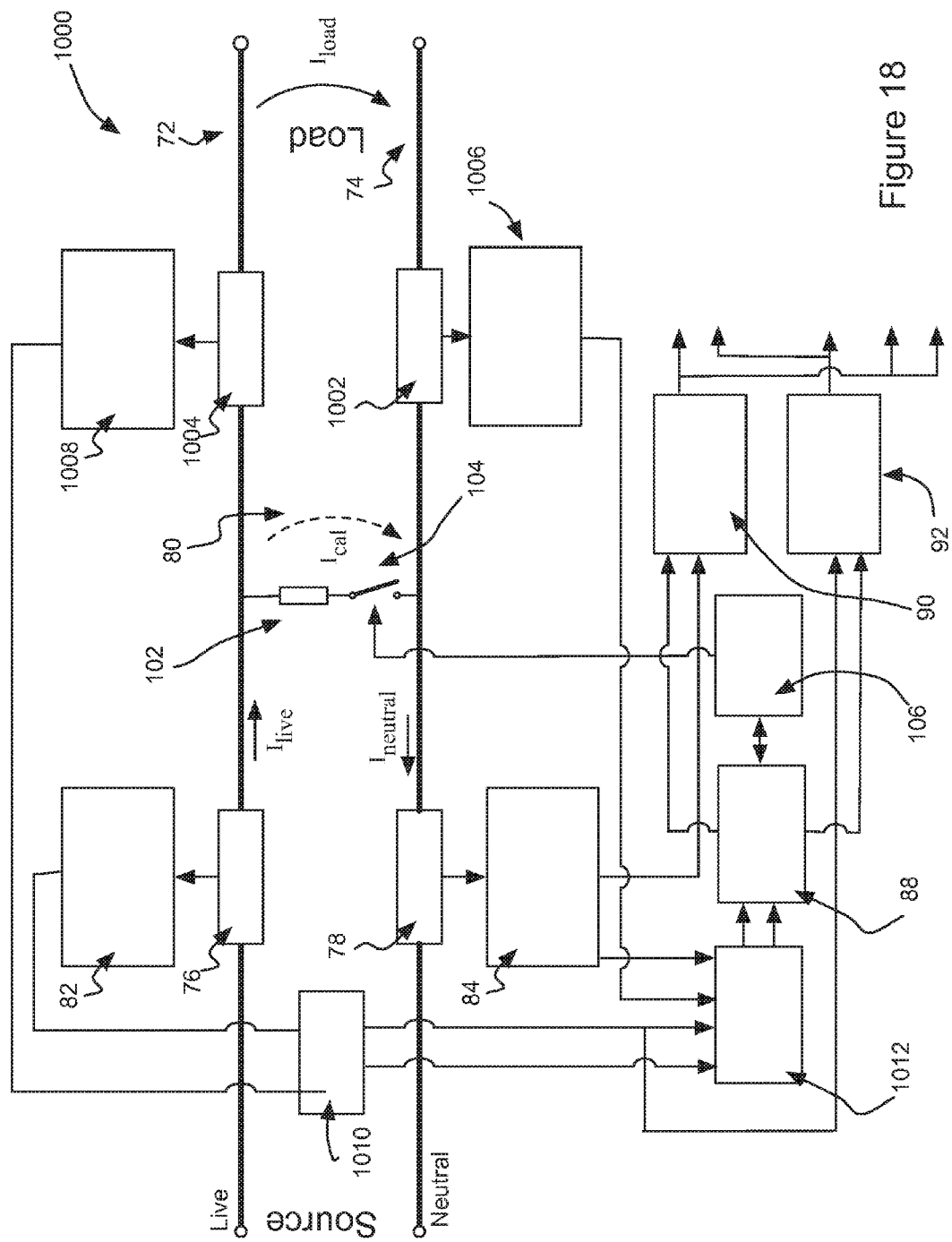
FIG. 18 is a block diagram representation of current measurement apparatus according to an eleventh embodiment.

A block diagram representation of current measurement apparatus 1000 according to an eleventh embodiment is shown in FIG. 18. Components in common with the embodiment of FIG. 10 are designated by like reference numerals and the reader's attention is directed to the description provided above with reference to FIG. 10 for a description of such common components. Components particular to the embodiment of FIG. 18 will now be described. The current measurement apparatus 1000 comprises a third shunt resistor 1004, a fourth shunt resistor 1002, a third acquisition circuit 1008, a fourth acquisition circuit 1006, a modified isolator 1010 and a common signal removal circuit 1012. The third shunt resistor 1004 is in series with the first shunt resistor 76 in the live conductor 72 with the third shunt resistor 1004 being present in the live conductor 72 on the load side of the series connected calibration resistor 102 and switch 104. The fourth shunt resistor 1002 is in series with the second shunt resistor 78 in the neutral conductor 74 with the fourth shunt resistor 1002 being present in the neutral conductor 74 on the load side of the series connected calibration resistor 102 and switch 104. The third acquisition circuit 1008 is configured to acquire an analogue current measurement from the third shunt resistor 1004 and generate a digital representation of the analogue current measurement. The fourth acquisition circuit 1006 is configured to acquire an analogue current measurement from the fourth shunt resistor 1002 and generate a digital representation of the analogue current measurement. The modified isolator 1010 receives outputs from the first and third acquisition circuits 82, 1008 to thereby provide for galvanic isolation between the live and neutral circuits. The common signal removal receives an output from the fourth acquisition circuit 1006, an isolated output from the third acquisition circuit 1008, an isolated output from the first acquisition circuit 82 and an output from the second acquisition circuit 84. Otherwise and although not shown in FIG. 18 the embodiment of FIG. 18 comprises the fault detection circuitry present in the embodiment of FIG. 10 after the first and second processing circuits 90, 92.

Operation of the embodiment of FIG. 18 will now be described. The calibration source 80 in the form of the series connected calibration resistor 102 and switch 104 is operative to apply a calibration signal to the live and neutral conductors which passes through the first and second shunt resistors 76, 78 but not the third and fourth shunt resistors 1004, 1002. The lack of calibration signal in the third and fourth shunt resistors 1004, 1002 provides a basis for removal of undesired signals common to the calibration signal and signals present on the live and neutral conductors. The common signal removal circuit 1012 is operative to correlate the four input signals with one another. The common signal removal circuit 1012 is further operative to subtract the signals from the first and third shunt resistors 76, 1004 from each other and to subtract the signals from the second and fourth shunt resistors 78, 1002 from each other. One of the two differences is then subtracted from the other difference to provide a factor relating to the common signal. The common signal removal circuit 1012 is then operative to apply the common signal factor to each of the outputs from the first and second shunt resistors 76, 78 to thereby remove the effects of the common signal. The thus corrected signals are then passed on to the correlation detection and correction circuit 88 and subsequent circuitry for processing as described above. According to another approach, which is of equivalent effect to the above described approach, the signals from the first and second shunt resistors 76, 78 are subtracted from each other and the signals from the third and fourth shunt resistors 1004, 1002 are subtracted from each other to provide two differences which are then subtracted to yield a common signal factor. Considering the calibration signal further, the calibration signal on the live conductor is removed by determining the average of Ical(live)=Ilive (phase 2)−Ilive(phase 1) where Ical(live) is the calibration signal present on the live conductor, Ilive(phase 2) is the live current measured with the calibration signal present and Ilive(phase 1) is the live current measured when no calibration signal is present. Similarly calibration signal on the neutral conductor may be removed by determining the average of Ical(neutral)=Ineutral(phase 2)−Ineutral(phase 1) where Ical(neutral) is the calibration signal present on the neutral conductor, Ineutral(phase 2) is the neutral current measured with the calibration signal present and Ineutral (phase 1) is the neutral current measured when no calibration signal is present. The error in a gain mismatch, A, between the live and neutral conductors is then determined. After application of the gain mismatch to all subsequent measurements and removal of the calibration signal the difference between the live and neutral current signals is determined.

Figure 19A:
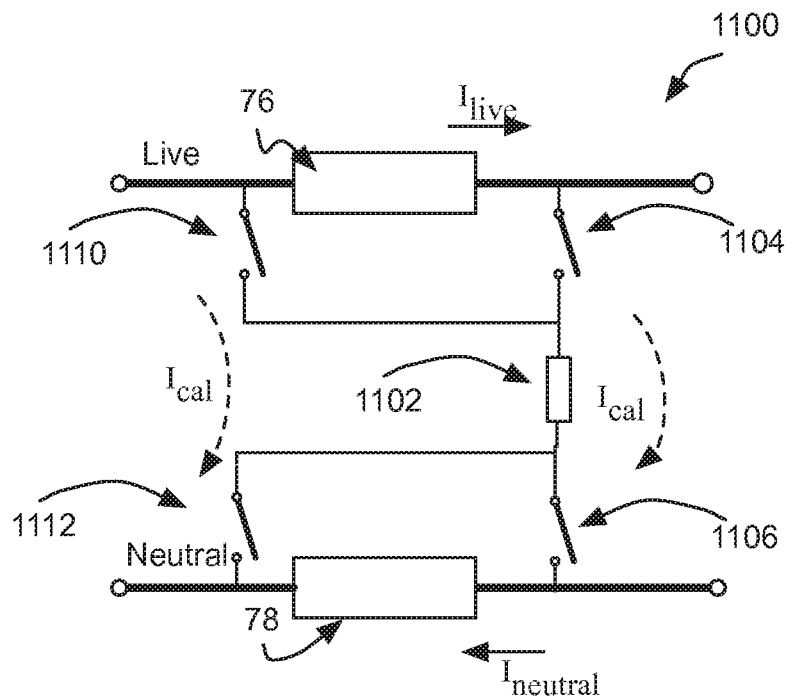
FIG. 19A is a first form of current measurement arrangement.

A first form of current measurement arrangement 1100 is shown in FIG. 19A. FIG. 19A shows an alternative configuration of calibration source and shunt resistors to the configuration of FIG. 10 or FIG. 18. The configuration of FIG. 19A comprises the first and second shunt resistors 76, 78 and a calibration resistor 1102. The configuration further comprises first, second, third and fourth switches 1104, 1106, 1110, 1112 instead of the single switch of previous embodiments. The first switch 1104 connects a first end of the calibration resistor 1102 to the load side of the first shunt resistor 76 and the third switch 1110 connects the first end of the calibration resistor 1102 to the source side of the first shunt resistor 76. The second switch 1106 connects the second opposite end of the calibration resistor 1102 to the load side of the second shunt resistor 78 and the fourth switch 1112 connects the second end of the calibration resistor 1102 to the source side of the second shunt resistor 78. A first pair consisting of the first and second switches 1104, 1106 are opened and closed together and a second pair consisting of the third and fourth switches 1110, 1112 are opened and closed together and such that the first and second pairs of switches are operated out of phase. The calibration current therefore either flows through or bypasses both of the first and second shunt resistors 76, 78. Also at any one time there is always one pair of switches closed between the live and neutral conductors whereby the maximum voltage seen across a switch is the voltage developed across a shunt resistor. This form of current measurement arrangement is used to remove signals common to the calibration signal and the signals present on the live and neutral conductors as follows. The common signal removal circuit 1012 of the embodiment of FIG. 18 is operative to receive and correlate the signals acquired from the two shunt resistors during both phases of clocking of the switches. The common signal removal circuit 1012 is then operative to subtract acquired signals comprising the calibration signal from each other and to subtract acquired signals lacking the calibration signal from each other. Thereafter the common signal removal circuit 1012 is operative to subtract one of the differences from the other to thereby determine a factor relating to the common signal which is then used to remove the common signal from acquired signals comprising the calibration signal.

Figure 19B:
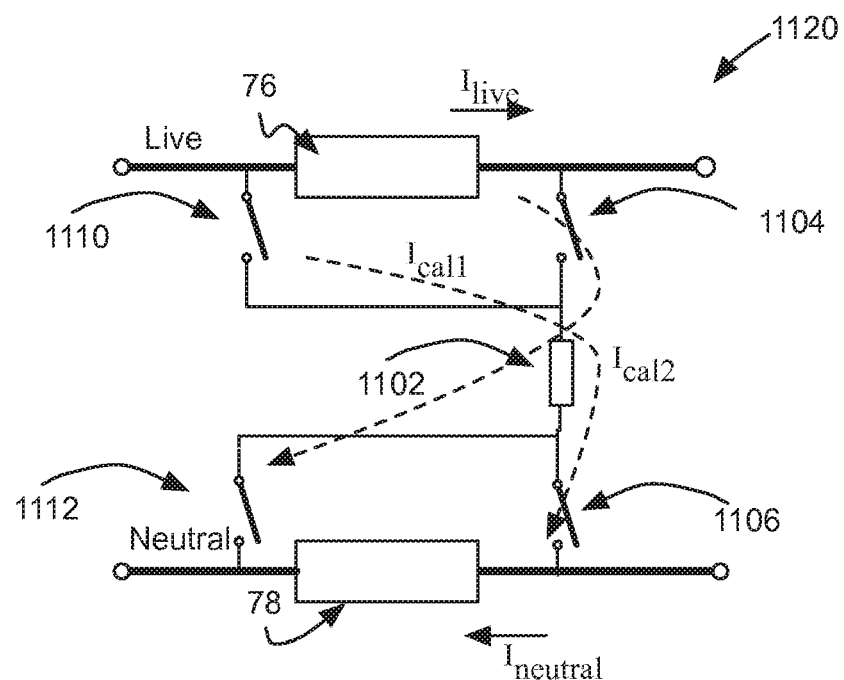
FIG. 19B is a second form of current measurement arrangement.

A second form of current measurement arrangement 1120 is shown in FIG. 19B. The configuration of the second form of current measurement arrangement 1120 is the same as the configuration of the first form of current measurement as shown in FIG. 19A. The second form of current measurement arrangement 1120 differs from the first form of current measurement arrangement 1100 in respect of how the four switches are clocked. In the second form 1120 a first pair consisting of the first and fourth switches 1104, 1112 are opened and closed at the same time and a second pair consisting of the second and third switches 1106, 1110 are opened and closed at the same time and such that the first and second pairs of switches are operated out of phase. In common with the first form of current measurement arrangement 1100 the second form 1120 there is always at any one time one pair of switches closed between the live and neutral conductors whereby the maximum voltage seen across a switch is the voltage developed across a shunt resistor. Current measurement apparatus comprising the second form 1120 is operative to remove the common signal by performing two sets of subtractions on signals acquired from the first and second shunt resistors as described above in relation to FIG. 19A. Therefore one obtains a first expression, Signal+Ical−A*Signal, during one phase and a second expression, Signal−A*(Signal+Ical), during the other phase where Signal is the load current signal, Ical is the calibration signal and A is the gain mismatch between the live and neutral conductors. A factor in A and Ical is obtained by determining the difference between the two expressions which is used as described above to provide for calibration.

Figure 19C:
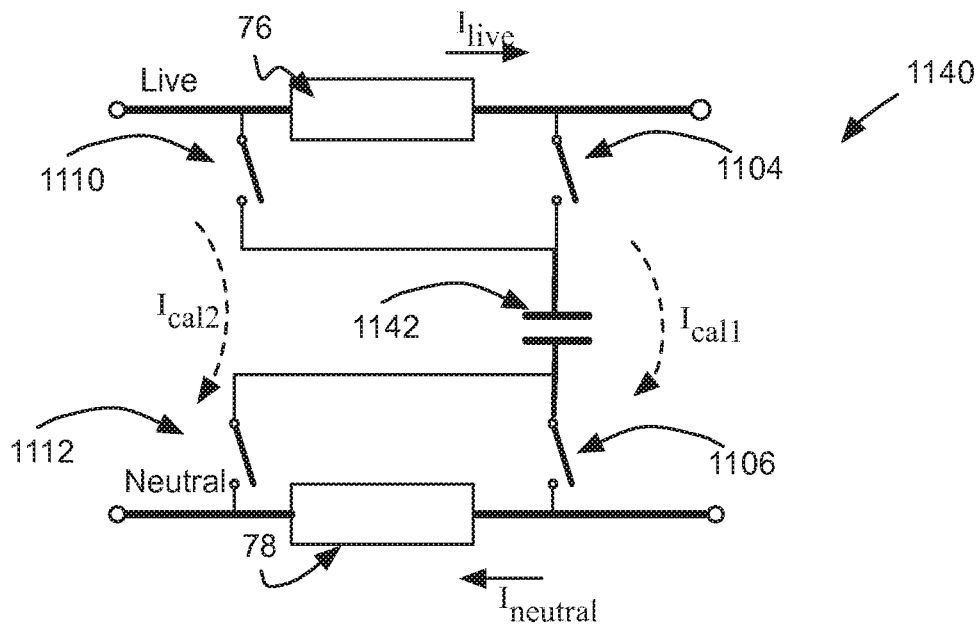
FIG. 19C is a third form of current measurement arrangement.

A third form of current measurement arrangement 1140 is shown in FIG. 19C. The configuration of the third form is the same as the first form of current measurement arrangement 1100 with the exception of the replacement of the calibration resistor 1102 with a calibration capacitor 1142. The calibration capacitor 1142 is either an X or Y type. Otherwise the third form 1140 is operative with regards to the operation of the four switches either according to the first form of FIG. 19A or the second form of FIG. 19B. The third form has the advantage over the first and second forms of dissipating substantially no active power.

Figure 19D:
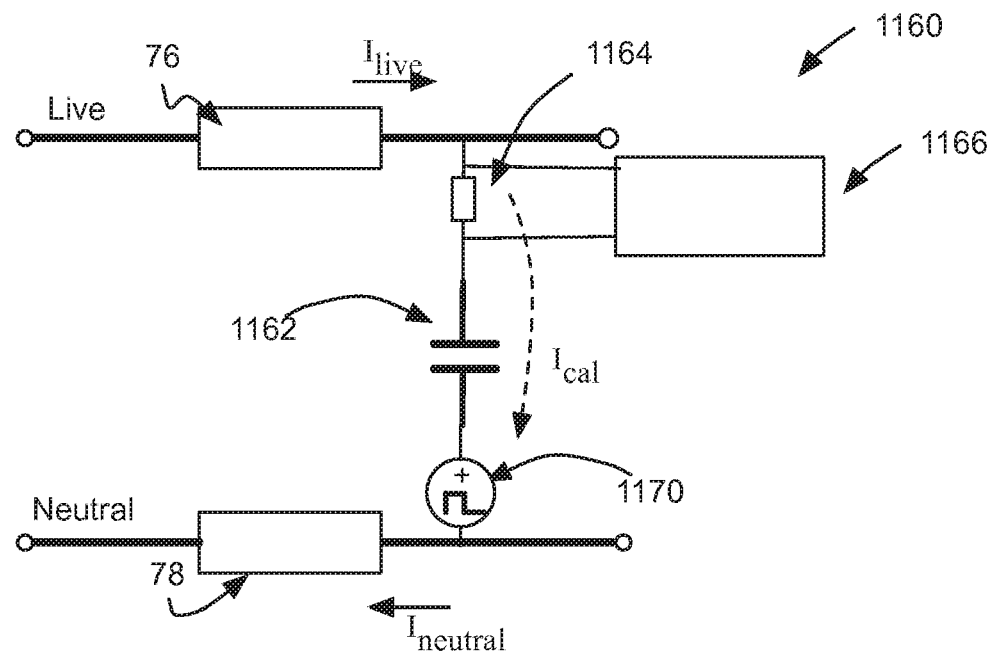
FIG. 19D is a fourth form of current measurement arrangement.

A fourth form of current measurement arrangement 1160 is shown in FIG. 19D. The fourth form comprises the first and second shunt resistors 76, 78 and a calibration source consisting of a series arrangement of measurement resistor 1164, calibration capacitor 1162 and a voltage source 1170. The calibration source is connected between the live and neutral conductors on the load side of the first and second shunt resistors 76, 78. The fourth form further comprises a measurement configuration 1166 which is operative to measure a current signal in the measurement resistor 1164. The measurement configuration 1166 therefore comprises a sample and hold circuit and an analogue to digital converter which are operative to measure a voltage signal across the measurement resistor. In operation voltage source 1170 applies a sinusoidal voltage to the calibration capacitor 1162 and thereby causes a sinusoidal calibration current to flow in the first and second shunt resistors. The sinusoidal calibration current in the first and second shunt resistors is measured and provides for calibration as described above. In other forms voltage source 1170 is configured to apply a variety of waveforms other than sinusoidal waveforms. The measurement configuration 1166 is operative to measure the calibration current flowing through the measurement resistor 1164. Current measurement apparatus comprising the fourth form is operative to set a desired calibration current by controlling the voltage source 1170 in dependence on measurements made by the measurement configuration 1166. Where the calibration impedance is a resistor the amplitude of calibration signal varies with the line voltage and so the SNR varies from measurement to measurement within a complete cycle of the line voltage. In view of this the current measurement apparatus is configured to weight measurements from a load resistor in dependence on the line voltage signal. Where a reactive calibration impedance such as a capacitor is used instead of a load resistor the current measurement apparatus is configured to weight measurements differently within a cycle of the line voltage to take account of the phase difference between voltage and current. Weighting of measurements with better SNR in preference to measurements with poorer SNR within a cycle improves the overall SNR.

Figure 20:
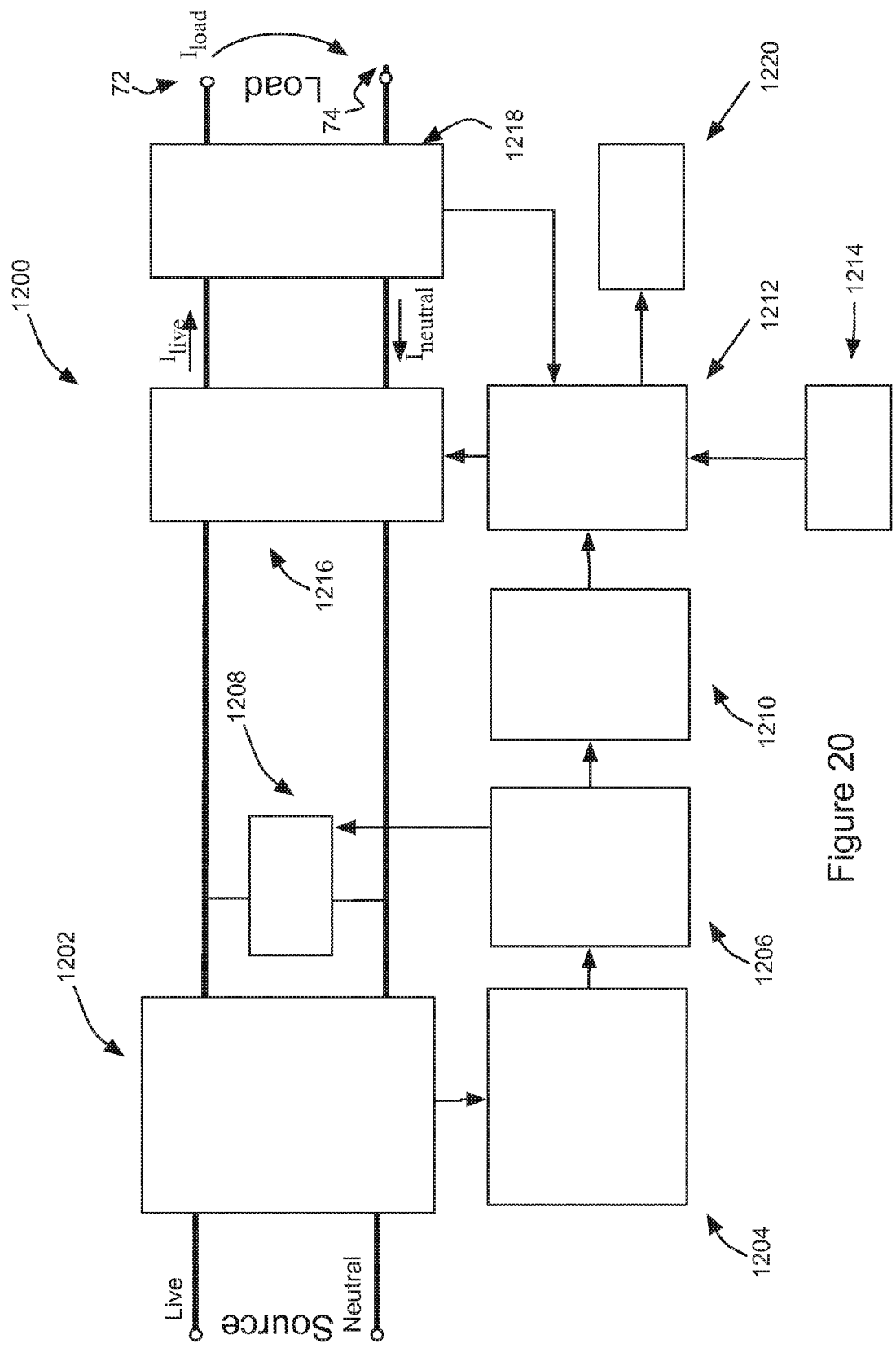
FIG. 20 is a third example of application of the present invention.

A third example of application 1200 of the present invention is shown in FIG. 20. The third example of application 1200 comprises a current and voltage sensor block 1202, acquisition circuitry 1204, calibration and normalisation circuitry 1206, a calibration source 1208 and fault detection and power measurement circuitry 1210. The third example of application 1200 also comprises a usage and fault state machine 1212, an arm/disarm command interface 1214, a switch and relay block 1216, a post switch sensor block 1218 and a state display 1220. The current and voltage sensor block 1202 comprises plural shunt resistors as described in any previous embodiment and a line voltage sensor arrangement as described above. The acquisition circuitry 1204 is operative to acquire signals sensed by the current and voltage sensor block 1202. The calibration and normalisation circuitry 1206 is operative to provide for calibration in dependence on application of a calibration signal by the calibration source 1208 as described according to previous embodiments and to normalise absolute and differential measurements. The fault detection and power measurement circuitry 1210 is operative to determine power consumption and to detect faults, such as ground and arcing faults, in dependence on the normalised absolute and differential measurements as described above. The switch and relay block 1216 is operative to open and close one, other or both of the live and neutral conductors in dependence on operation of the fault detection and power measurement circuitry 1210. Operation of the switch and relay block 1216 is under the control of the usage and fault state machine 1212 which makes decisions with regards to opening and closing the live and neutral conductors in dependence on operation of the fault detection and power measurement circuitry 1210 and on manual intervention by way of the arm/disarm command interface 1214. The arm/disarm command interface 1214 may, for example, be used to test the apparatus in particular with regards to operation of the switch and relay block 1216. The apparatus is operative to provide a delay between power up and operation of the switch and relay block 1216 to allow sufficient time for calibration and accurate operation. The post switch sensor block 1218 is operative to measure current in the live and neutral conductors on the load side of the switch and relay block 1216. The output from the post switch sensor block 1218 is provided to the usage and fault state machine 1212. The apparatus is operative when the switch and relay block 1216 interrupts at least one of the live and neutral conductors to prevent reconnection of the live and neutral conductors when at least one of the live and neutral conductor currents as sensed by the post switch sensor block 1218 is unduly high. Reconnection is thereby prevented when, for example, there is a short or mis-wiring on the load side. The state display 1220 is operative to display by way of the like of an LCD display the current status of the apparatus. The state display is also operative to provide for remote communication of the current status by way of a wired or wireless communications channel. The usage and fault state machine 1212 comprises non-volatile memory which is operative to store default data and to load the stored default data if power to the apparatus is interrupted. Alternatively default data is communicated to the apparatus by way of the remote communications channel supported by the state display 1220.

Figure 21:
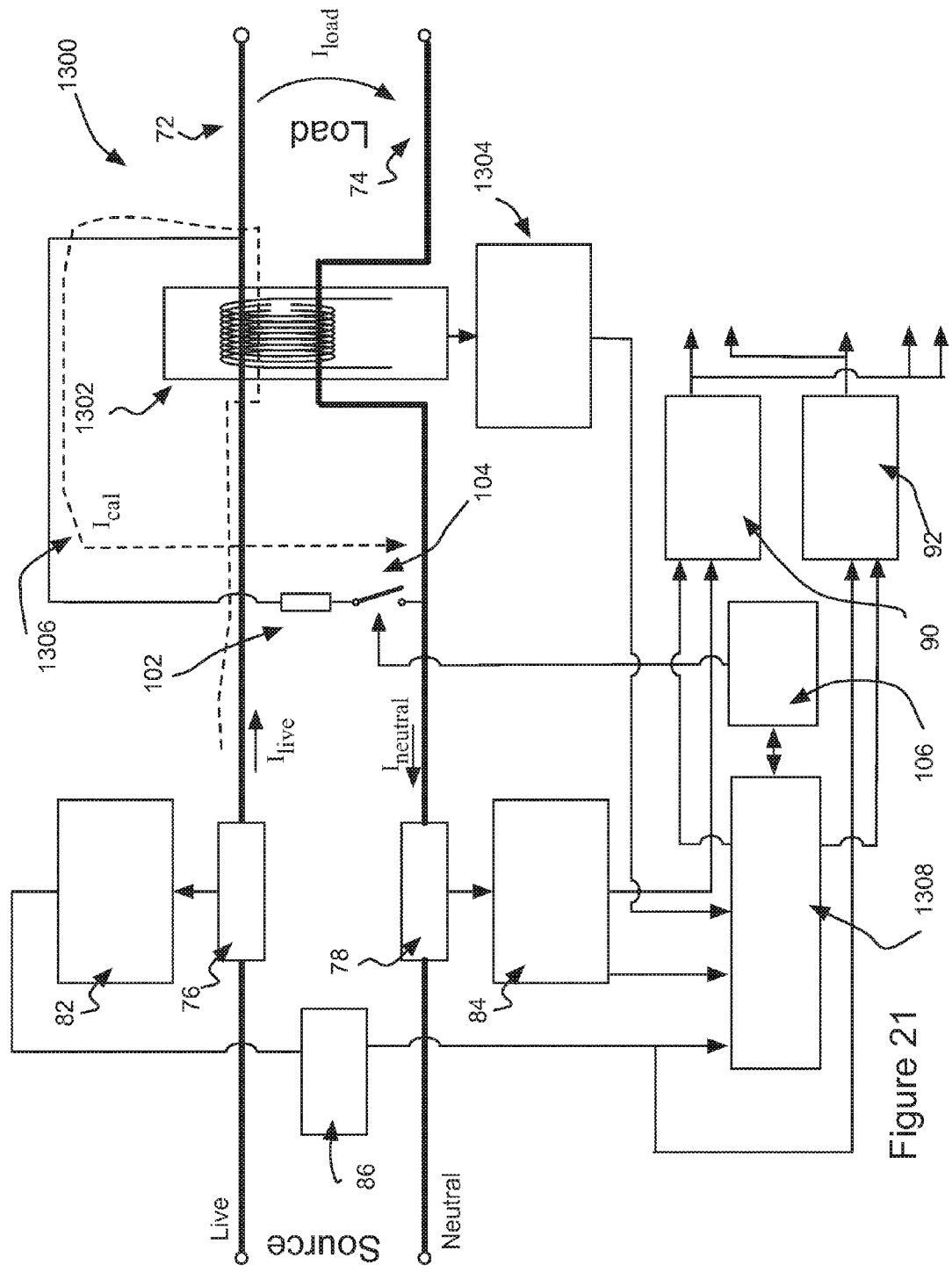
FIG. 21 is a block diagram representation of current measurement apparatus according to a twelfth embodiment.

A block diagram representation of current measurement apparatus 1300 according to a twelfth embodiment is shown in FIG. 21. Components in common with the embodiment of FIG. 10 are designated by like reference numerals and the reader's attention is directed to the description provided above with reference to FIG. 10 for a description of such common components. Components particular to the embodiment of FIG. 21 will now be described. The current measurement apparatus 1300 comprises a current transformer 1302 (which constitutes a differential measurement device) around the live and neutral conductors on the load side of the calibration source formed by the series connected calibration resistor 102 and switch 104. The current measurement apparatus 1300 also comprises a current transformer data acquisition circuit 1304 which is configured to acquire and convert signals sensed by the current transformer 1302. The current measurement apparatus 1300 further comprises a modified correlation detection and correction circuit 1308 which receives an input from the current transformer data acquisition circuit 1304 in addition to inputs from the first and second acquisition circuits 78, 82. In one form, a first end of the calibration source 102, 104 is connected to the live conductor on the load side of the current transformer 1302 and a second opposite end of the calibration source is connected to the neutral conductor between the second shunt resistor 78 and the current transformer. The calibration source 102, 104 is therefore operative to apply a calibration signal which is sensed by the current transformer allowing for calibration of the current transformer as well as the shunt resistors. In another form the first end of the calibration source 102, 104 is instead connected to a length of conductor which is passed through the current transformer 1302 from the load end and is then connected to the live conductor between the first shunt resistor 76 and the current transformer. The length of conductor from the calibration source is operative to apply a calibration signal to the current transformer and the connection to the live wire between the current transformer and the first shunt resistor provides for the passage of the calibration signal through the first and second shunt resistors. In both forms the modified correlation detection and correction circuit 1308 is operative on the several acquired signals in the same fashion as described above with reference to FIG. 10.

The current transformer 1302 provides for measurement of the sum of the live and neutral currents and therefore provides an additional means of measuring the difference in absolute measurements based on the first and second shunt resistors 76, 78. The combination of measurement approaches provide for ease simultaneous power measurement and fault detection. The combination of measurement approaches also allows for ground fault and arc detection over different voltage ranges and difference frequency ranges. Furthermore combination of measurement approaches provides for enhancements to ground fault detection. Also such current measurement apparatus provides for ease of provision of the like of AFCI and ground fault detection functions by relying more on measurements made by the differential measurement device in preference to absolute measurements when the currents on live and neutral are high and relying more on absolute measurements in preference to measurements made by the differential measurement device when the current difference between the live and neutral conductors is great.

Figure 22:
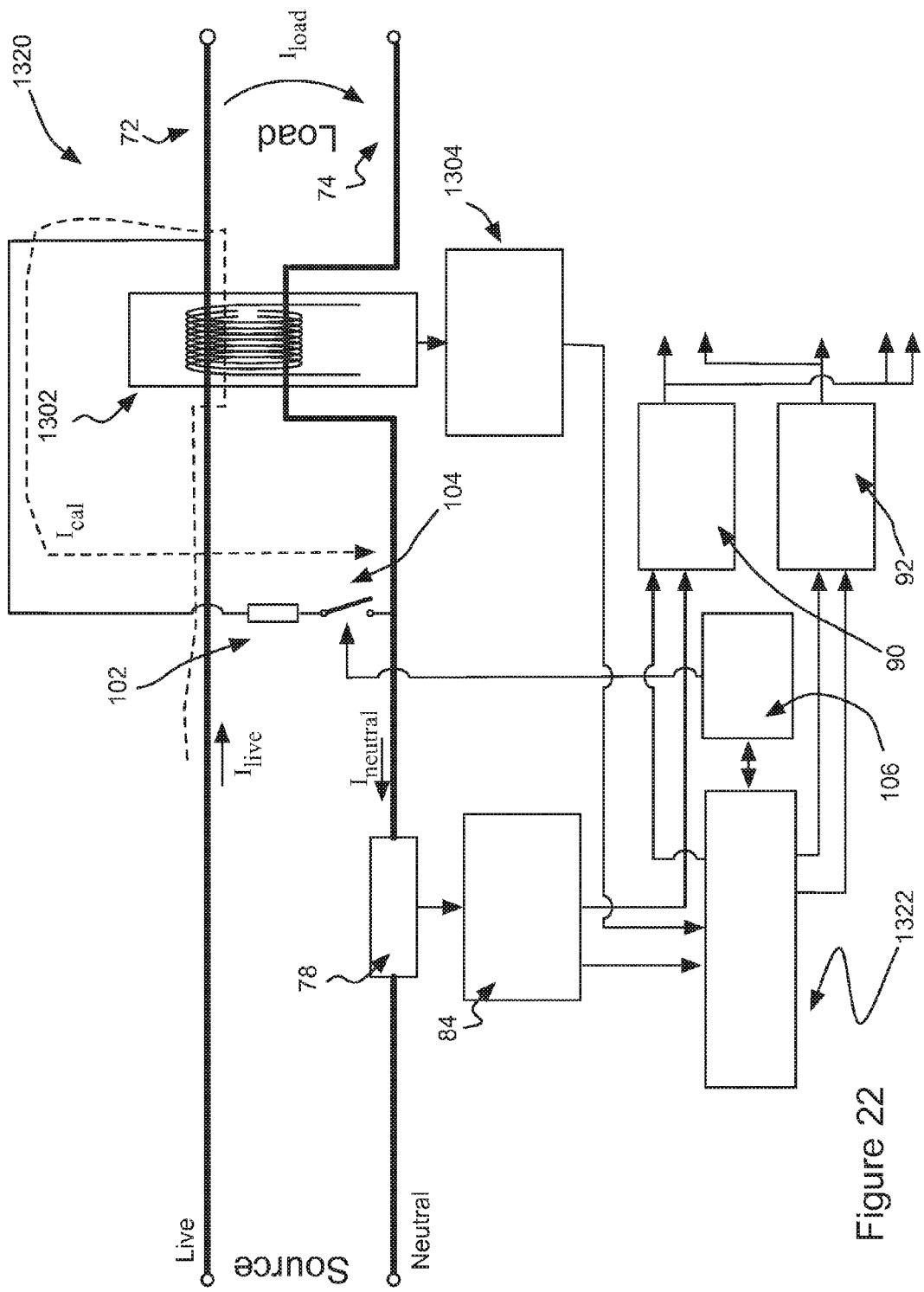
FIG. 22 is a block diagram representation of current measurement apparatus according to a thirteenth embodiment.

A block diagram representation of current measurement apparatus 1320 according to a thirteenth embodiment is shown in FIG. 22. Components in common with the embodiment of FIG. 21 are designated by like reference numerals and the reader's attention is directed to the description provided above with reference to FIG. 21 for a description of such common components. Components particular to the embodiment of FIG. 22 will now be described. The current measurement apparatus 1320 lacks the first shunt resistor 76 of the embodiment of FIG. 21 and the first shunt resistor's processing chain. The current measurement apparatus 1320 comprises only the second shunt resistor 78 in the neutral conductor. In addition the current measurement apparatus 1320 comprises a reconstruction, correlation and calculation circuit 1322 instead of the modified correlation detection and correction circuit 1308 of the embodiment of FIG. 21. The reconstruction, correlation and calculation circuit 1302 is operative to correlate signals acquired from the second shunt resistor 78 and the current transformer 1302 and to determine the live current signal by subtracting the acquired neutral current signal from the differential signal acquired by the current transformer. The reconstruction, correlation and calculation circuit 1302 then passes the acquired neutral current signal, the determined live current signal and the acquired differential signal onto the remaining processing circuitry where power consumption is determined and fault conditions detected as described above with reference to previous embodiments.

The invention claimed is:

1. Current measurement apparatus comprising:
    a first current sensor for sensing a current in a first conductor;
    a first measurement circuit configured to buffer an output of the first current sensor to provide a first buffered signal having a first dynamic range and to measure the first buffered signal to provide a first measurement signal; and
    a second measurement circuit configured to buffer the same output of the first current sensor to provide a second buffered signal having a second dynamic range different from the first dynamic range and to measure the second buffered signal to provide a second measurement signal.

2. The current measurement apparatus of claim 1,
    wherein the first measurement circuit includes a first gain stage and a first analog to digital converter and the second measurement circuit includes a second gain stage and a second analog to digital converter; and
    wherein a signal range of the first analog to digital converter is larger than a signal range of the second analog to digital converter.

3. The current measurement apparatus of claim 2,
    wherein the first measurement circuit is configured for use in arc fault detection in a power distribution network and the second measurement circuit is configured for use in at least one of ground fault detection and metering of current flow.

4. The current measurement apparatus of claim 2,
    wherein the first and second measurement circuits are configured for clocking at different frequencies.

5. The current measurement apparatus of claim 1 further including:
    a second current sensor for sensing a current in a second conductor and a third measurement circuit responsive to an output of the second current sensor;
    where the first and second conductors act as the supply and return wires to a load, such that under no fault conditions the currents in the first and second conductors are the same.

6. The current measurement apparatus of claim 5 further including:
    circuitry operative to perform calibration in respect of the current paths associated with the first and second current sensors to align a measurement signal produced by the third measurement circuit and a measurement signal produced by at least one of the first and second measurement circuits.

7. The current measurement apparatus of claim 6 further including:
    circuitry to introduce a calibration signal to cause a shared perturbation in currents measured by the first and second current sensors, such that transfer functions associated with the first and second current sensors can be adjusted to have substantially matching responses to the calibration signal or such that corrective factor can be applied.

8. The current measurement apparatus of claim 7 further including:
    a correlation and detection circuit that is operative during calibration to extracts parts of a first signal from one of the first and second measurement circuits, the first signal containing a contribution from the calibration signal and a contribution from a current passing along the first conductor; and the correlation and detection circuit being further arranged to extract parts of the a second signal from the third measurement circuit, the second signal containing a contribution from the calibration signal and a contribution from the current passing along the second conductor, the extracted parts relating to the calibration signal being used to adjust the transfer functions; and at least one processing circuit operative to determine a magnitude of a current flowing in the first conductor and a magnitude of a current flowing in the second conductor.

9. The current measurement apparatus of claim 8, wherein the processing circuit is configured to vary its determination of a fault condition based on a magnitude of the current being drawn by the load.

10. The current measurement apparatus of claim 5, wherein one of the first and second current sensors is a differential current measurement device configured to provide a sum of the of the current in the first and second conductors.

11. The current measurement apparatus of claim 1 further including:
a voltage measurement circuit to measure the voltage of the first conductor with respect to a reference voltage.

12. The current measurement apparatus of claim 3, wherein the first conductor is a live conductor carrying a first phase of a power distribution network, the apparatus further comprising a voltage measurement circuit for measuring a voltage difference between the first conductor and a second conductor; and
wherein the second conductor is one of a second phase and a neutral of the power distribution network, and wherein a voltage signal representative of the voltage between the first and second conductors is analyzed for arc fault detection.

13. The current measurement apparatus of claim 3 further including:
a second current sensor for sensing a current in a second conductor, a third current sensor for sensing a current in a third conductor and a fourth current sensor for sensing a current is a fourth conductor, where the first to third live conductors and a neutral conductor are conductors of a three phase supply.

14. An apparatus for ground fault detection and/or power metering, comprising:
a first current transducer responsive to a difference in magnitude between currents flowing in live and neutral conductors connecting a device to a supply, wherein the device comprises a load or power source;
a second current transducer configured to measure the magnitude of the current in the neutral conductor; and
a circuit configured to measure power consumption and/or to detect a fault condition based on first information from the first current transducer about the difference in magnitude between currents flowing in the live and neutral conductors and second information from the second current transducer about the magnitude of the current in the neutral conductor.

15. The apparatus for ground fault detection and/or power metering of claim 14 further including:
a second circuit arranged to correlate signals from the first and second current transducers and to determine information about a current in the live conductor by subtracting the acquired neutral current acquired by the second transducer from the differential signal acquired by the first current transducer.

16. The apparatus for ground fault detection and/or power metering of claim 14 further including:
a third current transducer arranged to measure the magnitude of the current flowing in the live conductor, wherein estimates of differences between the currents in live and neutral conductors are provided by forming a difference between the magnitudes of current as determined by the second and third current transducers and also from output of the first current transducer thereby allowing the transducers to be selected to enhance fault detection over different current and frequency ranges.

17. The apparatus for ground fault detection and/or power metering of claim 14 further including:
a calibration circuit for introducing a calibration signal which causes a shared perturbation in the currents measured by the first and second current transducers, such that transfer functions can be adjusted to have substantially matching responses to the calibration signal or such that corrective functions can be applied.

18. The apparatus for ground fault detection and/or power metering of claim 17 further including:
a correlation and detection circuit that is operative during calibration to extracts parts of a first signal from one of first and second measurement circuits, the first signal containing a contribution from the calibration signal and a contribution from a current passing along the live conductor; the correlation and detection circuit being further arranged to extract parts of a second signal from a third measurement circuit, the second signal containing a contribution from the calibration signal and from the current passing along the neutral conductor, the extracted parts relating to the calibration signal being used to adjust the transfer functions, and
at least one processing circuit operative to determine a magnitude of a current flowing in the live conductor and a magnitude of a current flowing in the neutral conductor.

19. The apparatus for ground fault detection and/or power metering of claim 14, wherein the circuit is configured to determine information about a current in the live conductor by subtracting a magnitude of the neutral current as measured by the second current transducer from a magnitude of a differential signal as measured by the first current transducer.

20. A current measurement apparatus comprising:
a first current sensor for sensing a current in a first conductor;
a first measurement circuit responsive to an output of the first current sensor and having a first dynamic range; and
a second measurement circuit responsive to the output of the first current sensor and having a second dynamic range different from the first dynamic range;
wherein the first measurement circuit includes a first gain stage and a first analog to digital converter and the second measurement circuit includes a second gain stage and a second analog to digital converter; and
wherein a signal range of the first analog to digital converter is larger than a signal range of the second analog to digital converter.

21. The current measurement apparatus of claim 20, wherein the first measurement circuit and the second measurement circuit are clocked at different frequencies.

22. The current measurement apparatus of claim 20, wherein the first measurement circuit is configured for arc fault detection.

23. The current measurement apparatus of claim 20, wherein the second measurement circuit is configured for ground fault detection or for metering current flow.

* * * * *